United States Patent [19]

Sugawara

[11] Patent Number: 5,682,056
[45] Date of Patent: Oct. 28, 1997

[54] PHASE SHIFTING MASK AND METHOD OF MANUFACTURING SAME

[75] Inventor: Minoru Sugawara, Kanagawa, Japan

[73] Assignee: Sony Corporation, Tokyo, Japan

[21] Appl. No.: 613,766

[22] Filed: Feb. 28, 1996

Related U.S. Application Data

[63] Continuation of Ser. No. 113,250, Aug. 30, 1993, abandoned.

[30] Foreign Application Priority Data

Aug. 28, 1992 [JP] Japan .................. 4-251979

[51] Int. Cl.$^6$ ........................... H01L 31/0232
[52] U.S. Cl. .................. 257/435; 257/798; 430/5; 430/322; 430/323; 430/324
[58] Field of Search ............ 430/5, 313, 316, 430/322–324; 257/435, 798

[56] References Cited

U.S. PATENT DOCUMENTS

| | | | |
|---|---|---|---|
| 5,208,125 | 5/1993 | Lowrey et al. | 430/5 |
| 5,217,830 | 6/1993 | Lowrey | 430/5 |
| 5,275,896 | 1/1994 | Garofalo et al. | 430/5 |
| 5,292,623 | 3/1994 | Kamp et al. | 430/313 |
| 5,308,721 | 5/1994 | Garofalo et al. | 430/5 |

*Primary Examiner*—J. Carroll
*Attorney, Agent, or Firm*—Hill, Steadman & Simpson

[57] ABSTRACT

A phase shifting mask has a light shielding region and a light transmitting region including a light transmitting area and a first phase shifting area which is disposed between the light transmitting area and the light shielding region. The light transmitting region also includes a second phase shifting area disposed between the light shielding region and the first phase shifting area for producing a difference in phase between light that has passed through the second phase shifting area and light that has passed through the first phase shifting area. The phase shifting mask allows an optimum exposure light intensity to be set easily even if the phase shifting area width is large, and also makes it possible to form a desired pattern image on a wafer even if there is a positional misalignment between the light shielding region and the light transmitting area.

15 Claims, 37 Drawing Sheets

REGION WHERE PHASE SHIFTING
AREA IS TO BE FORMED

REGION WHERE PHASE SHIFTING
AREA IS TO BE FORMED

REGION WHERE PHASE SHIFTING AREA IS TO BE FORMED

REGION WHERE PHASE SHIFTING AREA IS TO BE FORMED

ELECTRON BEAM IRRADIATED REGION

ELECTRON BEAM IRRADIATED REGION

PHASE SHIFTING MASK AND METHOD OF MANUFACTURING SAME

This is a continuation, of application Ser. No. 08/113,250 filed Aug. 30, 1993, abandoned.

BACKGROUND OF THE INVENTION

1. Field of the Invention

The present invention relates to a phase shifting mask and a method of manufacturing such a phase shifting mask, and more particularly to an edge-emphasized phase shifting mask and a method of manufacturing such an edge-emphasized phase shifting mask.

2. Description of the Prior Art

In recent years, efforts have been made to miniaturize devices and interconnections in semiconductor integrated circuits and to reduce the distance between such devices and interconnections. It is difficult for conventional photomasks each composed of only a light shielding area and a light transmitting area to make very fine patterns for devices and interconnections in semiconductor integrated circuits. Because of the limitation of the conventional photomasks, attention is being directed to a so-called phase shifting mask which has a light transmitting region composed of a light transmitting area for transmitting light therethrough and a phase shifting area for transmitting light that is out of phase with the light which has been transmitted through the light transmitting area. The phase shifting mask makes it possible to produce very fine device and interconnection patterns which the conventional photomasks have failed to produce.

There has been developed a phase shifting mask of the edge-emphasized type for forming an isolated pattern represented by a contact hole defined in a semiconductor device. As shown in FIG. 39 of the accompanying drawings, an edge-emphasized phase shifting mask comprises a light shielding region 12 and a light transmitting region both on a substrate 10. The light transmitting region comprises a light transmitting area 14 and a phase shifting area 16 disposed between the light shielding region 12 and the light transmitting area 14. Light that has passed through the light transmitting area 14 and light that has passed through the phase shifting area 16 are out of phase with each other, for example, by 180°.

A process of manufacturing a conventional edge-emphasized phase shifting mask will be described below with reference to FIGS. 41A through 41E. First, as shown in FIG. 41A, a light shielding layer 12A of a light shielding material is deposited on a substrate 10, and then a positive electron-beam resist 30 which is sensitive to an electron beam or the like is coated on the light shielding layer 12A. Thereafter, a predetermined light shielding region pattern is drawn on the positive electron-beam resist 30 by an electron beam or the like emitted from an exposure system. Then, the positive electron-beam resist 30 is developed, and the light shielding layer 12A is etched, after which the positive electron-beam resist 30 is removed, thus forming a light shielding region 12 as shown in FIG. 41B.

As shown in FIG. 41C, the surface formed so far is coated with a phase shifting layer 16A of a phase shifting material, and thereafter a positive electron-beam resist 32 which is sensitive to an electron beam or the like is coated on the phase shifting layer 16A. To produce a light transmitting area and a phase shifting area, a predetermined light transmitting region pattern is drawn on the positive electron-beam resist 32 by an electron beam or the like emitted from an exposure system. Then, the positive electron-beam resist 32 is developed as shown in FIG. 41D, and the phase shifting layer 16A is etched as shown in FIG. 41E, after which the positive electron-beam resist 32 is removed. Now, a phase shifting area 16 is left, producing a phase shifting mask which has the structure as shown in FIG. 39. The phase shifting layer 16A remains on the light shielding region 12. Using the phase shifting mask, it is possible to form a sharp image of the light transmitting area 14 on a wafer such as a semiconductor wafer due to interference between light that has passed through the light transmitting area 14 and light that has passed through the phase shifting area 16.

If the width of the phase shifting area 16 between the light transmitting area 14 and the light shielding region 12 were too small, then the amount of light having passed through the phase shifting area 16 would be too small. As a result, the light that has passed through the light transmitting area 14 and the light that has passed through the phase shifting area 16 would not sufficiently interfere with each other, making it impossible to form a sharp image of the light transmitting area 14 on a wafer. Conversely, if the width of the phase shifting area 16 between the light transmitting area 14 and the light shielding region 12 were too large, then the amount of light having passed through the phase shifting area 16 would be excessive. Consequently, while the light that has passed through the light transmitting area 14 and the light that has passed through the phase shifting area 16 interfere with each other, light that has passed through the phase shifting area 16 but does not interfere with the light that has passed through the light transmitting area 14 would form an unwanted image on the wafer.

Therefore, any dimensional inaccuracies of the width of the phase shifting area 16 would make it highly difficult to achieve an optimum exposure light setting and also would reduce an exposure margin. In addition, the accuracy with which the pattern of the light transmitting area 14 is transferred to the wafer would be greatly lowered, and unwanted images of the phase shifting area would tend to be formed on the wafer.

It is necessary to fabricate the edge-emphasized phase shifting mask so that any positional misalignment between the light shielding region 12 and the light transmitting area 14 will be of 0.05 μm or less. If any positional misalignment between the light shielding region 12 and the light transmitting area 14 were too large, the phase shifting area 16 would have portions wider and narrower than a desired width, resulting in the problems described above.

The accuracy with which the light shielding region 12 and the light transmitting area 14 are positioned with respect to each other depends on the accuracy with which the exposure system used to draw the pattern of the light shielding region 12 or the light transmitting area 14 is positioned with respect to the phase shifting mask. Thus, the exposure system is required to be positionally controlled highly strictly in order to achieve the highest positional accuracy with respect to the light shielding region 12 and the light transmitting area 14. However, it is impossible for any presently available exposure systems to set the positional misalignment between the light shielding region 12 and the light transmitting area 14 to 0.05 μm or less. With the conventional exposure systems, the positions of the light shielding region 12 and the light transmitting area 14 are undesirably displaced relatively to each other. Therefore, the conventional phase shifting mask allows unwanted images to be formed on wafers or fails to form sharp images of the light transmitting area 14 on wafers.

When the exposure system is controlled in an effort to position the light shielding region 12 and the light transmitting area 14 as highly accurately as possible with respect to each other, the pattern forming capability of the phase shifting mask is greatly lowered before the positional misalignment between the light shielding region 12 and the light transmitting area 14 is reduced to 0.05 µm or less. Such a control procedure is also costly to carry out. For the above reasons, it is quite difficult to use or fabricate edge-emphasized phase shifting masks.

OBJECTS AND SUMMARY OF THE INVENTION

It is a first object of the present invention to provide a phase shifting mask capable of easily achieving an optimum exposure light setting even when a phase shifting area thereof is relatively wide.

A second object of the present invention is to provide a phase shifting mask capable of forming only a desired image on a wafer even when there is a positional misalignment between a light shielding region and a light transmitting area thereof.

A third object of the present invention is to provide a method of manufacturing a phase shifting mask capable of easily achieving an optimum exposure light setting even when a phase shifting area thereof is relatively wide.

A fourth object of the present invention is to provide a method of manufacturing a phase shifting mask which has a pattern transfer accuracy that is not impaired and which prevents unwanted images from being formed on wafers even when there is a positional misalignment between a light shielding region and a light transmitting area thereof.

Formation of integrated circuit patterns or the like on a resist on a wafer with exposure light employs a reticle which may be used to project a pattern image on a reduced scale or corresponds to an original, or a mask which may be used to project a pattern image of equal size or is replicated from a reticle as an original. Such reticles and masks will hereinafter be referred to as masks.

According to the present invention, there is provided a phase shifting mask comprising a light shielding region and a light transmitting region including a light transmitting area, a first phase shifting area, and a second phase shifting area, the first and second phase shifting areas being disposed between the light shielding region and the light transmitting area, the arrangement being such that light that has passed through the first phase shifting area and light that has passed through the light transmitting area are out of phase with each other, the second phase shifting area being disposed between the light shielding region and the first phase shifting area, the arrangement being such that light that has passed through the first phase shifting area and light that has passed through the second phase shifting area are out of phase with each other.

According to another aspect of the present invention, there is provided a phase shifting mask comprising a light shielding region and a light transmitting region including a light transmitting area and a phase shifting area, the phase shifting area being disposed between the light shielding region and the light transmitting area, the arrangement being such that light that has passed through the phase shifting area and light that has passed through the light transmitting area are out of phase with each other, the phase shifting area including at least a portion which has a phase shifting area shape produced when substantially no positional misalignment is present between the light shielding region and the light transmitting area upon formation thereof.

According to still another aspect of the present invention, there is provided a method of manufacturing a phase shifting mask comprising a light shielding region and a light transmitting region including a light transmitting area, a first phase shifting area, and a second phase shifting area, the first and second phase shifting areas being disposed between the light shielding region and the light transmitting area, the arrangement being such that light that has passed through the first phase shifting area and light that has passed through the light transmitting area are out of phase with each other, the second phase shifting area being disposed between the light shielding region and the first phase shifting area, the arrangement being such that light that has passed through the first phase shifting area and light that has passed through the second phase shifting area are out of phase with each other, the method comprising the step of forming the light transmitting area, the first phase shifting area, and the second phase shifting area in one process.

According to yet another aspect of the present invention, there is provided a method of manufacturing a phase shifting mask comprising a light shielding region and a light transmitting region including a light transmitting area and a phase shifting area, the phase shifting area being disposed between the light shielding region and the light transmitting area, the arrangement being such that light that has passed through the phase shifting area and light that has passed through the light transmitting area are out of phase with each other, the phase shifting area including at least a portion which has a phase shifting area shape produced when substantially no positional misalignment is present between the light shielding region and the light transmitting area upon formation thereof, the method comprising the steps of forming a light shielding layer to provide the light shielding region on a transparent substrate, removing a portion of the light shielding layer to provide the light transmitting region, and forming the phase shifting area between the light transmitting area and the light shielding region.

According to yet still another aspect of the present invention, there is provided a method of manufacturing a phase shifting mask comprising a light shielding region and a light transmitting region including a light transmitting area, a first phase shifting area, and a second phase shifting area, the first and second phase shifting areas being disposed between the light shielding region and the light transmitting area, the arrangement being such that light that has passed through the first phase shifting area and light that has passed through the light transmitting area are out of phase with each other, the second phase shifting area being disposed between the light shielding region and the first phase shifting area, the arrangement being such that light that has passed through the first phase shifting area and light that has passed through the second phase shifting area are out of phase with each other, the method comprising the steps of forming the first phase shifting area between the light transmitting area and the light shielding region, and thereafter, forming the second phase shifting area.

The light transmitting area may be transparent with respect to exposure light or may transmit exposure light required to expose a resist on a wafer, for example to such exposure light.

The phase shifting areas serve to shift the phase of exposure light passing therethrough. The phase relationship between light that has passed through the light transmitting area and light that has passed through the phase shifting area, or the phase relationship between light that has passed through the light transmitting area and light that has passed through the first phase shifting area, or the phase relationship between light that has passed through the light transmitting area and light that has passed through the second phase shifting area, or the phase relationship between light that has passed through the first phase shifting area and light that has passed through the second phase shifting area may be selected as desired, but should be selected to achieve desired advantages. Preferably, light that has passed through the light transmitting area and light that has passed through the phase shifting area, or light that has passed through the light transmitting area and light that has passed through the first phase shifting area, or light that has passed through the first phase shifting area and light that has passed through the second phase shifting area should be 180° out of phase with each other, and light that has passed through the light transmitting area and light that has passed through the second phase shifting area should be out of phase with each other. However, they may be out of phase with each other by 90°, 270°, or the like, or a combination of these phase angles.

With the arrangement of the present invention, the second phase shifting area for producing a phase difference between light that has passed through the second phase shifting area and light that has passed through the first phase shifting area is disposed between the light shielding region and the first phase shifting area. The light that has passed through the light transmitting area and the light that has passed through the first phase shifting area interfere with each other to allow an image of the light transmitting area to be sharply formed on a wafer. The light that has passed through the first phase shifting area and the light that has passed through the second phase shifting area interfere with each other interfere with each other to prevent an image of the first phase shifting area or an image of the second phase shifting area from being formed on the wafer.

Furthermore, the first and second phase shifting areas are formed in one process. Therefore, the phase shifting areas of as constant a width as possible can easily be formed in a single operation, allowing an optimum exposure light intensity to be set with ease. Even if there is a positional misalignment produced between the light shielding region and the light transmitting area, since the second phase shifting area is formed, it prevents an unwanted image from being formed on a wafer by light that has passed through the phase shifting area, and allows only a desired image to be formed on the wafer.

Alternatively, the phase shifting area which has a phase shifting area shape that is produced when no positional misalignment occurs between the light shielding region and the light transmitting area is formed in at least a portion between the light transmitting area and the light shielding region. Therefore, when a positional misalignment is caused between the light shielding region and the light transmitting area, the second phase shifting area is automatically formed between the phase shifting area and the light shielding region. As a consequence, an unwanted image is prevented from being formed on a wafer by light that has passed through the phase shifting area, and allows only a desired image to be formed on the wafer.

Alternatively, the second phase shifting area is formed between the first phase shifting area and the light shielding region after the first phase shifting area is formed between the light transmitting area and the light shielding region. Thus, the width of the phase shifting areas may be as constant as possible, allowing an optimum exposure light intensity to be set with ease. Even if there is a positional misalignment produced between the light shielding region and the light transmitting area, since the second phase shifting area is formed, it prevents an unwanted image from being formed on a wafer by light that has passed through the phase shifting area, and allows only a desired image to be formed on the wafer.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
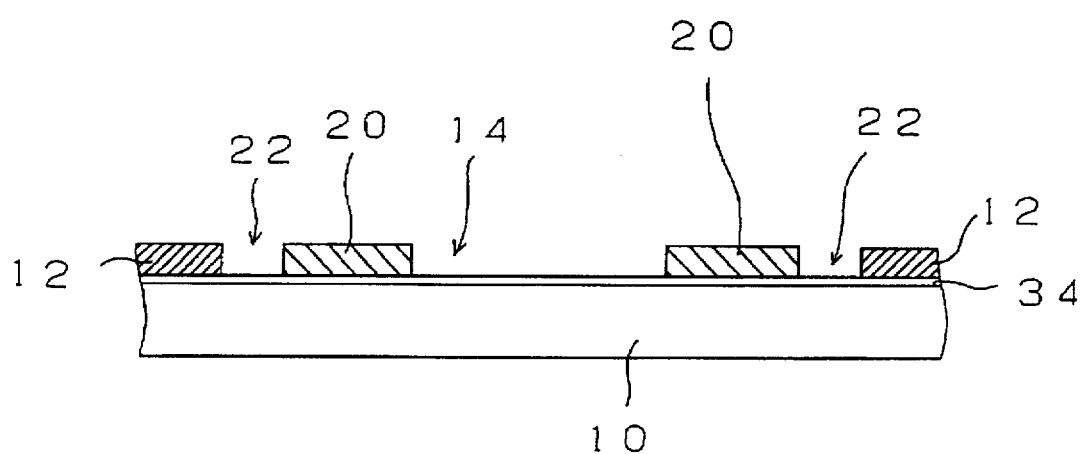
FIG. 1 is a fragmentary schematic cross-sectional view of a phase shifting mask according to Inventive Example 1.

A phase shifting mask and a method of manufacturing such a phase shifting mask according to a first embodiment of the present invention will be described below with respect to Inventive Examples 1 through 12. A phase shifting mask and a method of manufacturing such a phase shifting mask according to a second embodiment of the present invention will be described below with respect to Inventive Examples 13 through 24. A method of manufacturing a phase shifting mask according to a third embodiment of the present invention will be described below with respect to Inventive Examples 25 through 30. Like or corresponding parts are denoted by like or corresponding reference characters throughout views.

In Inventive Examples 1 through 6, phase shifting areas are made of SOG (Spin On Glass), for example. In Inventive Examples 7 through 10, phase shifting areas are formed by varying the depth of a substrate. In Inventive Examples 11 and 12, phase shifting areas are formed by varying the refractive index of a substrate.

(Inventive Example 1)

As shown in FIG. 1, a phase shifting mask according to Inventive Example 1 comprises a substrate 10, a light shielding region 12, a light transmitting area 14, a first phase shifting area 20 disposed between the light shielding region 12 and the light transmitting area 14, and a second phase shifting area 22 disposed between the light shielding region 12 and the first phase shifting area 20.

The phase shifting mask according to Inventive Example 1 resides in that the second phase shifting area 22 is disposed between the light shielding region 12 and the first phase shifting area 20. In Inventive Example 1, light that has passed through the light transmitting area 14 and light that has passed through the second phase shifting area 22 are in phase with each other. The first phase shifting area 20 is made of SOG, for example. If the first phase shifting area 22 has a thickness $d=\lambda/(2(n-1))$ where $\lambda$ is the wavelength of exposure light and n is the refractive index of SOG, then exposure light that has passed through the light transmitting area 14 and the second phase shifting area 22 is 180° out of phase with exposure light that has passed through the first phase shifting area 22.

A method of manufacturing the phase shifting mask according to Inventive Example 1 will be described below with reference to FIGS. 2A through 2D.

[Step 100]

Figure 2A:
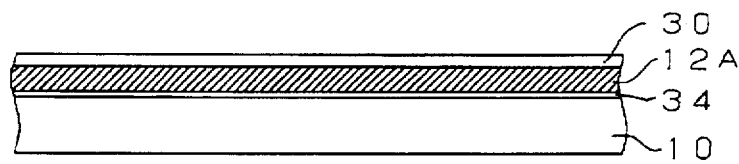
FIGS. 2 through 2D are fragmentary schematic cross-sectional views showing a method of manufacturing the phase shifting mask according to Inventive Example 1.

As shown in FIG. 2A, a tin oxide layer 34, for example, which serves as a transparent conductive layer and an etching stop layer, is deposited on a substrate 10 of quartz, and then a light shielding layer 12A which may be made of chromium, for example, is deposited on the etching stop layer by sputtering, for example. Thereafter, the light shielding layer 12A is coated with a positive electron-beam resist 30, thus providing a structure shown in FIG. 2A. Then, a pattern is drawn by an electron beam emitted from an exposure system, the electron-beam resist 30 is developed, the light shielding layer 12A is etched, and the electron-beam resist 30 is removed, thereby providing a structure shown in FIG. 2B. In this manner, a light shielding region 12 is formed on the substrate 10.

[Step 110]

Then, a phase shifting layer 16A which may be made of SOG, for example, is deposited on the entire surface formed so far. The phase shifting layer 16A has a thickness $d=\lambda/(2(n-1))$ so as to achieve the phase difference of 180° described above. Thereafter, a positive electron-beam resist 32 is coated on the phase shifting layer 16A, thereby providing a structure shown in FIG. 2C.

[Step 120]

Then, a pattern is drawn by an electron beam emitted from an exposure system in order to form first and second phase shifting areas. Regions where the electron beam is applied are shown in FIG. 2C. Any desired patterns may be drawn by the electron beam on the positive electron-beam resist 32 over the light shielding region 12 away from the edges of the light shielding region 12.

[Step 130]

Figure 2B:
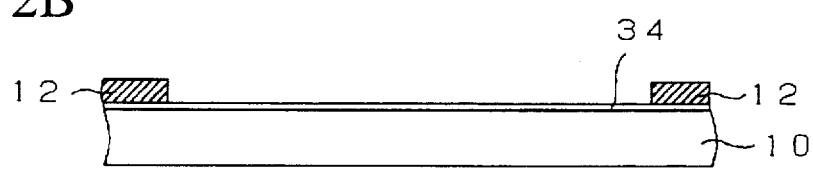
Figure 2C:
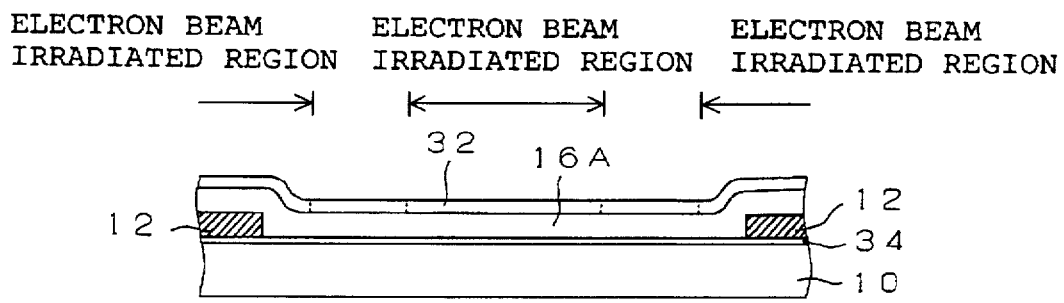
Figure 2D:
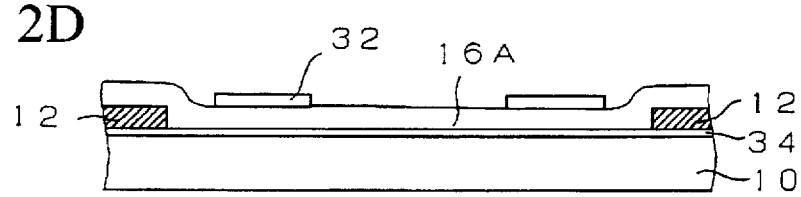

Thereafter, the positive electron-beam resist 32 is developed as shown in FIG. 2D. The phase shifting layer 16A is etched, and the positive electron-beam resist 32 is removed, thus providing a phase shifting mask which is of the structure shown in FIG. 1. According to the above method, the light transmitting area 14, the first phase shifting area 20, and the second phase shifting area 22 are formed in the same step, i.e., the step of etching the phase shifting layer 16A.

(Inventive Example 2)

Figure 3A:
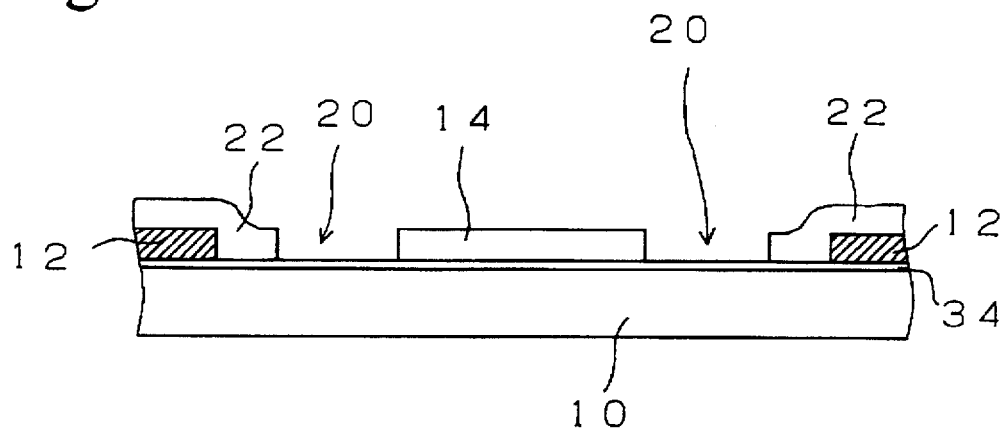
FIGS. 3A and 3B are fragmentary schematic cross-sectional views showing a phase shifting mask according to Inventive Example 2 and regions where an electron beam is applied.
Figure 3B:
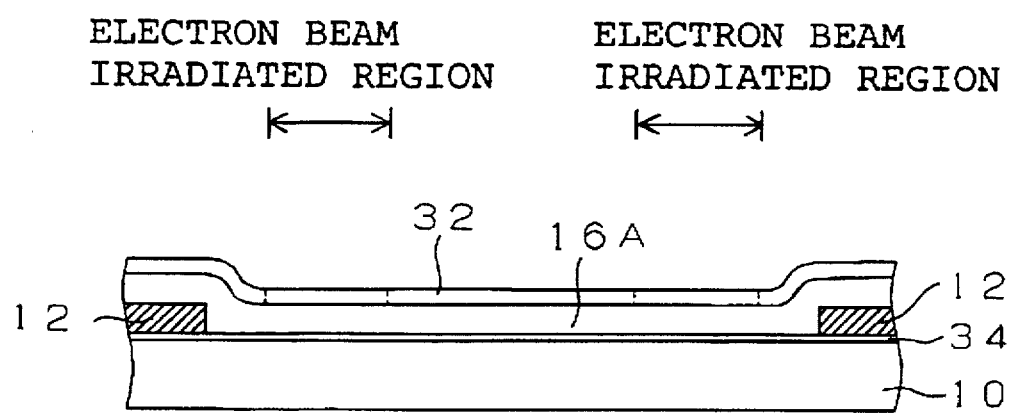

A phase shifting mask according to Inventive Example 2 is a modification of the phase shifting mask according to Inventive Example 1. The phase shifting mask according to Inventive Example 2 is schematically shown in FIGS. 3A and 3B. According to Inventive Example 2, light that has passed through the light transmitting area 14 and light that has passed through the second phase shifting area 22 are in phase with each other. The phase shifting mask according to Inventive Example 2 differs from the phase shifting mask according to Inventive Example 1 in that the light transmitting area 14 and the second phase shifting area 22 are composed of a phase shifting layer. If the phase shifting layer of the light transmitting area 14 and the second phase shifting area 22 is made of SOG, for example, and each has a thickness $d=\lambda/(2(n-1))$, then the light that has passed through the light transmitting area 14 and the second phase shifting area 22 is 180° out of phase with light that has passed through the first phase shifting area 20.

The phase shifting masks according to Inventive Examples 1 and 2 function in the same manner as each other.

The phase shifting mask according to Inventive Example 2 can be manufactured basically in the same way as the phase shifting mask according to Inventive Example 1 except that regions where patterns are drawn by an electron beam from an exposure system in order to form the light transmitting area, the first phase shifting area, and the second phase shifting area are different from those in the phase shifting mask according to Inventive Example 1 in [Step 120]. The regions where the electron beam is applied in the phase shifting mask according to Inventive Example 2 are shown in FIG. 3B.

In order to manufacture a phase shifting mask of the structure shown in FIG. 1 using a negative electron-beam resist instead of the positive electron-beam resist 32, the electron beam may be applied to the regions shown in FIG. 3B. In order to manufacture a phase shifting mask of the structure shown in FIG. 3A using a negative electron-beam resist instead of the positive electron-beam resist 32, the electron beam may be applied to the regions shown in FIG. 2C.

(Comparative Example 1)

Figure 39:
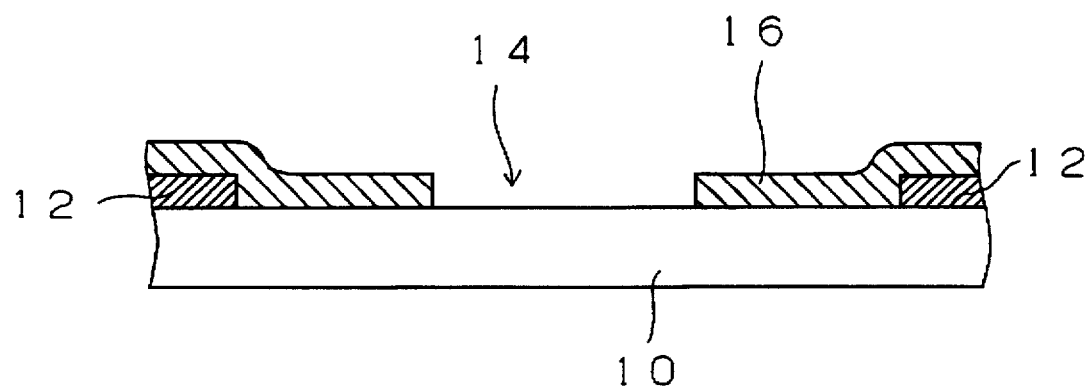
FIG. 39 is a fragmentary schematic cross-sectional view of a phase shifting mask according to Comparative Example 1.

A conventional phase shifting mask according to Comparative Example 1 as shown in FIG. 39 was manufactured by the conventional process described above. The phase shifting mask according to Comparative Example 1 differs from the phase shifting mask according to Inventive Example 1 in that it has no second phase shifting area.

Intensity distributions of light that has passed through the phase shifting masks according to Comparative Example 1 and Inventive Example 1 were measured. In order to form a contact hole having a diameter of 0.4 µm on a wafer, the widths (unit: µm) of various portions of the phase shifting masks are selected as follows:

$L_1$: the width of the light transmitting area;

$L_2$: the width of the first phase shifting area in Inventive Example 1 or the width of the phase shifting area in Comparative Example 1; and $L_3$: the width of the second phase shifting area in Inventive Example 1.

|  | $L_1$ | $L_2$ | $L_3$ |
| --- | --- | --- | --- |
| Inventive Example 1 | 2.60 | 1.25 | 0.75 |
| Comparative Example 1 | 2.60 | 1.25 | — |

Figure 4A:
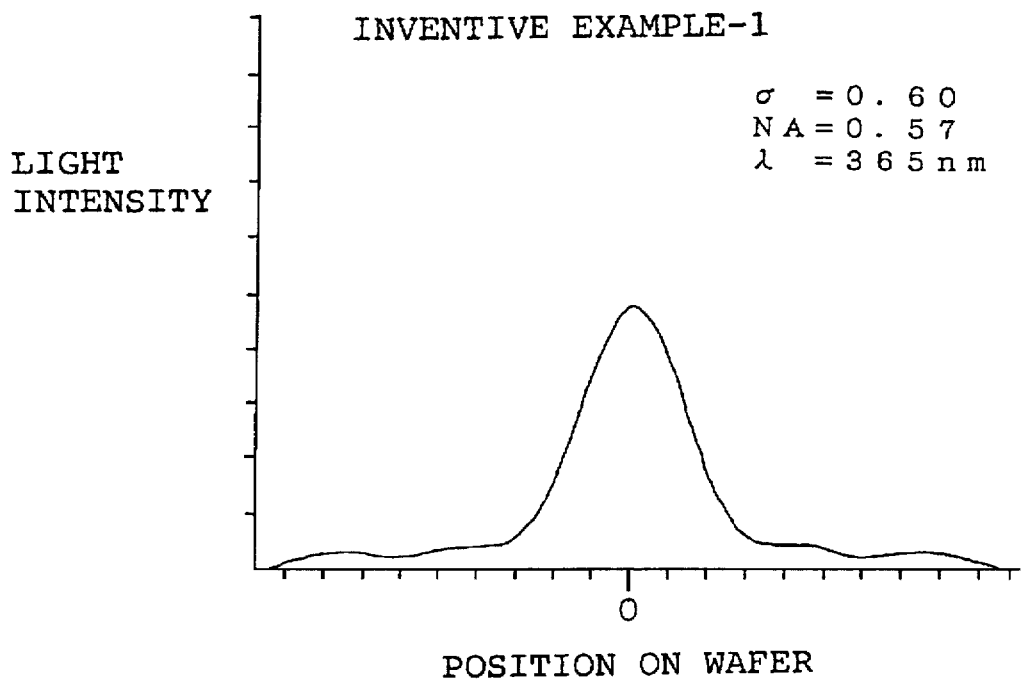
FIG. 4 is a set of diagrams illustrative of measured light intensity distributions of Inventive Example 1 and Comparative Example 1.
Figure 4B:
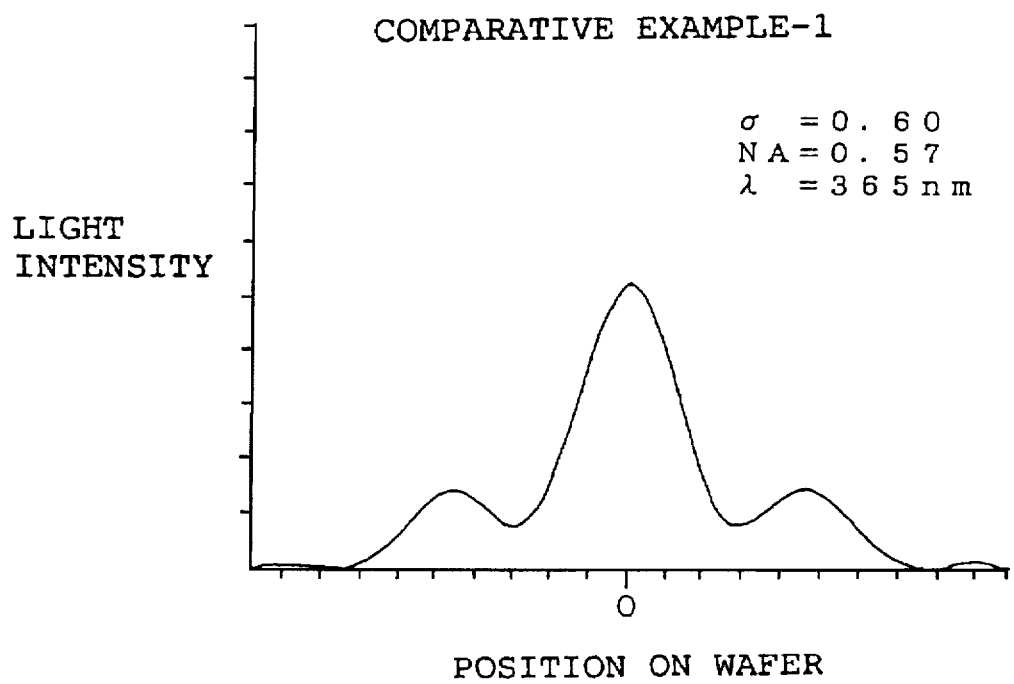

FIG. 4 shows measured light intensity distributions when exposure light with coherency (σ)=0.6, NA (numerical aperture)=0.57, and the wavelength of 365 nm passed through the phase shifting masks. A 5×stepper (reduction exposure projection system) was used to apply exposure light.

Intensity distributions of light that has passed through the phase shifting masks according to Inventive Example 1 and Comparative Example 1. In order to form a contact hole having a diameter of 0.3 µm on a wafer, the widths (unit: µm) of various portions of the phase shifting masks are selected as follows:

|  | $L_1$ | $L_2$ | $L_3$ |
| --- | --- | --- | --- |
| Inventive Example 1 | 2.10 | 1.00 | 0.50 |
| Comparative Example 1 | 2.10 | 1.00 | — |

Figure 5A:
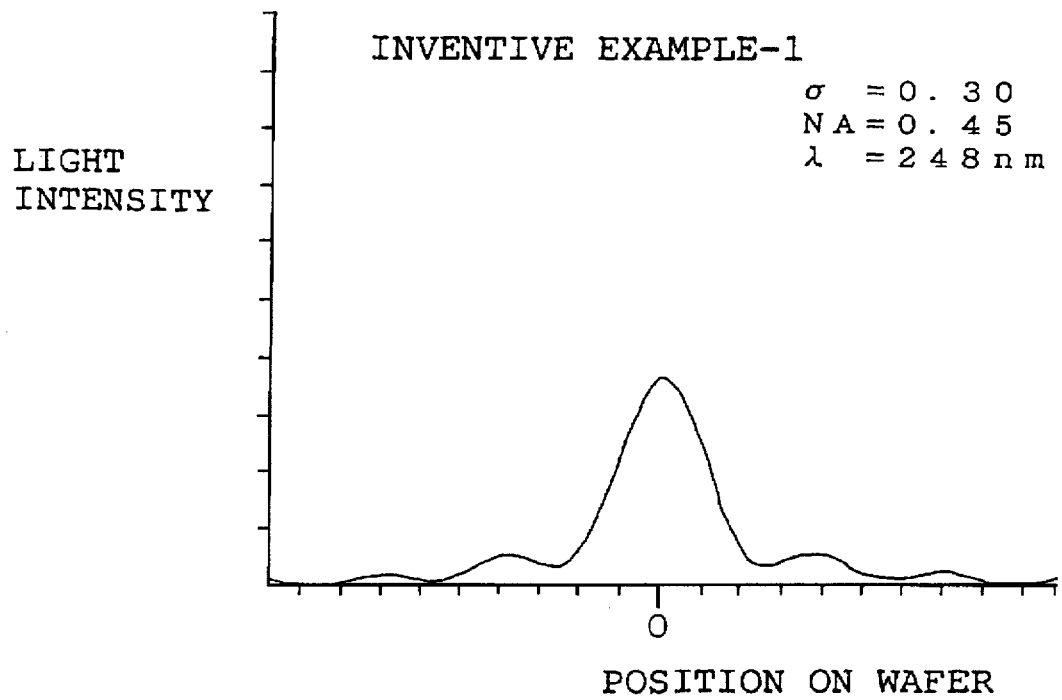
FIG. 5 is a set of diagrams illustrative of measured light intensity distributions of Inventive Example 1 and Comparative Example 1.
Figure 5B:
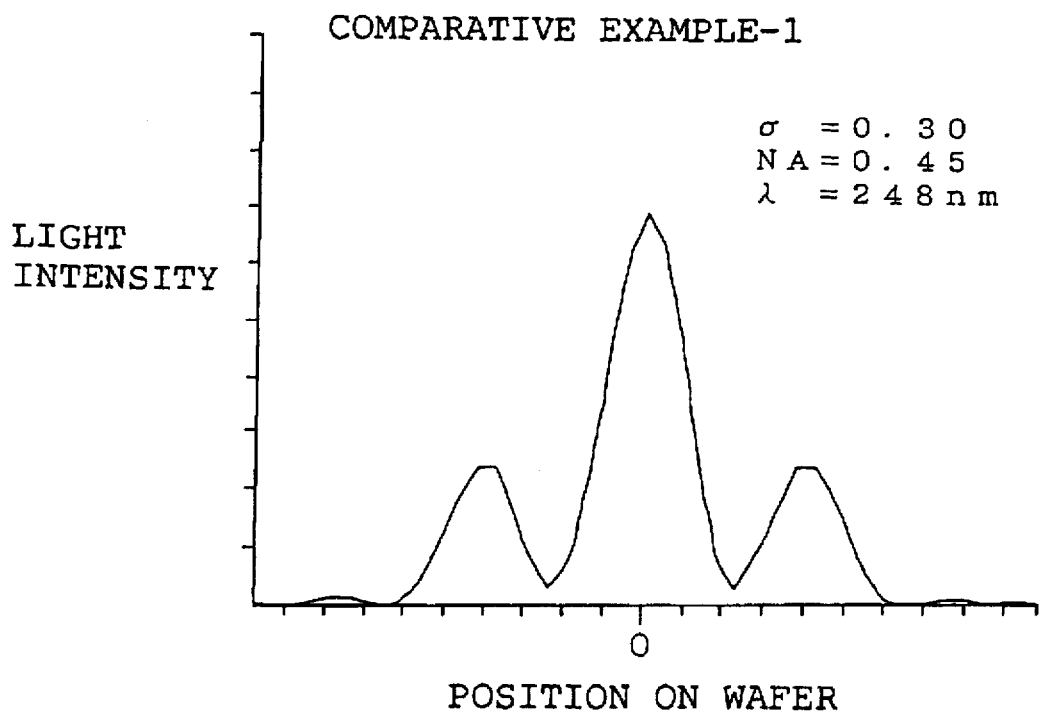

FIG. 5 shows measured light intensity distributions when exposure light with coherency (σ)=0.3, NA=0.45, and the wavelength of 248 nm passed through the phase shifting masks. A 5×stepper (reduction exposure projection system) was used to apply exposure light.

As is apparent from FIGS. 4 and 5, the intensity of light that has passed through the phase shifting mask according to Inventive Example 1 has only one peak that contributes to the transfer of a pattern. However, the intensity of light that has passed through the phase shifting mask according to Comparative Example 1 has one peak that contributes to the transfer of a pattern and additionally two peaks that do not contribute to the transfer of a pattern. The phase shifting mask according to Inventive Example 1 had a very high capability to transfer a pattern onto a resist on a wafer. However, the phase shifting mask according to Comparative Example 1 allowed unwanted portions of a resist on a wafer to be exposed to light, making it impossible to form a proper pattern on the resist on the wafer.

(Inventive Example 3)

Figure 6A:
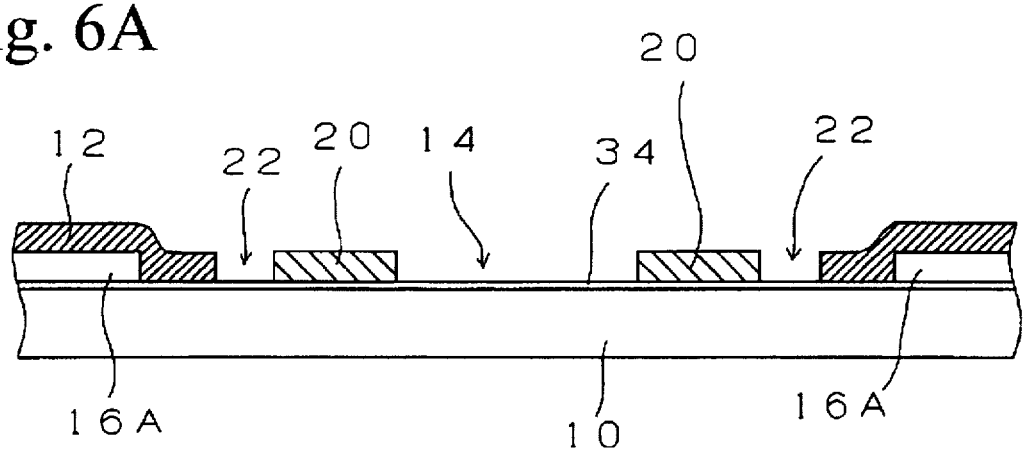
FIG. 6A is a fragmentary schematic cross-sectional view of a phase shifting mask according to inventive Example 3.

A phase shifting mask according to Inventive Example 3 is a modification of the phase shifting mask according to Inventive Example 1. The phase shifting mask according to Inventive Example 3 is different from the phase shifting mask according to Inventive Example 1 in that the phase shifting layer 16A is sandwiched between the substrate 10 and the light shielding region 12. The phase shifting mask according to Inventive Example 3 is schematically shown in FIG. 6A.

The phase shifting mask according to Inventive Example 3 can be manufactured according to a modification of the method of the first embodiment of the present invention. The modified manufacturing method will be described below with reference to FIGS. 7A through 7D.

[Step 200]

As shown in FIG. 8A, a tin oxide layer 34, for example, which serves as a transparent conductive layer and an etching stop layer, is deposited on a substrate 10 of quartz, and then a phase shifting layer 16A which may be made of SOG, for example, is deposited on the tin oxide layer 34. The phase shifting layer 16A has a thickness $d=\lambda/(2(n-1))$ so as to achieve the phase difference of 180° described above. Thereafter, a positive electron-beam resist 32 is coated on the phase shifting layer 16A, thereby providing a structure shown in FIG. 7A.

[Step 210]

Figure 7A:
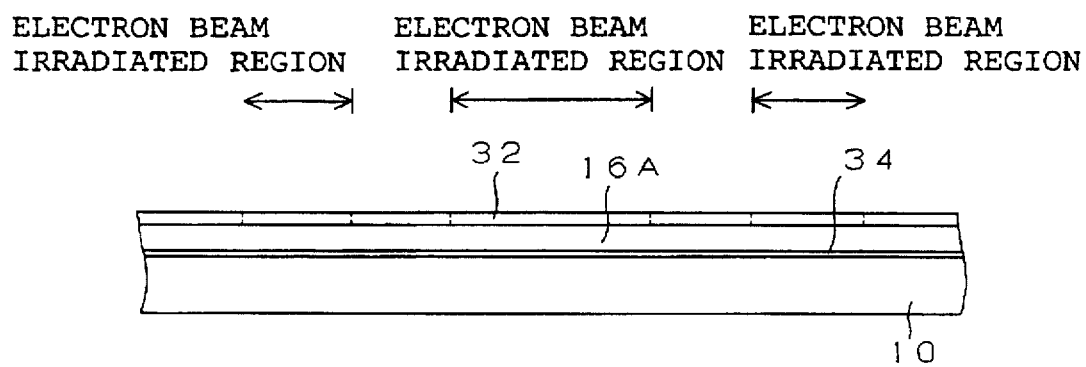
FIGS. 7A through 7D are fragmentary schematic cross-sectional views showing a method of manufacturing the phase shifting mask according to Inventive Example 3.

Then, a pattern is drawn by an electron beam emitted from an exposure system in order to form first and second phase shifting areas. Regions where the electron beam is applied are shown in FIG. 7A. Any desired patterns may be drawn by the electron beam on the positive electron-beam resist 32 over the light shielding region 12 spaced outwardly away from the edges of the light shielding region 12.

[Step 220]

Figure 7B:
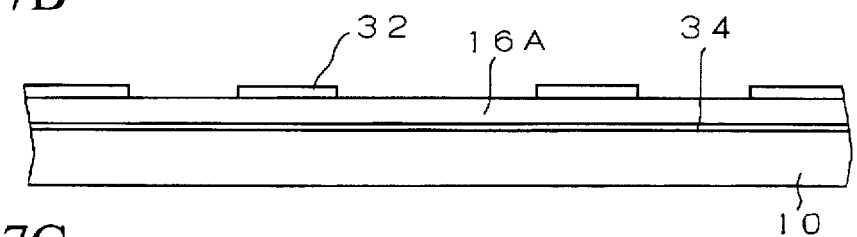
Figure 7C:
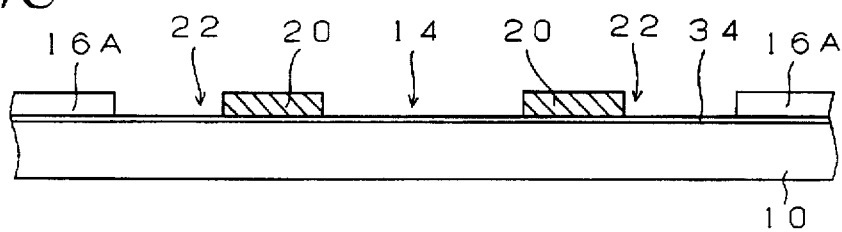

Thereafter, the positive electron-beam resist 32 is developed as shown in FIG. 7B. The phase shifting layer 16A is etched, and the positive electron-beam resist 32 is removed, thus providing a phase shifting mask which is of the structure shown in FIG. 8C. According to the above method, the light transmitting area 14, the first phase shifting area 20, and the second phase shifting area 22 are formed in the same step, i.e., the step of etching the phase shifting layer 16A.

[Step 230]

Figure 7D:
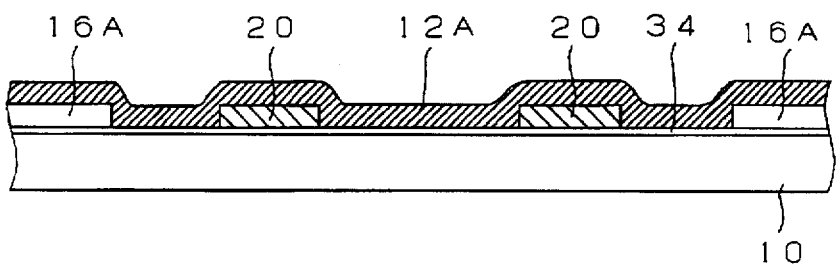

Then, a light shielding layer 12A which may be made of chromium, for example, is deposited on the etching stop layer by sputtering, for example, as shown in FIG. 7D. Thereafter, the light shielding layer 12A is coated with a positive electron-beam resist, a pattern is drawn by an electron beam emitted from an exposure system, the electron-beam resist is developed, the light shielding layer is etched, and the electron-beam resist is removed, thereby providing a structure shown in FIG. 6A.

(Inventive Example 4)

Figure 6B:
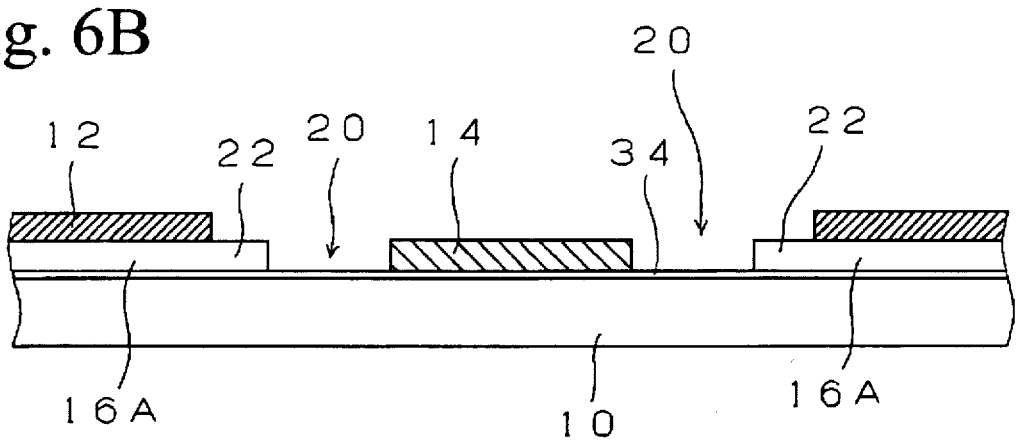
FIG. 6B is a fragmentary schematic cross-sectional view of a phase shifting mask according to inventive Examples 4 and 6.

A phase shifting mask according to Inventive Example 4 is a modification of the phase shifting mask according to Inventive Example 2. The phase shifting mask according to Inventive Example 4 is different from the phase shifting mask according to Inventive Example 2 in that the phase shifting layer 16A is sandwiched between the substrate 10 and the light shielding region 12. The phase shifting mask according to Inventive Example 4 is schematically shown in FIG. 6B. The phase shifting masks according to Inventive Examples 1, 2, 3, and 4 function in the same manner as each other.

The phase shifting mask according to Inventive Example 4 can be manufactured basically in the same way as the phase shifting mask according to Inventive Example 3 except that regions where patterns are drawn by an electron beam from an exposure system in order to form the light transmitting area, the first phase shifting area, and the second phase shifting area are different from those in the phase shifting mask according to Inventive Example 3. The regions where the electron beam is applied in the phase shifting mask according to Inventive Example 4 are shown in FIG. 6C.

Figure 6C:
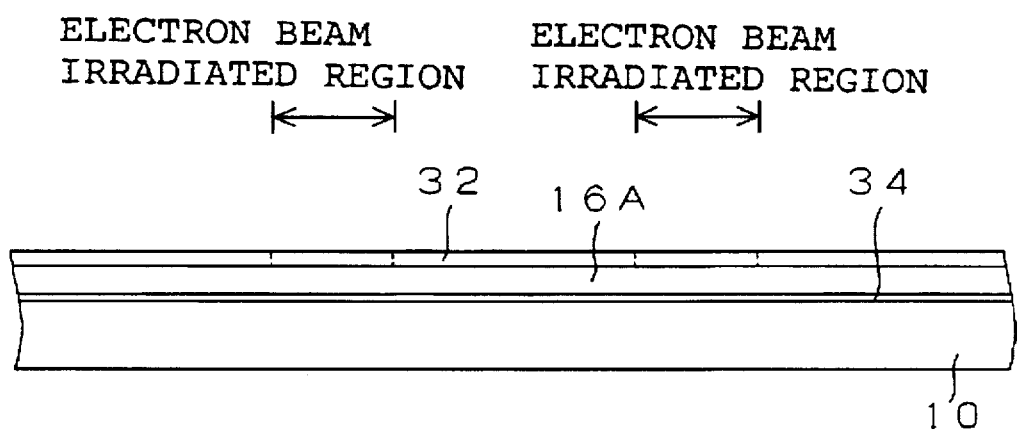
FIG. 6C is a fragmentary schematic cross-sectional view showing regions where an electron beam is applied to manufacture a phase shifting mask according to inventive Example 4.

In order to manufacture a phase shifting mask of the structure shown in FIG. 6A using a negative electron-beam resist instead of the positive electron-beam resist 32, the electron beam may be applied to the regions shown in FIG. 6C. In order to manufacture a phase shifting mask of the structure shown in FIG. 6B using a negative electron-beam resist instead of the positive electron-beam resist 32, the electron beam may be applied to the regions shown in FIG. 7A.

(Inventive Example 5)

Figure 8:
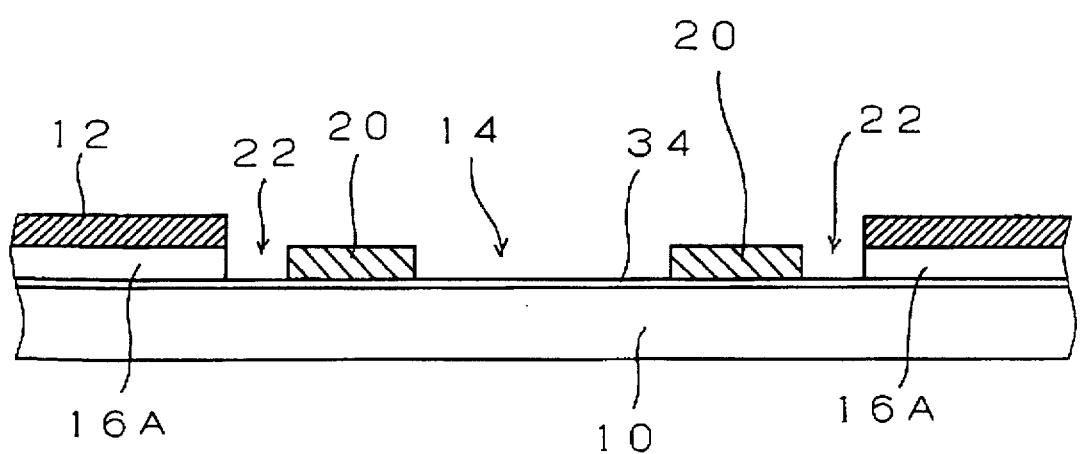
FIG. 8 is a fragmentary schematic cross-sectional view of a phase shifting mask according to Inventive Example 5.

A phase shifting mask according to Inventive Example 5 is a modification of the phase shifting mask according to Inventive Example 3. The phase shifting mask according to Inventive Example 5 is different from the phase shifting mask according to Inventive Example 3 as to its manufacturing method. The phase shifting mask according to Inventive Example 5 is schematically shown in FIG. 8.

The phase shifting mask according to Inventive Example 5 can be manufactured according to a modification of the method of the first embodiment of the present invention. The modified manufacturing method will be described below with reference to FIGS. 9A through 9D.

[Step 300]

Figure 9A:
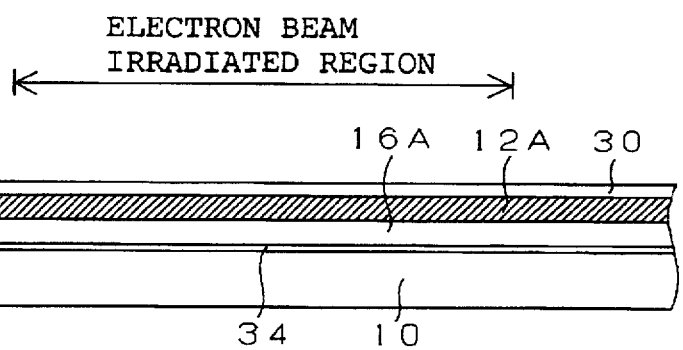
FIGS. 9A through 9D are fragmentary schematic cross-sectional views showing a method of manufacturing the phase shifting mask according to Inventive Example 5.

As shown in FIG. 9A, a tin oxide layer 34, for example, which serves as a transparent conductive layer and an etching stop layer, is deposited on a substrate 10 of quartz, and then a phase shifting layer 16A which may be made of SOG, for example, is deposited on the tin oxide layer 34. The phase shifting layer 16A has a thickness $d=\lambda/(2(n-1))$ so as to achieve the phase difference of 180° described above. Thereafter, a light shielding layer 12A which may be made of chromium, for example, is deposited on the phase shifting layer 16A by sputtering, for example. Then, a positive electron-beam resist 30 is coated on the light shielding layer 12A, thereby providing a structure shown in FIG. 9A.

[Step 310]

Then, a pattern is drawn by an electron beam emitted from an exposure system in order to form a light shielding region 12. Regions where the electron beam is applied are shown in FIG. 9A.

[Step 320]

Figure 9B:
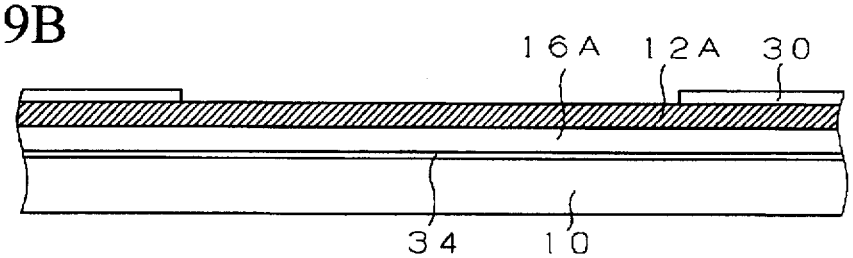
Figure 9C:
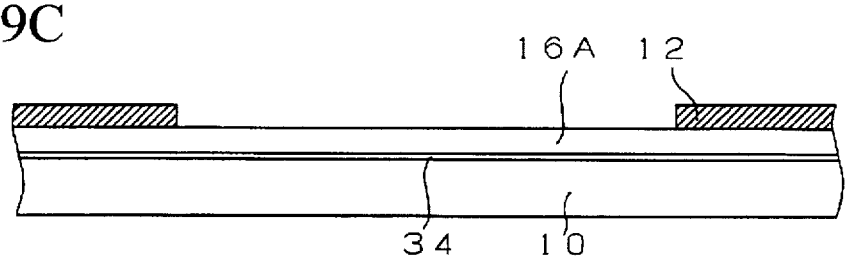

Thereafter, the positive electron-beam resist 30 is developed as shown in FIG. 9B. The light shielding layer 12A is etched, and the positive electron-beam resist 30 is removed, thus providing a phase shifting mask which is of the structure shown in FIG. 9C.

[Step 330]

Figure 9D:
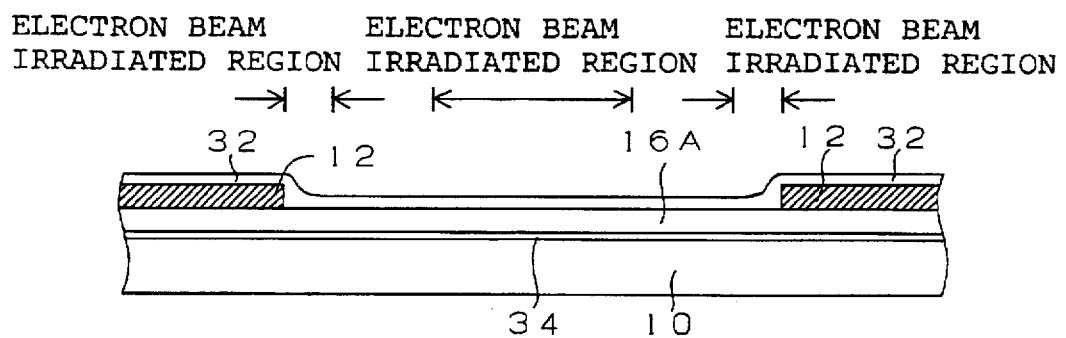

Then, a positive electron-beam resist 32 is coated on the entire surface formed so far. Thereafter, a pattern is drawn by an electron beam emitted from an exposure system, the electron-beam resist is developed, the light shielding layer is etched, and the electron-beam resist is removed, thereby providing a structure shown in FIG. 8. The regions of the positive electron-beam resist 32 where the electron beam is applied are shown in FIG. 9D.

(Inventive Example 6)

A phase shifting mask according to Inventive Example 6 is a modification of the phase shifting mask according to Inventive Example 4. The phase shifting mask according to Inventive Example 6 is different from the phase shifting mask according to Inventive Example 4 as to its manufacturing method. The phase shifting mask according to Inventive Example 6 is also schematically shown in FIG. 6B.

The phase shifting mask according to Inventive Example 6 can be manufactured basically in the same way as the phase shifting mask according to Inventive Example 5 except that regions where patterns are drawn by an electron beam from an exposure system in order to form the light transmitting area, the first phase shifting area, and the second phase shifting area are different from those in the phase shifting mask according to Inventive Example 5 in [Step 310]. The regions where the electron beam is applied in the phase shifting mask according to Inventive Example 6 are shown in FIG. 10.

Figure 10:
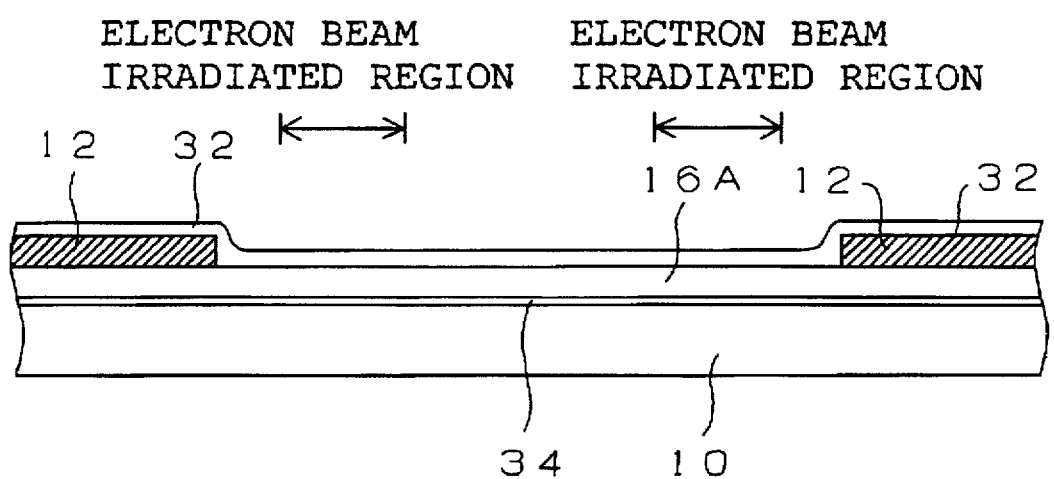
FIG. 10 is a fragmentary schematic cross-sectional view showing regions where an electron beam is applied to manufacture a phase shifting mask according to Inventive Example 6.

In order to manufacture a phase shifting mask of the structure shown in FIG. 8 using a negative electron-beam resist instead of the positive electron-beam resist 32, the electron beam may be applied to the regions shown in FIG. 10. In order to manufacture a phase shifting mask of the structure shown in FIG. 6B using a negative electron-beam resist instead of the positive electron-beam resist 32, the electron beam may be applied to the regions shown in FIG. 9D.

(Inventive Example 7)

Figure 11A:
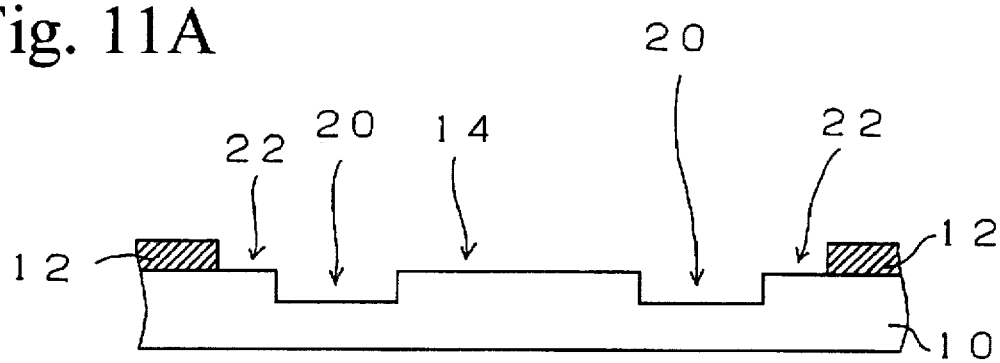
FIGS. 11A and 11B are fragmentary schematic cross-sectional views showing a phase shifting mask according to Inventive Example 7 and regions where an ion beam is applied.

A phase shifting mask according to Inventive Example 7 is a modification of the phase shifting mask according to Inventive Example 1. The phase shifting mask according to Inventive Example 7 is different from the phase shifting mask according to Inventive Example 1 in that the first phase shifting area 20 is formed as grooves in the substrate 10. If the depth from the surface of the substrate 10 to the bottom of the first phase shifting area 20 is $d'=\lambda/(2(n'-1))$ where $\lambda$ is the wavelength of exposure light and n' is the refractive index of the substrate, then light that has passed through the light transmitting area 14 and light that has passed through the second phase shifting area 22 are in phase with each other, and light that has passed through the light transmitting area 14 and light that has passed through the first phase shifting area 20 are 180° out of phase with each other. The phase shifting mask according to Inventive Example 7 is schematically shown in FIG. 11A.

The phase shifting mask according to Inventive Example 7 can be manufactured according to a modification of the method of the first embodiment of the present invention. The modified manufacturing method will be described below.
[Step 400]

A light shielding region 12 of chromium is deposited on a substrate 10 of quartz. This step is identical to [Step 100] of Inventive Example 1, and will not be described in detail below.

[Step 410]

Figure 11B:
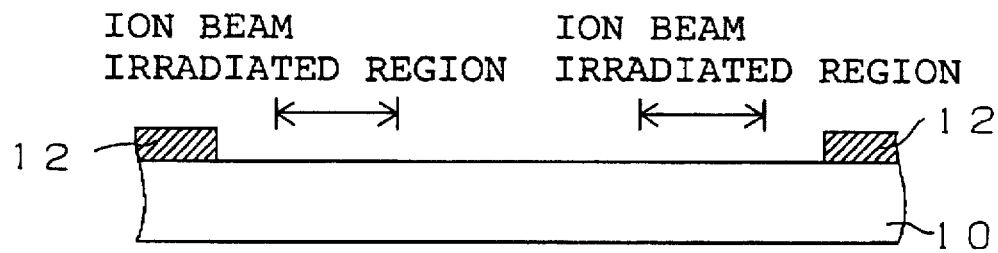

Then, using a focused ion beam system, an ion beam of gallium, for example, is applied to regions of the substrate 10 where a phase shifting area is to be formed as shown in FIG. 11B, thus forming a first phase shifting area 20 in the form of grooves. No first phase shifting areas exist between the first phase shifting area 20 and the light shielding region 12. The portions of the substrate which lie between the first phase shifting area 20 and the light shielding region 12 serve as a second phase shifting area 22. According to this method, the light transmitting area 14, the first phase shifting area 20, and the second phase shifting area 22 are formed in the same step, i.e., the step of applying the ion beam.

(Inventive Example 8)

Figure 12A:
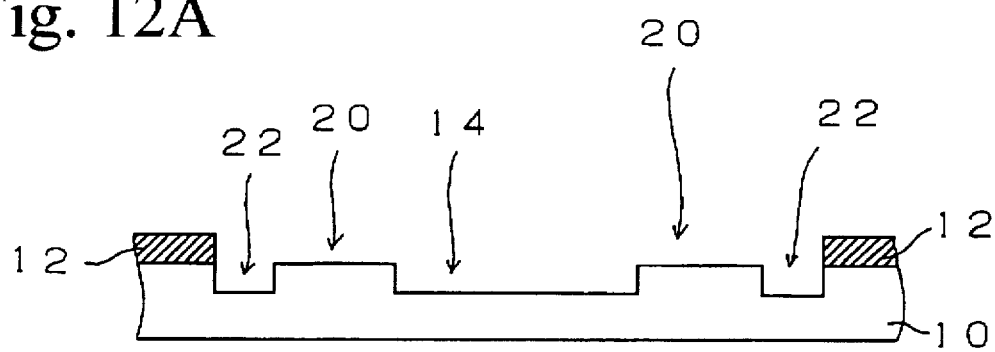
FIGS. 12A and 12B are fragmentary schematic cross-sectional views showing a phase shifting mask according to Inventive Example 8 and regions where an ion beam is applied.

A phase shifting mask according to Inventive Example 8 is a modification of the phase shifting mask according to Inventive Example 7, and schematically shown in FIG. 12A. The phase shifting mask according to Inventive Example 8 is different from the phase shifting mask according to Inventive Example 7 in that the light transmitting area 14 and the second phase shifting area 22 are in the form of recesses defined in the substrate 10. If the depth from the surface of the substrate 10 to the bottom of the light transmitting area 14 and the second phase shifting area 22 is $d'=\lambda/(2(n'-1))$ where $\lambda$ is the wavelength of exposure light and n' is the refractive index of the substrate, then light that has passed through the light transmitting area 14 and light that has passed through the second phase shifting area 22 are in phase with each other, and light that has passed through the light transmitting area 14 and light that has passed through the first phase shifting area 20 are 180° out of phase with each other. The portions where no ion beam is applied serve as the first phase shifting area 20. The phase shifting masks according to Inventive Examples 7 and 8 function in the same manner as each other.

Figure 12B:
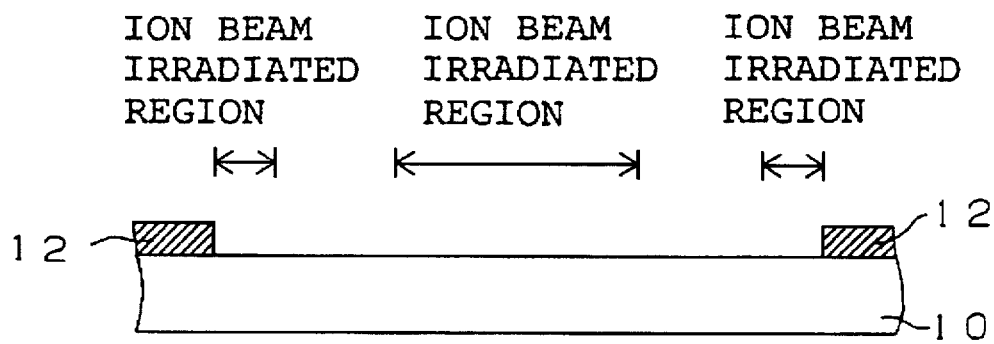

The phase shifting mask according to Inventive Example 8 can be manufactured basically in the same way as the phase shifting mask according to Inventive Example 7 except that regions where the ion beam from the focused ion beam system is applied in order to form the light transmitting area, the first phase shifting area, and the second phase shifting area are different from those in the phase shifting mask according to Inventive Example 7 in [Step 410]. The regions where the ion beam is applied in the phase shifting mask according to Inventive Example 8 are shown in FIG. 12B.

(Inventive Example 9)

A phase shifting mask according to Inventive Example 9 is a modification of the phase shifting mask according to Inventive Example 7. The phase shifting mask according to Inventive Example 9 is different from the phase shifting mask according to Inventive Example 7 as to its manufacturing method. A method of manufacturing the phase shifting mask according to Inventive Example 9 will be described below with reference to FIGS. 13A through 13D.
[Step 500]

A light shielding region 12 of chromium is deposited on a substrate 10 of quartz. This step is identical to [Step 100] of Inventive Example 1, and will not be described in detail below.

[Step 510]

Figure 13A:
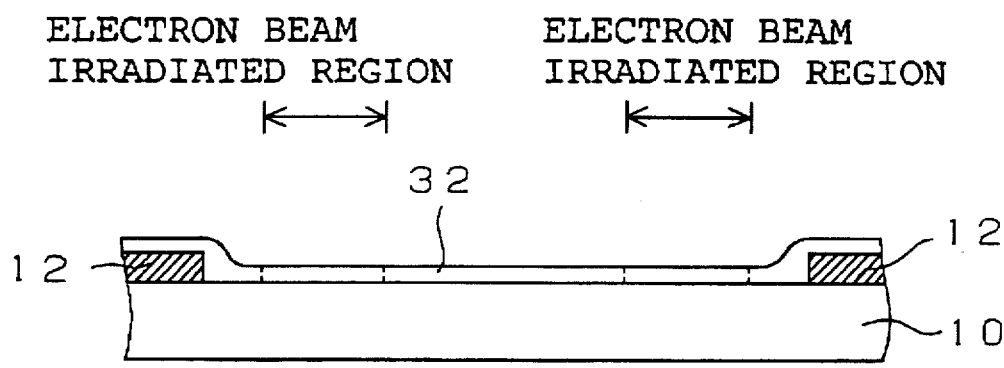
FIGS. 13A through 13D are fragmentary schematic cross-sectional views showing a method of manufacturing a phase shifting mask according to Inventive Example 9.

Then, an antistatic film (not shown) is deposited on the entire surface of the light shielding region 12 as by spin coating, and a positive electron-beam resist 32 is coated on the antistatic film as shown in FIG. 13A. Thereafter, a pattern is drawn by an electron beam emitted from an exposure system in order to form a light transmitting area and first and second phase shifting areas. Regions where the electron beam is applied are shown in FIG. 13A.

[Step 520]

Figure 13B:
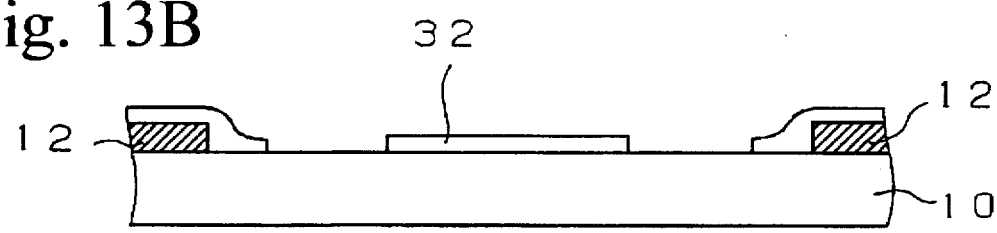
Figure 13C:
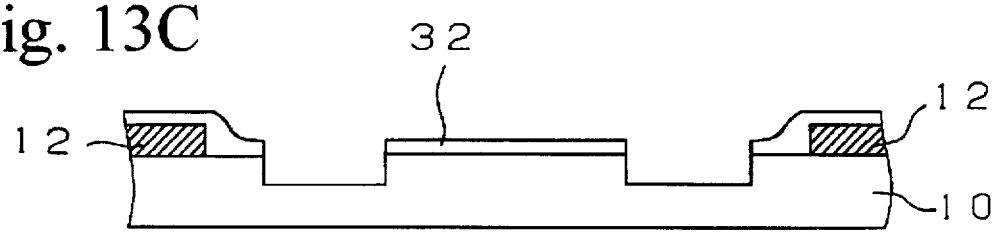
Figure 13D:
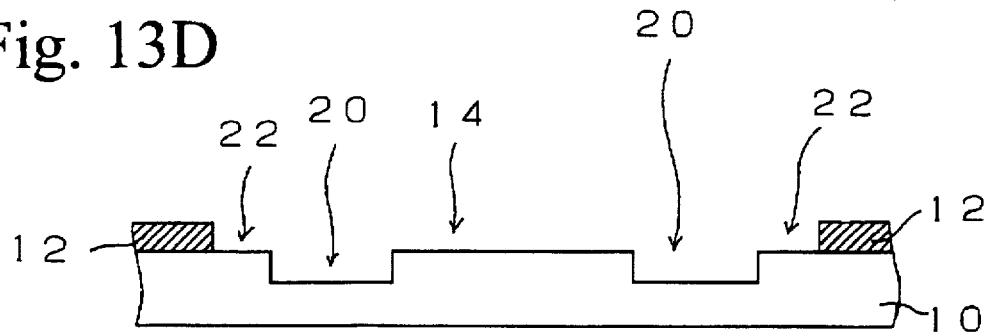

Thereafter, the positive electron-beam resist 32 is developed as shown in FIG. 13B, the substrate 10 is etched as shown in FIG. 13C, and the positive electron-beam resist 32 is removed as shown in FIG. 13D, thus forming a first phase shifting area 20 in the form of grooves. No first phase shifting areas exist between the first phase shifting area 20 and the light shielding region 12. The portions of the substrate which lie between the first phase shifting area 20 and the light shielding region 12 serve as a second phase shifting area 22. According to this method, the light transmitting area 14, the first phase shifting area 20, and the second phase shifting area 22 are formed in the same step, i.e., the step of etching the substrate. The antistatic film is removed by a suitable solvent after-the electron-beam resist is developed, or etched away at the same time the substrate is etched.

(Inventive Example 10)

A phase shifting mask according to Inventive Example 10 is a modification of the phase shifting mask according to Inventive Example 9, and also schematically shown in FIG. 12A. The phase shifting masks according to Inventive Examples 9 and 10 function in the same manner as each other.

The phase shifting mask according to Inventive Example 10 can be manufactured basically in the same way as the phase shifting mask according to Inventive Example 9 except that regions where the electron beam is applied in order to form the light transmitting area, the first phase shifting area, and the second phase shifting area are different from those in the phase shifting mask according to Inventive Example 9 in [Step 510]. The regions where the electron beam is applied in the phase shifting mask according to Inventive Example 10 are the same as the regions where the ion beam is applied as shown in FIG. 11B.

(Inventive Example 11)

Figure 14:
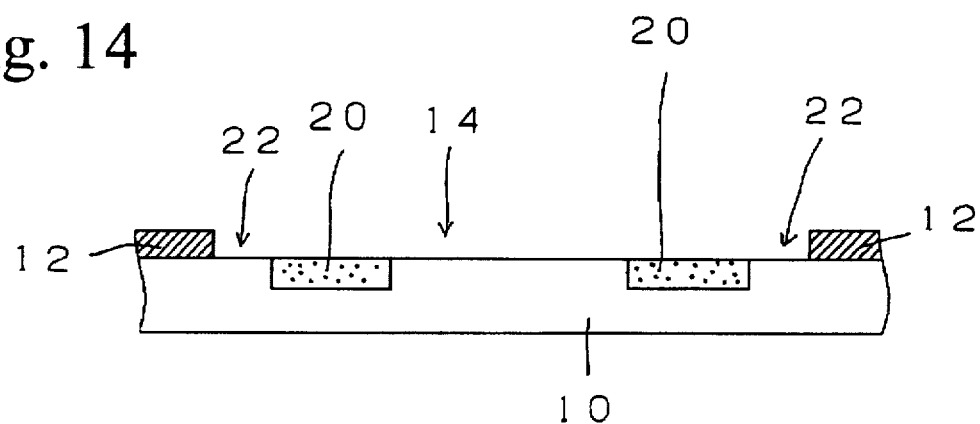
FIG. 14 is a fragmentary schematic cross-sectional view of phase shifting mask according to Inventive Example 11.

A phase shifting mask according to Inventive Example 11 is a modification of the phase shifting mask according to Inventive Example 1. The phase shifting mask according to Inventive Example 11 differs from the phase shifting mask according to Inventive Example 1 in that the first phase shifting area 20 is formed by varying the refractive index of the substrate 10. To vary the refractive index of the substrate 10, the substrate 10, which may be made of quartz, for example, may be doped with $N^+$ (nitrogen ions). If the depth from the surface of the substrate 10 to the bottom of the first phase shifting area 20 is $d''=\lambda/(2(n''-1))$ where $\lambda$ is the wavelength of exposure light and $n''$ is the refractive index of the substrate doped with $N^+$, then light that has passed through the light transmitting area 14 and light that has passed through the second phase shifting area 22 are in phase with each other, and light that has passed through the light transmitting area 14 and light that has passed through the first phase shifting area 20 are 180° out of phase with each other. The phase shifting mask according to Inventive Example 11 is schematically shown in FIG. 14.

The phase shifting mask according to Inventive Example 11 can be manufactured according to a modification of the method of the first embodiment of the present invention. The modified manufacturing method will be described below with reference to FIGS. 15A and 16B.

[Step 600]

A light shielding region 12 of chromium is deposited on a substrate 10 of quartz. This step is identical to [Step 100] of Inventive Example 1, and will not be described in detail below.

[Step 610]

Figure 15A:
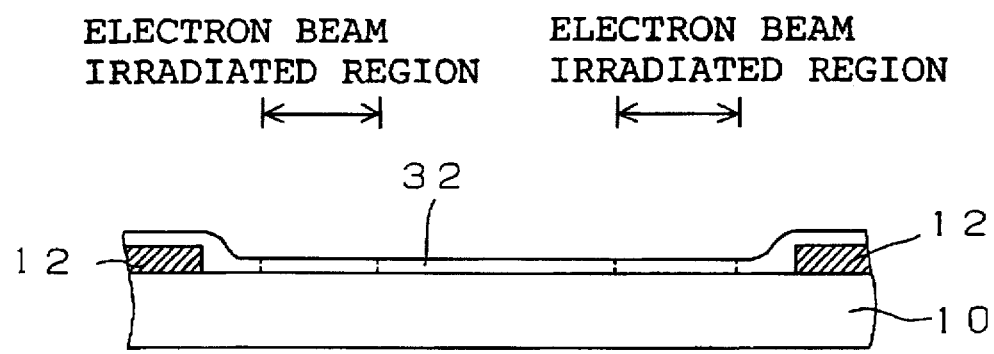
FIGS. 15A and 15B are fragmentary schematic cross-sectional views showing a method of manufacturing the phase shifting mask according to Inventive Example 11.

Then, an antistatic film (not shown) is deposited on the entire surface of the light shielding region 12 as by spin coating, and a positive electron-beam resist 32 is coated on the antistatic film as shown in FIG. 15A.

[Step 620]

Thereafter, a pattern is drawn by an electron beam emitted from an exposure system in order to form a light transmitting area and first and second phase shifting areas. Regions where the electron beam is applied are shown in FIG. 15A. Any desired patterns may be drawn by the electron beam on the positive electron-beam resist 32 over the light shielding region 12 away from the edges of the light shielding region 12.

[Step 630]

Figure 15B:
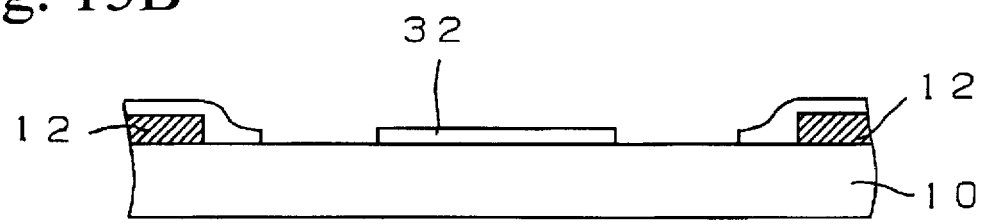

Thereafter, the positive electron-beam resist 32 is developed as shown in FIG. 15B, and the antistatic film is removed. An accelerating voltage for accelerating $N^+$ ions to reach the depth d" is selected, and the exposed substrate 10 is doped with $N^+$ at a dose of the order of $10^{16}/cm^2$. The refractive index of the substrate is now varied, forming a first phase shifting area 20. Then, the electron-beam resist 32 is removed, thus producing a phase shifting mask of the structure shown in FIG. 14. According to this method, the light transmitting area 14, the first phase shifting area 20, and the second phase shifting area 22 are formed in the same step, i.e., the step of doping the substrate 10 with $N^+$.

(Inventive Example 12)

Figure 16A:
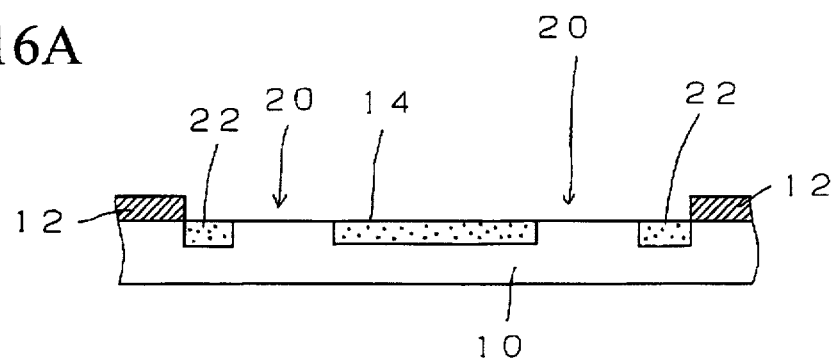
FIGS. 16A and 16B are fragmentary schematic cross-sectional views showing a phase shifting mask according to Inventive Example 12 and regions to be doped.

A phase shifting mask according to Inventive Example 12 is a modification of the phase shifting mask according to Inventive Example 11, and schematically shown in FIG. 16A. The phase shifting mask according to Inventive Example 12 differs from the phase shifting mask according to Inventive Example 11 in that the light transmitting area 14 and the second phase shifting area 22 are formed by varying the refractive index of the substrate 10. If the depth from the surface of the substrate 10 to the bottom of the light transmitting area 14 and the second phase shifting area 22 is $d''=\lambda/(2(n''-1))$ where $\lambda$ is the wavelength of exposure light and $n''$ is the refractive index of the substrate doped with $N^+$, then light that has passed through the light transmitting area 14 and light that has passed through the second phase shifting area 22 are in phase with each other, and light that has passed through the light transmitting area 14 and light that has passed through the first phase shifting area 20 are 180° out of phase with each other. The substrate portions where the refractive index remains unchanged serve as the first phase shifting area 20. The phase shifting masks according to Inventive Examples 11 and 12 function in the same manner as each other.

Figure 16B:
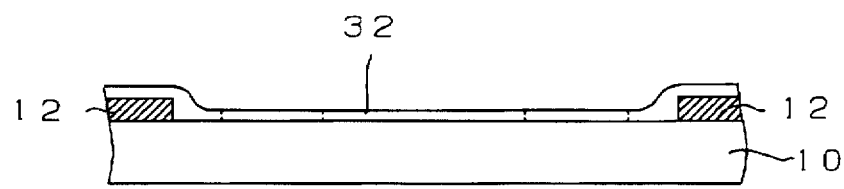

The phase shifting mask according to Inventive Example 12 can be manufactured basically in the same way as the phase shifting mask according to Inventive Example 11 except that regions which are doped with $N^+$ in order to form the light transmitting area, the first phase shifting area, and the second phase shifting area are different from those in the phase shifting mask according to Inventive Example 11 in [Step 630]. The regions where the electron beam is applied to the electron-beam resist 32 before being doped with $N^+$ in the phase shifting mask according to Inventive Example 12 are shown in FIG. 16B.

A phase shifting mask and a method of manufacturing such a phase shifting mask according to a second embodiment of the present invention will be described below with respect to Inventive Examples 13 through 24. In Inventive Examples 13 through 18, phase shifting areas are made of SOG (Spin On Glass), for example. In Inventive Examples 19 through 22, phase shifting areas are formed by varying the depth of a substrate. In Inventive Examples 23 and 24, phase shifting areas are formed by varying the refractive index of a substrate.

(Inventive Example 13)

Figure 17A:
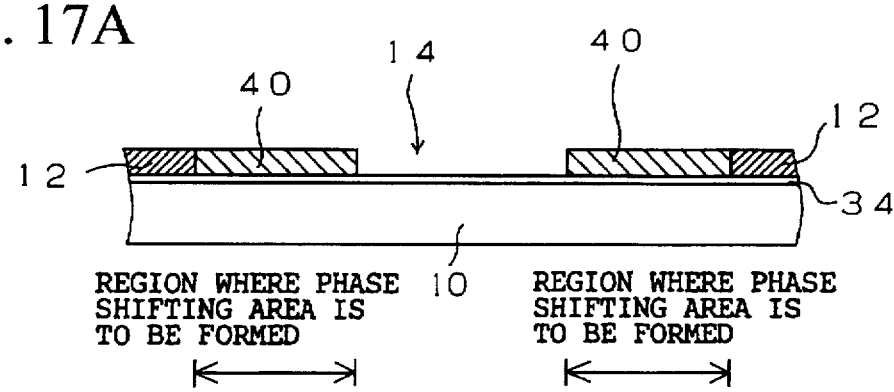
FIGS. 17A and 17B are fragmentary schematic cross-sectional views of a phase shifting mask according to Inventive Example 13.

A phase shifting mask according to Inventive Example 13 is schematically shown in FIG. 17A. The phase shifting mask according to Inventive Example 13 can be by a manufacturing method according to a second embodiment of the present invention.

The phase shifting mask according to Inventive Example 13 comprises a substrate 10, a light shielding region 12, a light transmitting area 14, and a phase shifting area 40 disposed between the light shielding region 12 and the light transmitting area 14. The phase shifting mask according to Inventive Example 13 is different from the phase shifting mask according to Inventive Example 1 or the conventional phase shifting masks in that the phase shifting area 40 which has a phase shifting area shape that is obtained when no positional misalignment is present between the light shielding region and the light transmitting area is disposed between the light shielding region and the light transmitting area. The phase shifting area 40 may be made of SOG, for example.

Figure 17B:
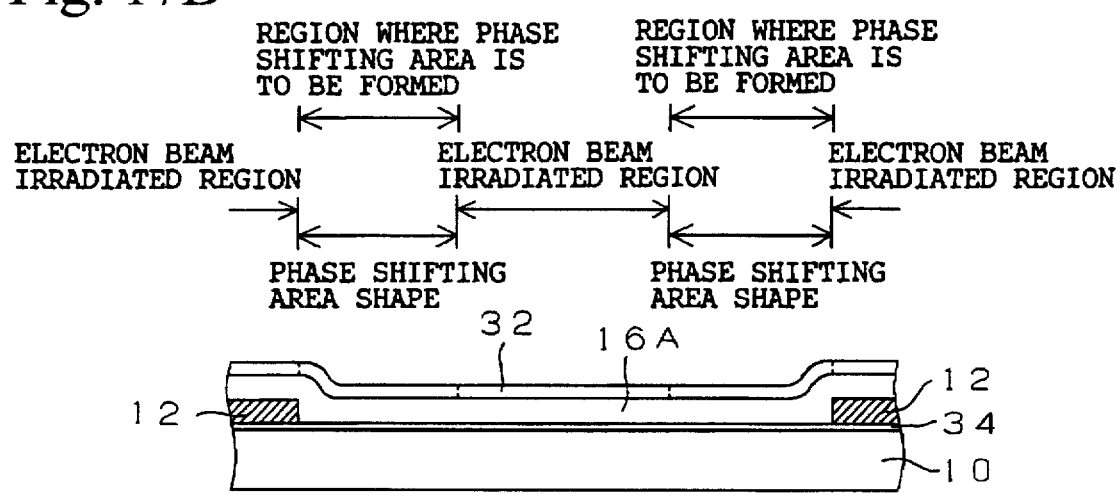

In the phase shifting mask according to Inventive Example 13, which has the structure shown in FIG. 17A, no positional misalignment is present between the light shielding region 12 and the light transmitting area 14 when the light transmitting area 14 is formed. Therefore, the phase shifting area 40 which has a phase shifting area shape that is obtained when no positional misalignment is present between the light shielding region and the light transmitting area is disposed between the light shielding region 12 and the light transmitting area 14. Stated otherwise, the phase shifting area 40 is not formed on the light shielding region 12. The relationship between the phase shifting area shape (which coincides with some regions where no electron beam is applied) that is obtained when no positional misalignment is present between the light shielding region and the light transmitting area and regions where the phase shifting area is to be formed is schematically shown in FIG. 17B.

Figure 18A:
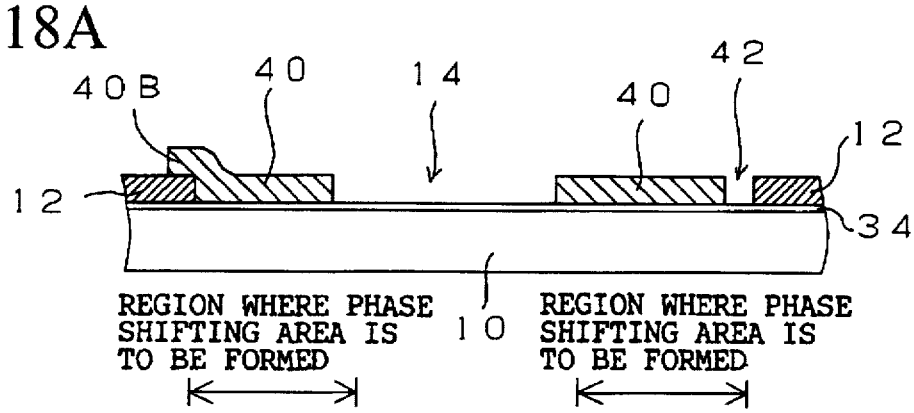
FIGS. 18A through 18C are fragmentary schematic cross-sectional views of a phase shifting mask according to Inventive Example 13A.
Figure 18B:
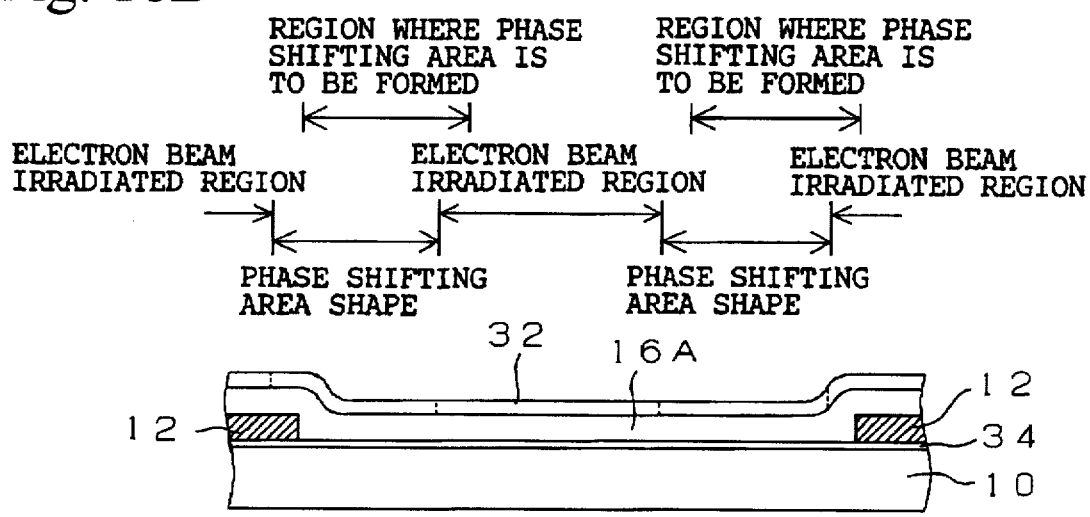

In a phase shifting mask according to Inventive Example 13A, which has a structure as shown in FIG. 18A, there is a positional misalignment present between the light shielding region 12 and the light transmitting area 14 when the light transmitting area 14 is formed. That is, the light transmitting area 14 is displaced slightly off (leftward in FIG. 18A) a desired position. Therefore, a phase shifting area 40 which has a phase shifting area shape that is obtained when no positional misalignment is present between the light shielding region and the light transmitting area is disposed in a portion between the light transmitting area and the light shielding region. Stated otherwise, the phase shifting area 40 has a portion 40B disposed on the light shielding region 12. A second phase shifting area 42 is disposed between the phase shifting area 40 and the light shielding region 12. The relationship between the phase shifting area shape (which includes some regions where no electron beam is applied) that is obtained when no positional misalignment is present between the light shielding region and the light transmitting area and regions where the phase shifting area is to be formed is schematically shown in FIG. 18B.

The principles of the phase shifting mask according to Inventive Example 13A as shown in FIG. 18A are the same as the principles of the phase shifting mask according to the first embodiment of the present invention.

In Inventive Example 13A as shown in FIG. 18A, light that has passed through the light transmitting area 14 and light that has passed through the second phase shifting area 42 are in phase with each other. The phase shifting area 40 is made of SOG, for example. If it has a thickness d $=\lambda/(2(n-1))$, then the light that has passed through the light transmitting area 14 and the second phase shifting area 42 is 180° out of phase with light that has passed through the first phase shifting area 40.

The phase shifting mask according to Inventive Example 13 or 13A can be manufactured by the method according to the second embodiment of the present invention. The manufacturing method will be described below. In this manufacturing method, it is assumed that a positional misalignment occurs between the light shielding region and the light transmitting area when the light transmitting area 14 is formed.

[Step 700]

A light shielding region is deposited on a substrate 10 (see FIG. 2B). This step is identical to [Step 100] of Inventive Example 1, and will not be described in detail below.

[Step 710]

Then, the structure shown in FIG. 2C is formed. This step is identical to [Step 110] of Inventive Example 1, and will not be described in detail below.

[Step 720]

Then, a pattern is drawn by an electron beam emitted from an exposure system in order to form a light transmitting area and a phase shifting area. In the case where a positive electron-beam resist 32 is used, regions where the electron beam is applied are regions other than those where a phase shifting area is to be formed. Actually, however, the regions where the electron beam is applied (electron beam irradiated regions) are displaced from the desired regions (regions other than those where a phase shifting area is to be formed). Specifically, the electron beam is also applied to a portion of the regions where a phase shifting area is to be formed, and no electron beam is applied to a portion of the light shielding region 12. This is because there is caused a positional misalignment between the light shielding region 12 and the light transmitting area 14 depending on the positioning accuracy of the exposure system.

[Step 730]

Figure 18C:
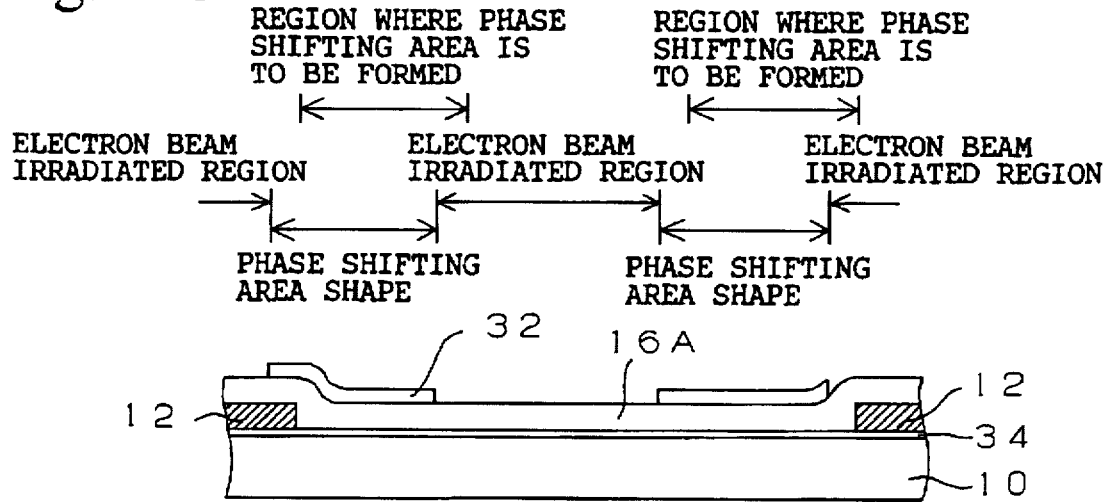

Thereafter, the electron-beam resist 32 is developed as shown in FIG. 18C. The phase shifting layer 16A is etched, and the electron-beam resist 32 is removed, thereby providing the phase shifting mask according to Inventive Example 13A as shown in FIG. 18A.

(Inventive Example 14)

Figure 19A:
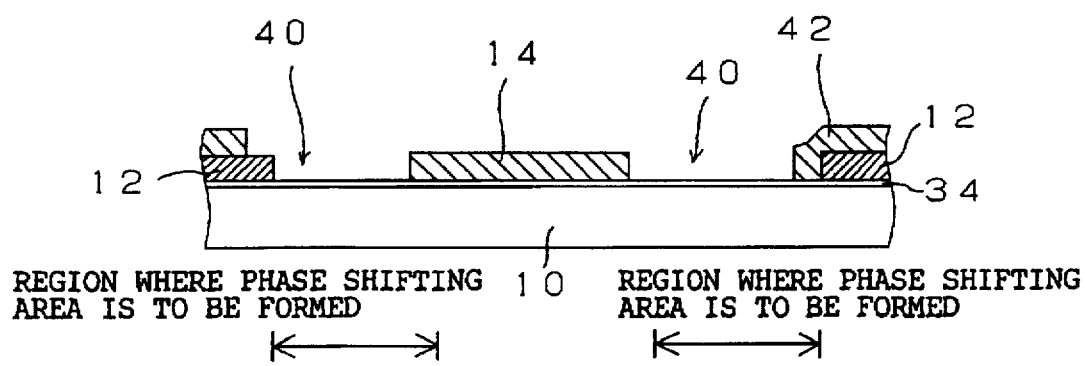
FIGS. 19A and 19B are fragmentary schematic cross-sectional views of a phase shifting mask according to Inventive Example 14.

A phase shifting mask according to Inventive Example 14 is a modification of the phase shifting mask according to Inventive Example 13, and schematically shown in FIG. 19A. The phase shifting mask according to Inventive Example 14 can also be manufactured by the method according to the second embodiment of the present invention.

The phase shifting mask according to Inventive Example 14 differs from the phase shifting mask according to Inventive Example 13 in that the light transmitting area is made of SOG, for example. Because of the positional misalignment between the light shielding region 12 and the light transmitting area 14, the second phase shifting area 42 which may be made of SOG, for example, is disposed between the phase shifting area 40 and the light shielding region 12. Light that has passed through the light transmitting area 14 and light that has passed through the second phase shifting area 42 are in phase with each other. If they have a thickness $d = \lambda/(2(n-1))$, then the light that has passed through the light transmitting area 14 and the second phase shifting area 42 is 180° out of phase with light that has passed through the phase shifting area 40.

With the phase shifting mask having the structure shown in FIG. 19A, a positional misalignment occurs between the light shielding region 12 and the light transmitting area 14 at the time the phase shifting mask is manufactured. Specifically, the light transmitting area 14 is displaced slightly off (leftward in FIG. 19A) a desired position. Therefore, the phase shifting area 40 which has a phase shifting area shape that is obtained when no positional misalignment is present between the light shielding region and the light transmitting area is disposed in a portion between the light transmitting area and the light shielding region. Stated otherwise, the second phase shifting area 42 is partly disposed between the phase shifting area 40 and the light shielding region 12. The relationship between the phase shifting area shape that is obtained when no positional misalignment is present between the light shielding region and the light transmitting area, i.e., the electron beam irradiated regions, and regions where the phase shifting area is to be formed is schematically shown in FIG. 19B.

Figure 19B:
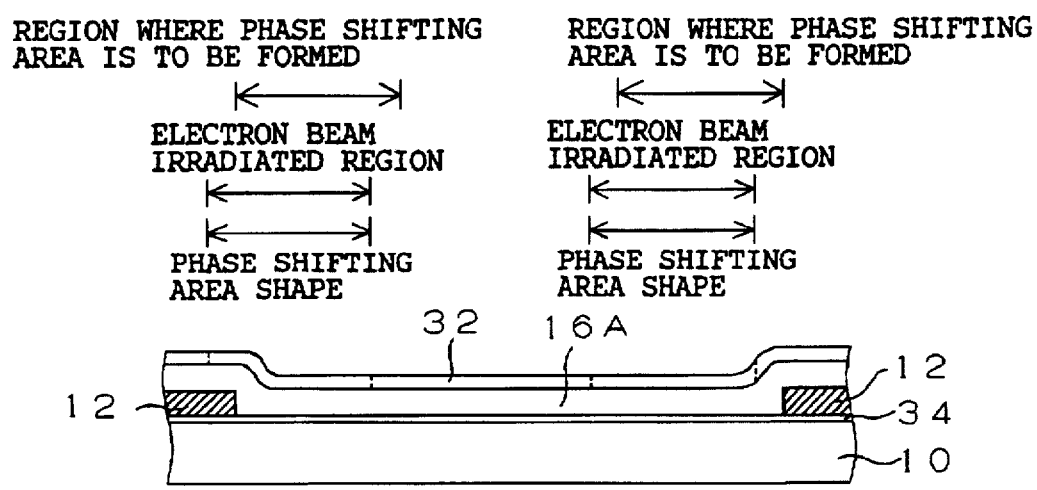

The phase shifting mask according to Inventive Example 14 can be manufactured by the method according to the second embodiment of the present invention except that regions where patterns are drawn by an electron beam from an exposure system in order to form the light transmitting area are different from those in the phase shifting mask according to Inventive Example 13 in [Step 720] (see FIG. 19B).

In order to manufacture a phase shifting mask of the structure shown in FIGS. 17A and 17B or 18A through 18C using a negative electron-beam resist instead of the positive electron-beam resist 32, the electron beam may be applied to the regions shown in FIG. 19B. In order to manufacture a phase shifting mask of the structure shown in FIG. 19A using a negative electron-beam resist instead of the positive electron-beam resist 32, the electron beam may be applied to the regions shown in FIG. 17B or 18B.

Intensity distributions of light that has passed through the phase shifting mask according to Inventive Example 13 were measured when a positional misalignment ($L_0$) between the phase shifting area shape that is obtained when no positional misalignment is present between the light shielding region and the light transmitting area and regions where the phase shifting area is to be formed is 0 μm. Intensity distributions of light that has passed through the phase shifting mask according to Inventive Example 13A were also measured when a positional misalignment ($L_0$) between the phase shifting area shape that is obtained when no positional misalignment is present between the light shielding region and the light transmitting area and regions where the phase shifting area is to be formed is 0.25 μm.

Figure 40:
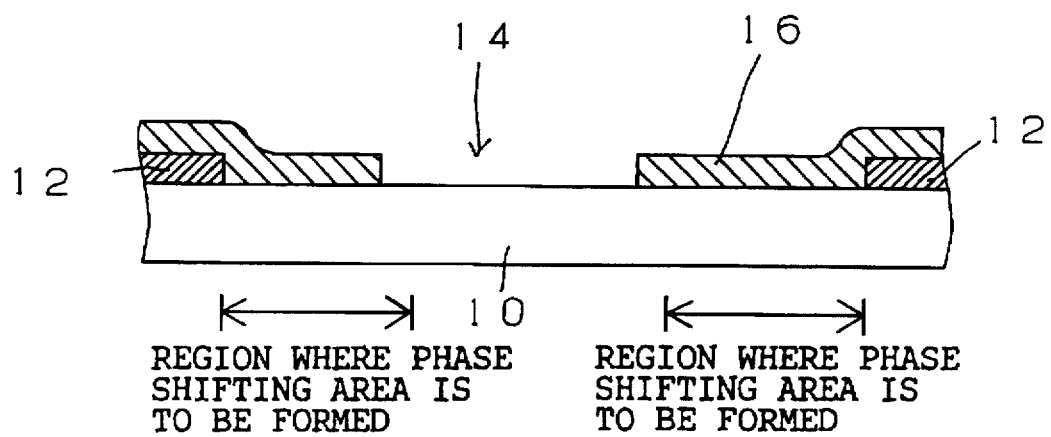
FIG. 40 is a fragmentary schematic cross-sectional view of a phase shifting mask according to Comparative Example 2.
Figure 41A:
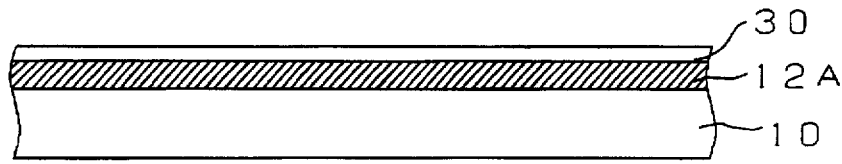
FIGS. 41A are through 41E are fragmentary schematic cross-sectional views showing a process of manufacturing a conventional phase shifting mask.
Figure 41B:
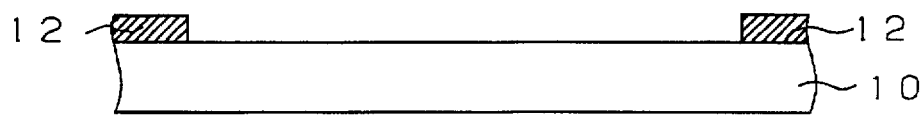
Figure 41C:
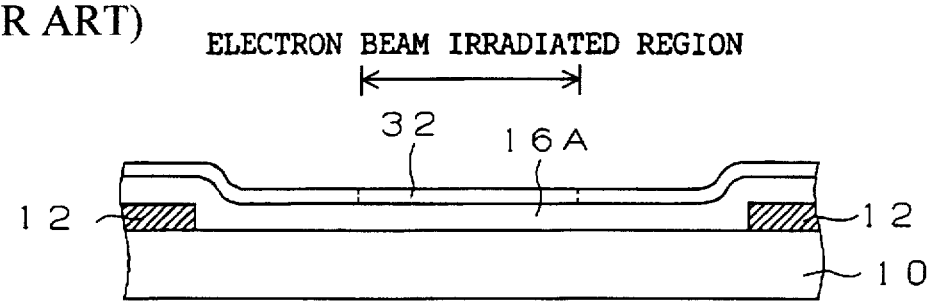
Figure 41D:
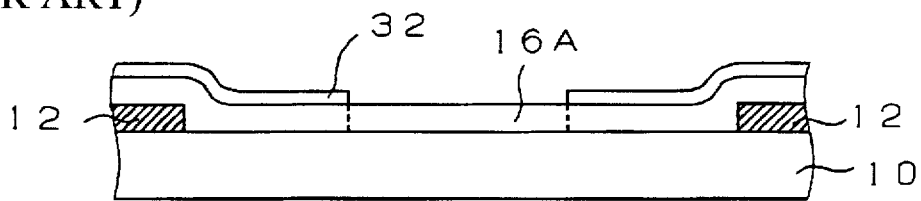
Figure 41E:
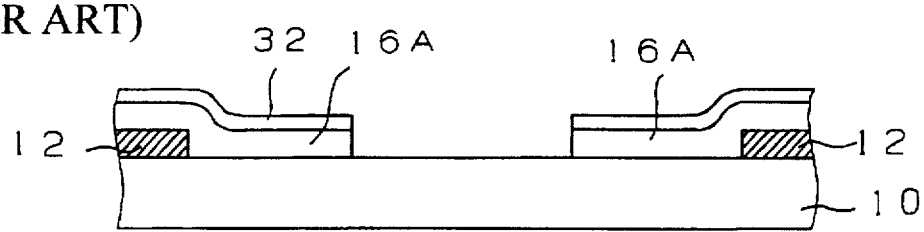

A phase shifting mask according to Comparative Example 2 (see FIG. 40) was manufactured in the same manner as the phase shifting mask according to Comparative Example 1. In the phase shifting mask according to Comparative Example 2, a positional misalignment ($L_0$) between the phase shifting area shape that is obtained when no positional misalignment is present between the light shielding region and the light transmitting area and regions where the phase shifting area is to be formed is 0.25 μm. This phase shifting mask was also measured for intensity distributions of light that has passed therethrough. In order to form a contact hole having a diameter of 0.4 μm on a wafer, the widths (unit: μm) of various portions of the phase shifting masks are selected as follows:

$L_1$: the width of the light transmitting area;

$L_2$: the width of the phase shifting area in Inventive Examples 13, 13A or the width of the phase shifting area in Comparative Example 2; and $L_3$: the width of the second phase shifting area in Inventive Examples 13, 13A.

| | $L_0$ | $L_1$ | $L_2$ | $L_3$ |
|---|---|---|---|---|
| Inventive Example 13 | 0 | 2.60 | 1.00 | — |
| Inventive Example 13A | 0.25 | 2.60 | 1.00 | 0.25 |
| Comparative Example 2 | 0.25 | 2.60 | 1.00 | 0.25 |

Figure 20A:
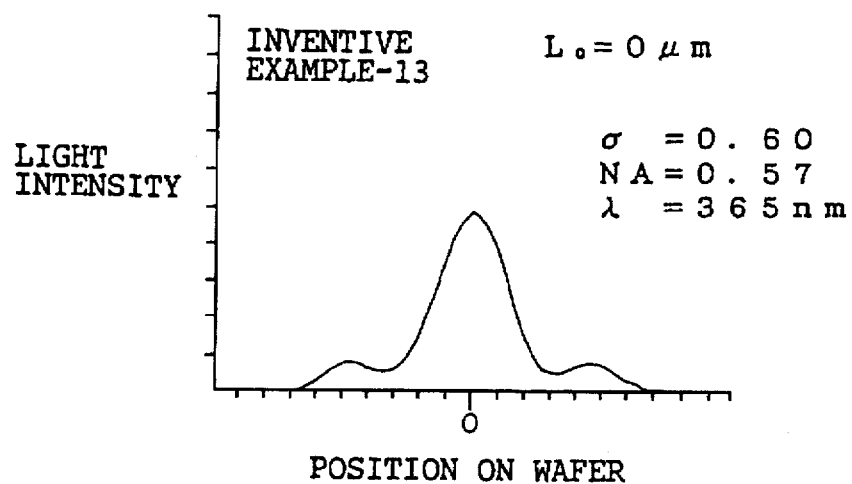
FIG. 20 is a set of diagrams illustrative of measured light intensity distributions of Inventive Example 13A and Comparative Example 2.
Figure 20B:
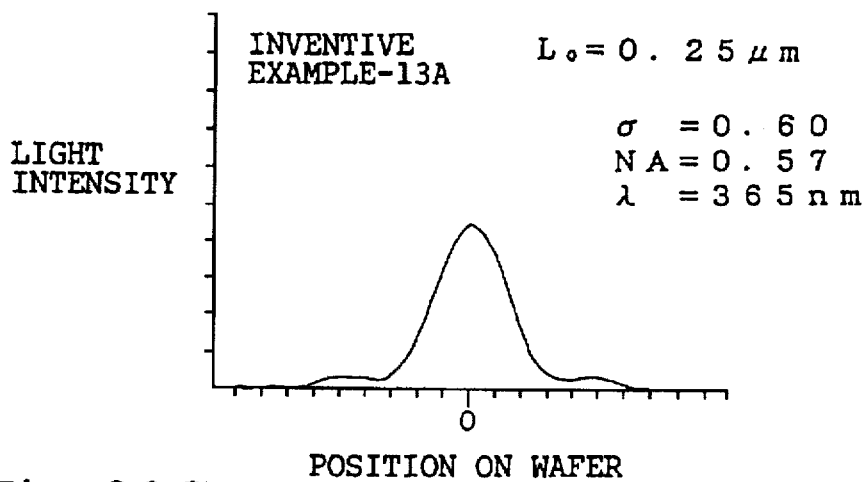
Figure 20C:
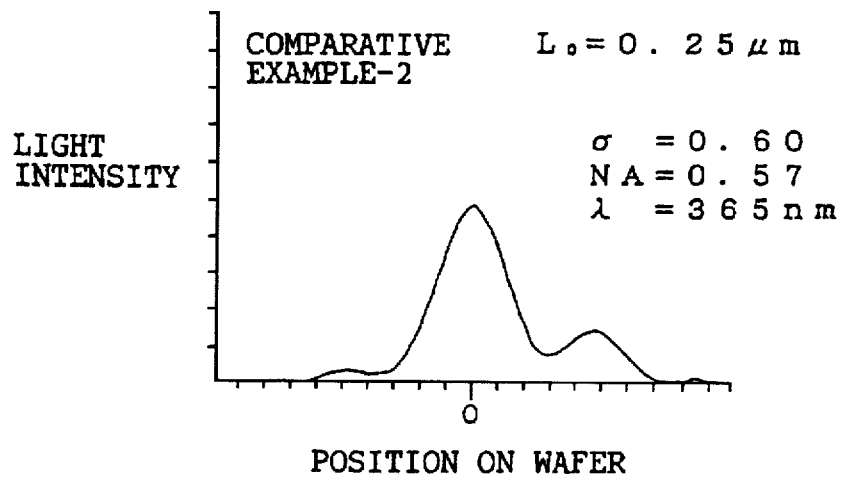

FIG. 20 shows measured light intensity distributions when exposure light with coherency ($\sigma$)=0.6, NA=0.57, and the wavelength of 365 nm passed through the phase shifting masks. A 5×stepper (reduction exposure projection system) was used to apply exposure light.

Intensity distributions of light that has passed through the phase shifting masks according to Inventive Examples 13, 13A and Comparative Example 2 were measured. In order to form a contact hole having a diameter of 0.3 μm on a wafer, the widths (unit: μm) of various portions of the phase shifting masks are selected as follows:

| | $L_0$ | $L_1$ | $L_2$ | $L_3$ |
|---|---|---|---|---|
| Inventive Example 13 | 0 | 2.10 | 0.75 | — |
| Inventive Example 13A | 0.25 | 2.10 | 0.75 | 0.25 |
| Comparative Example 2 | 0.25 | 2.10 | 0.75 | 0.25 |

Figure 21A:
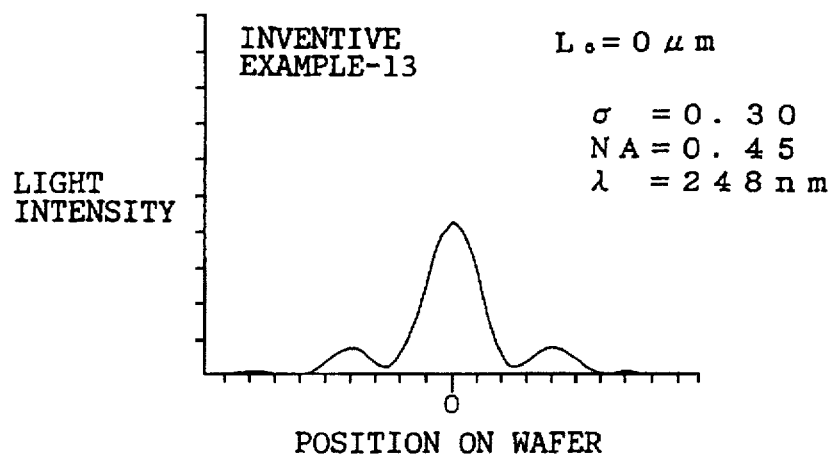
FIG. 21 is a set of diagrams illustrative of measured light intensity distributions of Inventive Example 13A and Comparative Example 2.
Figure 21B:
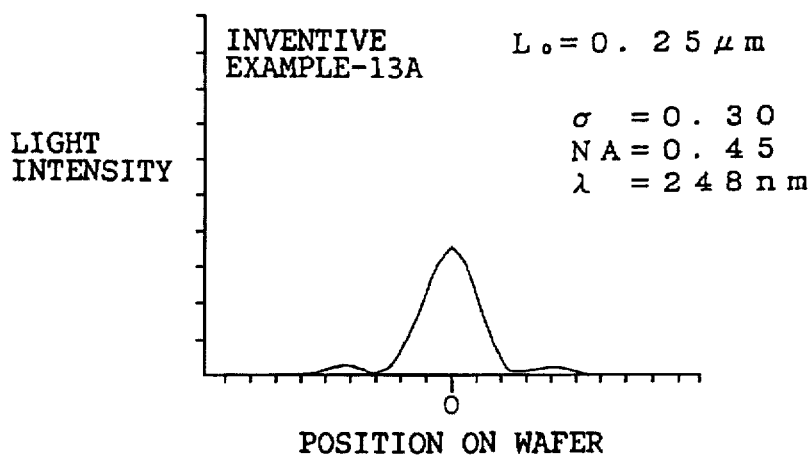
Figure 21C:
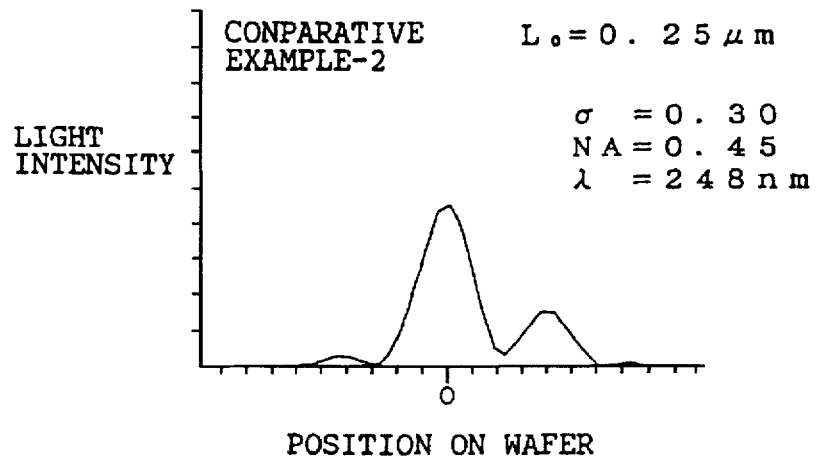

FIG. 21 shows measured light intensity distributions when exposure light with coherency ($\sigma$)=0.3, NA=0.45, and the wavelength of 248 nm passed through the phase shifting masks. A 5×stepper (reduction exposure projection system) was used to apply exposure light.

As is apparent from FIGS. 20 and 21, the intensity of light that has passed through the phase shifting masks according to Inventive Examples 13, 13A has only one peak that contributes to the transfer of a pattern. Even if there occurred a positional misalignment between the light shielding region and the light transmitting area, it was possible to reduce the light that has passed through the phase shifting mask to the extent that the resist on the wafer is exposed to only the pattern of the light transmitting area on the phase shifting mask. The same advantage was achieved even when the positional misalignment between the light shielding region and the light transmitting area was produced not only in leftward and rightward directions in the cross-sectional views but also in directions perpendicular to the sheets of the cross-sectional views. The same advantage was also achieved even when the positional misalignment ($L_0$) has different values in these directions. While the positional misalignment ($L_0$) happened to be 0.25 μm, the positional misalignment ($L_0$) is not limited to this value, but may be of any values insofar as the same advantage is obtained.

It is sufficient for the exposure system to have a pattern positioning accuracy of about 0.15 µm which can be achieved by present commercially available exposure systems. Therefore, phase shifting masks can be manufactured at a reduced cost for increased productivity.

The intensity of light that has passed through the phase shifting mask according to Comparative Example 2 has one peak that contributes to the transfer of a pattern and another unwanted peak that does not contribute to the transfer of a pattern. The right-hand peak in Comparative Example 2 is caused because the positional misalignment $L_0$ is 0.25 µm. Specifically, the right-hand peak is produced because the width of the phase shifting area is 0.25 µm wider than a preset value, allowing excessive light to pass through the phase shifting area.

The phase shifting masks according to Inventive Examples 13, 13A had a very high capability to transfer a pattern onto a resist on a wafer. However, the phase shifting mask according to Comparative Example 2 allowed unwanted portions of a resist on a wafer to be exposed to light, making it impossible to form a proper pattern on the resist on the wafer. It was impossible for the phase shifting mask according to Comparative Example 2 to form a pattern on a resist on a wafer when a positional misalignment was caused between the light shielding region and the light transmitting area in only one of leftward and rightward directions in its cross-sectional view and directions perpendicularly to the sheet of the cross-sectional view. It was also impossible for the phase shifting mask according to Comparative Example 2 to form a pattern on a resist on a wafer when a positional misalignment between the light shielding region and the light transmitting area in leftward and rightward directions in its cross-sectional view differs from a positional misalignment between the light shielding region and the light transmitting area in directions perpendicularly to the sheet of the cross-sectional view.

In Inventive Examples 15 through 24 described below, it is assumed that a positional misalignment occurs between the light shielding region 12 and the light transmitting area 14 when the light transmitting area 14 is formed.

(Inventive Example 15)

Figure 22:
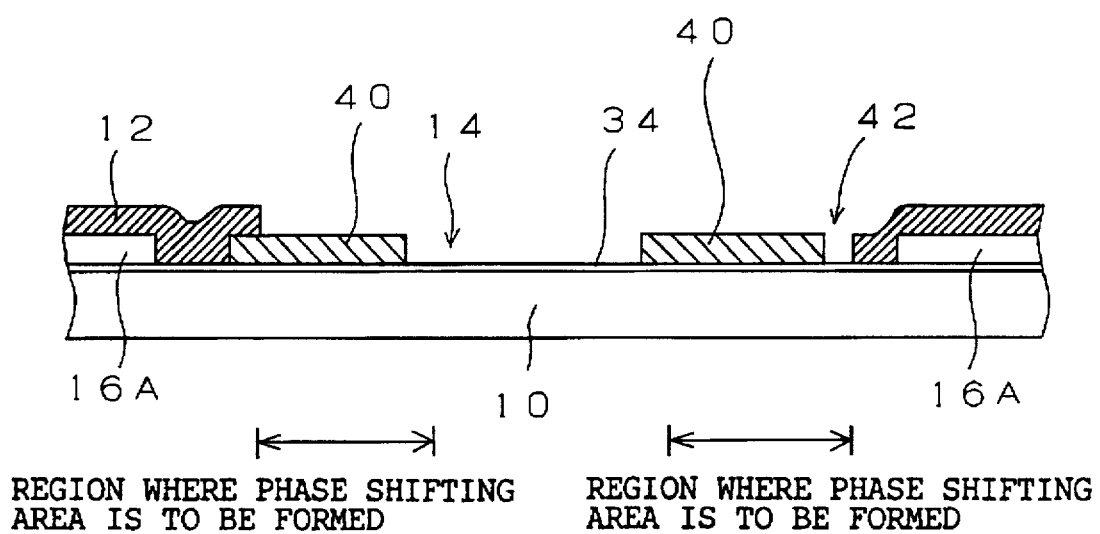
FIG. 22 is a fragmentary schematic cross-sectional view of a phase shifting mask according to Inventive Example 15.

A phase shifting mask according to Inventive Example 15 is schematically shown in FIG. 22. The phase shifting mask according to Inventive Example 15 is different from the phase shifting mask according to Inventive Example 13 in that the phase shifting layer 16A is sandwiched between the substrate 10 and the light shielding region 12.

The phase shifting mask according to Inventive Example 15 can be manufactured according to a modification of the method of the second embodiment of the present invention. The modified manufacturing method will be described below with reference to FIGS. 23A through 23D.

[Step 800]

Figure 23A:
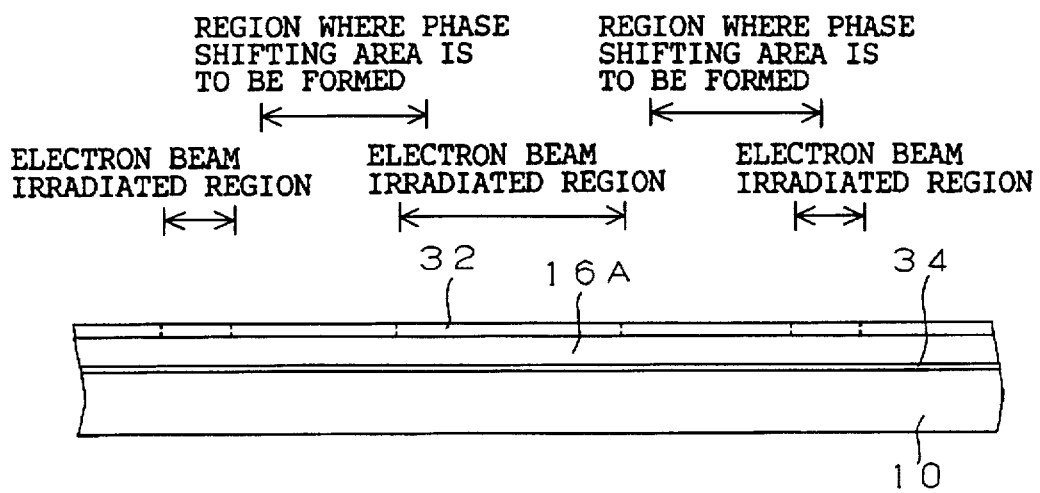
FIGS. 23A through 23D are fragmentary schematic cross-sectional views showing a method of manufacturing the phase shifting/mask according to Inventive Example 15.

As shown in FIG. 23A, a tin oxide layer 34, for example, which serves as a transparent conductive layer and an etching stop layer, is deposited on a substrate 10 of quartz, and then a phase shifting layer 16A which may be made of SOG, for example, is deposited on the tin oxide layer 34. The phase shifting layer 16A has a thickness $d=\lambda/(2(n-1))$ so as to achieve the phase difference of 180° described above. Thereafter, a positive electron-beam resist 32 is coated on the phase shifting layer 16A.

[Step 810]

Then, a pattern is drawn by an electron beam emitted from an exposure system in order to a light transmitting area and a phase shifting area as shown in FIG. 23A. This step is identical to [Step 720] of Inventive Example 13, and will not be described in detail below.

[Step 820]

Figure 23B:
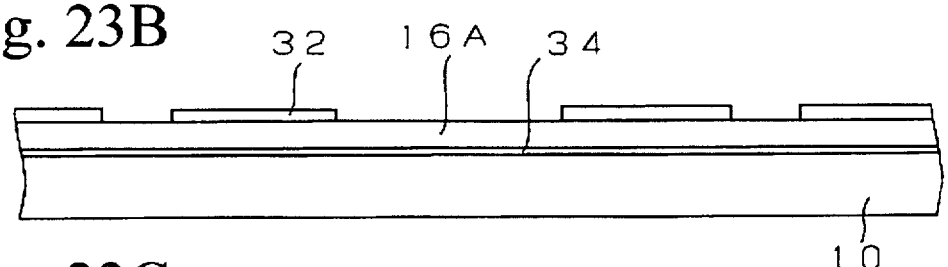
Figure 23C:
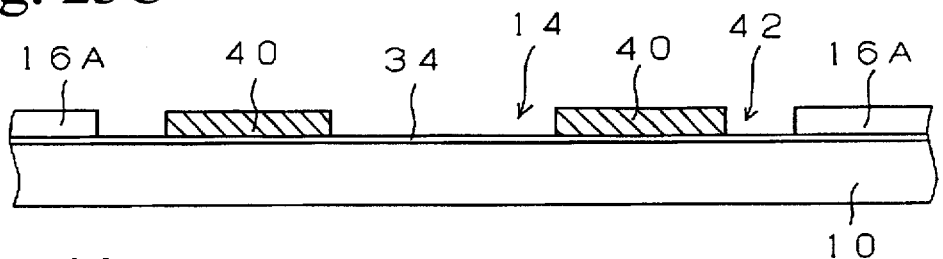

Thereafter, the positive electron-beam resist 32 is developed as shown in FIG. 23B. The phase shifting layer 16A is etched, and the positive electron-beam resist 32 is removed, thus providing a phase shifting mask which is of the structure shown in FIG. 23C. A second phase shifting area 42 is formed by a positional misalignment between the regions where the electron beam is applied (electron beam irradiated regions) and desired regions (regions other than regions where a phase shifting area is to be formed).

[Step 830]

Figure 23D:
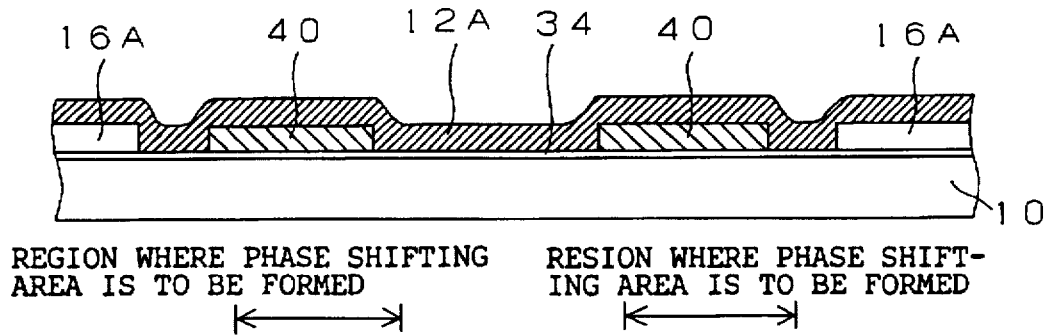

Then, a light shielding layer 12A which may be made of chromium, for example, is deposited on the substrate 10 by sputtering, for example, as shown in FIG. 23D. Thereafter, the light shielding layer 12A is coated with a positive electron-beam resist (not shown), a pattern is drawn by an electron beam emitted from an exposure system, the electron-beam resist is developed, the light shielding layer is etched, and the electron-beam resist is removed, thereby providing a phase shifting mask of the structure shown in FIG. 22.

(Inventive Example 16)

Figure 24A:
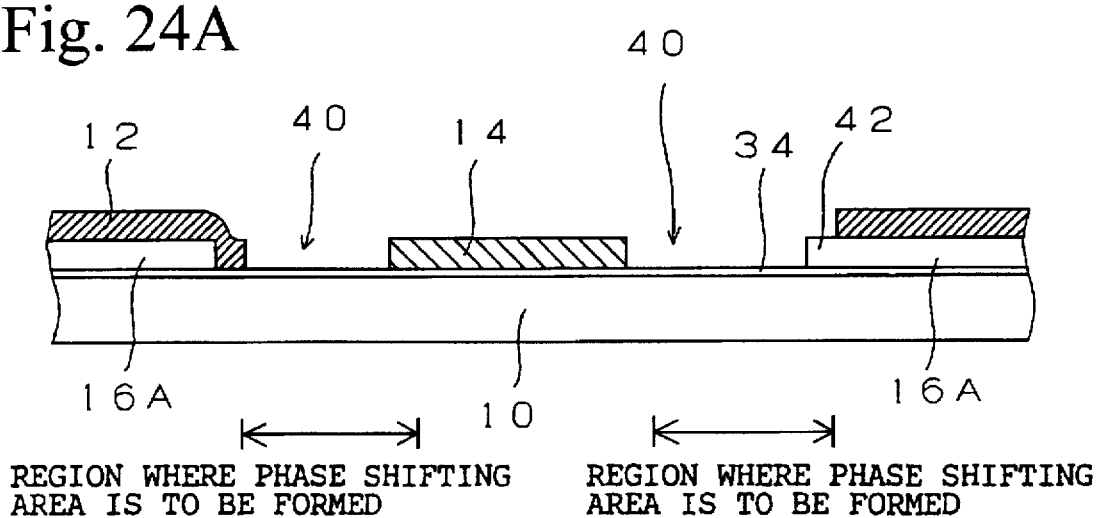
FIGS. 24A and 24B are fragmentary schematic cross-sectional views showing a phase shifting mask according to Inventive Example 16 and regions where an electron beam is applied.

A phase shifting mask according to Inventive Example 16 is a modification of the phase shifting mask according to Inventive Example 15, and schematically shown in FIG. 24A. The phase shifting mask according to Inventive Example 16 is different from the phase shifting mask according to Inventive Example 14 in that the phase shifting layer 16A is sandwiched between the substrate 10 and the light shielding region 12.

The phase shifting mask according to Inventive Example 16 can be manufactured basically in the same way as the phase shifting mask according to Inventive Example 15 except that regions where patterns are drawn by an electron beam from an exposure system in order to form the light transmitting area and the phase shifting area are different from those in the phase shifting mask according to Inventive Example 15 in [Step 810]. The regions where the electron beam is applied in the phase shifting mask according to Inventive Example 16 are shown in FIG. 24B.

Figure 24B:
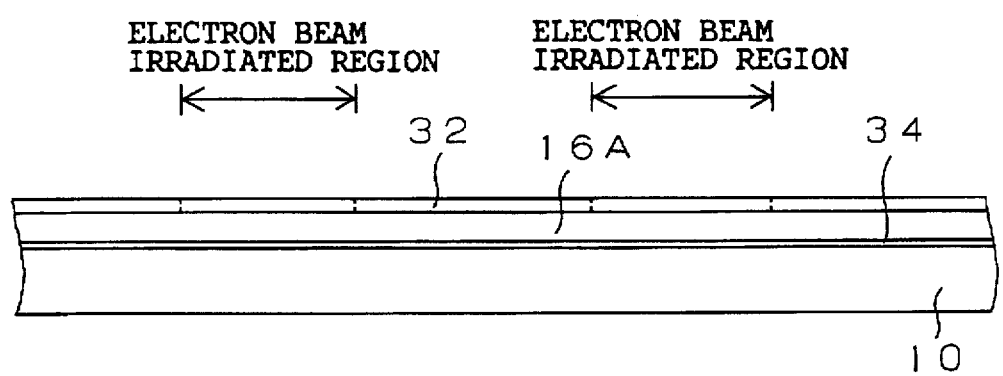

In order to manufacture a phase shifting mask of the structure shown in FIG. 22 using a negative electron-beam resist instead of the positive electron-beam resist 32, the electron beam may be applied to the regions shown in FIG. 24B. In order to manufacture a phase shifting mask of the structure shown in FIGS. 24A and 24B using a negative electron-beam resist instead of the positive electron-beam resist 32, the electron beam may be applied to the regions shown in FIG. 23A.

(Inventive Example 17)

A phase shifting mask according to Inventive Example 17 is a modification of the phase shifting mask according to Inventive Example 15. The phase shifting mask according to Inventive Example 17 is different from the phase shifting mask according to Inventive Example 15 as to its manufacturing method.

The phase shifting mask according to Inventive Example 17 can be manufactured according to a modification of the method of the second embodiment of the present invention. The modified manufacturing method will be described below with reference to FIGS. 25A through 25D.

[Step 900]

Figure 25A:
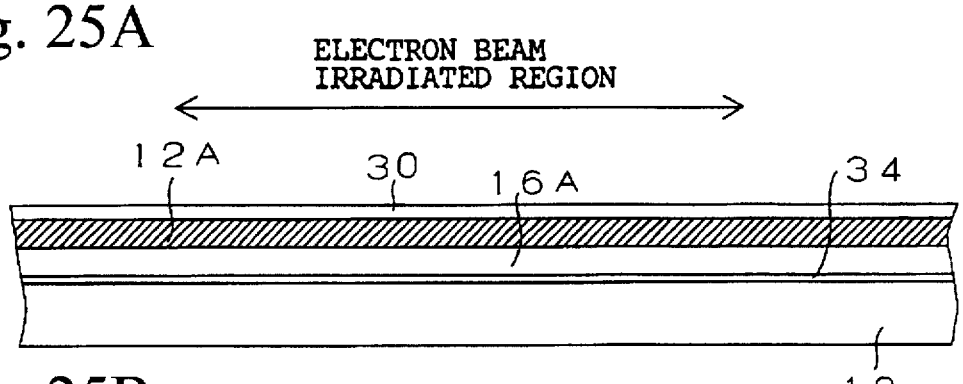
FIGS. 25A through 25D are fragmentary schematic cross-sectional views showing a method of manufacturing a phase shifting mask according to Inventive Example 17.

As shown in FIG. 25A, a tin oxide layer 34, for example, which serves as a transparent conductive layer and an etching stop layer, is deposited on a substrate 10 of quartz, and then a phase shifting layer 16A which may be made of SOG, for example, is deposited on the tin oxide layer 34. The phase shifting layer 16A has a thickness $d=\lambda/(2(n-1))$ so as to achieve the phase difference of 180° described above. Thereafter, a light shielding layer 12A which may be made of chromium, for example, is deposited on the phase shifting layer 16A by sputtering, for example. Then, a positive electron-beam resist 30 is coated on the light shielding layer 12A, thereby providing a structure shown in FIG. 25A.

[Step 910]

Then, a pattern is drawn by an electron beam emitted from an exposure system in order to form a light shielding region 12. Regions where the electron beam is applied are shown in FIG. 25A.

[Step 920]

Figure 25B:
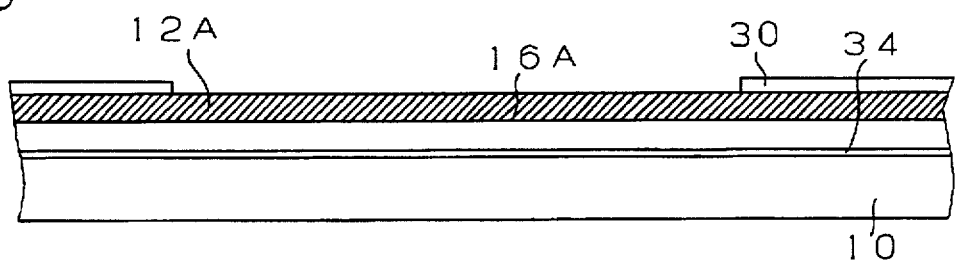

Thereafter, the positive electron-beam resist 30 is developed as shown in FIG. 25B. The light shielding layer 12A is etched, and the positive electron-beam resist 30 is removed.

[Step 930]

Figure 25C:
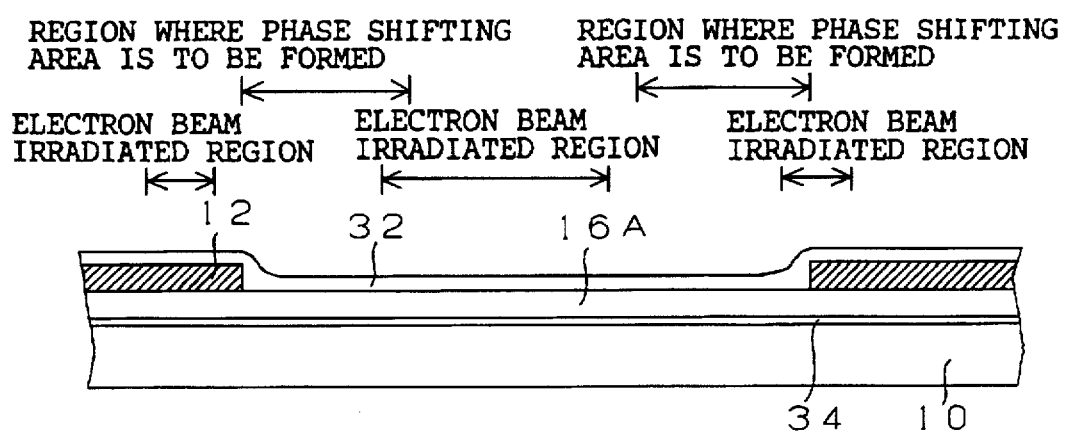
Figure 25D:
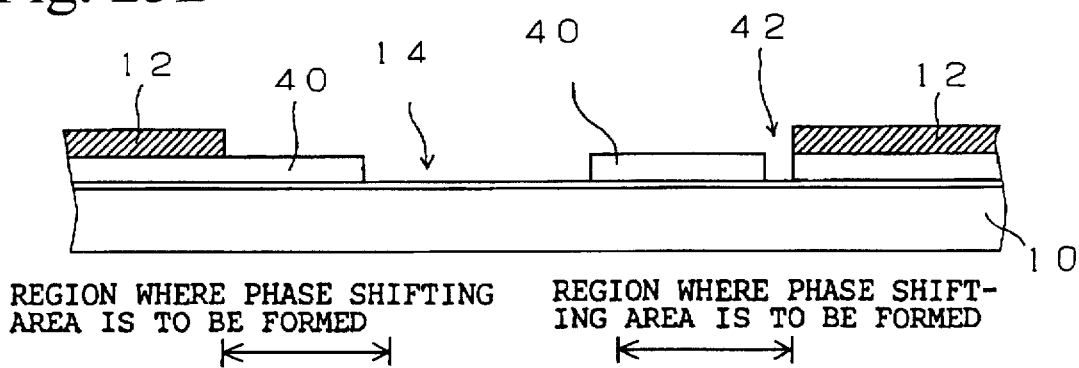

Then, a positive electron-beam resist 32 is coated on the entire surface formed so far (see FIG. 25C). Thereafter, a pattern is drawn by an electron beam emitted from an exposure system, the electron-beam resist is developed, the light shielding layer is etched, and the electron-beam resist is removed, thereby providing a phase shifting mask structure shown in FIG. 25D. The regions of the positive electron-beam resist 32 where the electron beam is applied are shown in FIG. 25D. A second phase shifting area 42 is formed by a positional misalignment between the regions where the electron beam is applied (electron beam irradiated regions) and desired regions (regions other than regions where a phase shifting area is to be formed).

(Inventive Example 18)

Figure 26A:
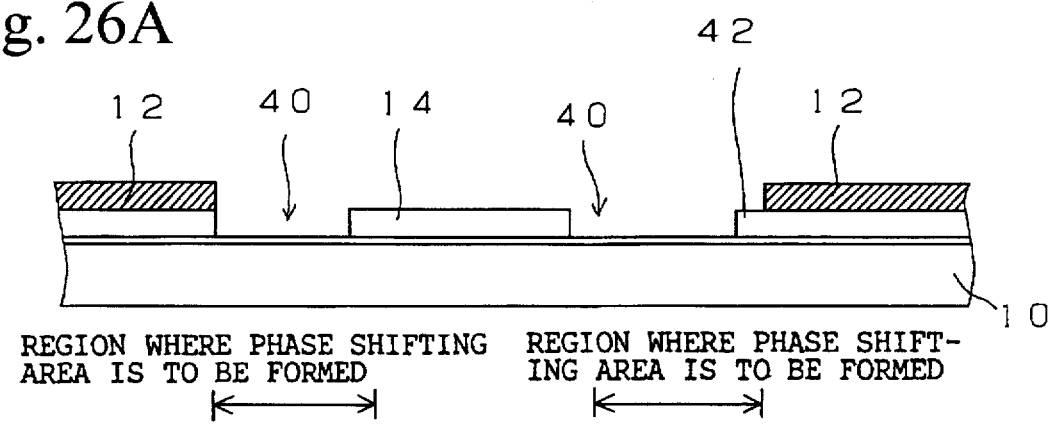
FIGS. 26A and 26B are fragmentary schematic cross-sectional views showing a phase shifting mask according to Inventive Example 18 and regions where an electron beam is applied.

A phase shifting mask according to Inventive Example 18 is a modification of the phase shifting mask according to Inventive Example 16, and schematically shown in FIG. 26A. The phase shifting mask according to Inventive Example 18 is different from the phase shifting mask according to Inventive Example 16 as to its manufacturing method.

The phase shifting mask according to Inventive Example 18 can be manufactured basically in the same way as the phase shifting mask according to Inventive Example 17 except that regions where patterns are drawn by an electron beam from an exposure system in order to form the light transmitting area and the phase shifting area are different from those in the phase shifting mask according to Inventive Example 17 in [Step 930]. The regions where the electron beam is applied in the phase shifting mask according to Inventive Example 18 are shown in FIG. 26B.

Figure 26B:
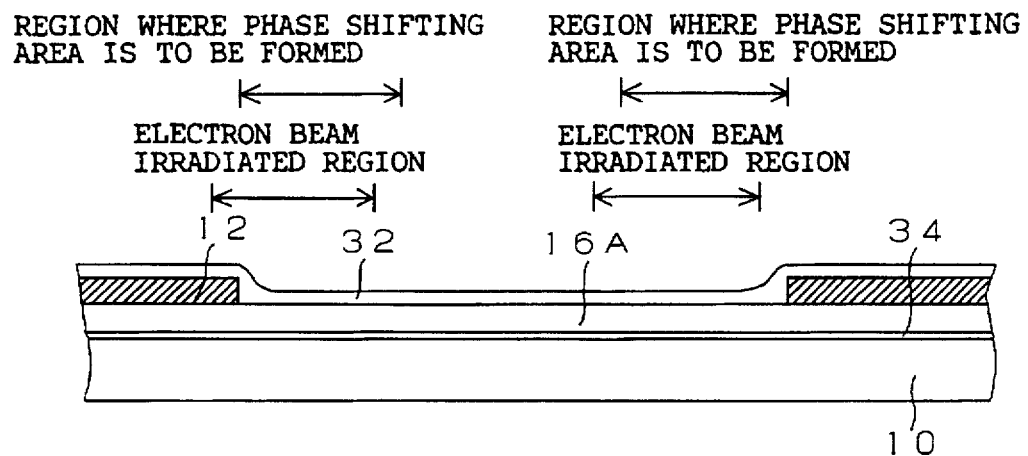

In order to manufacture a phase shifting mask of the structure shown in FIG. 25D using a negative electron-beam resist instead of the positive electron-beam resist 32, the electron beam may be applied to the regions shown in FIG. 26B. In order to manufacture a phase shifting mask of the structure shown in FIG. 26A using a negative electron-beam resist instead of the positive electron-beam resist 32, the electron beam may be applied to the regions shown in FIG. 25C.

(Inventive Example 19)

Figure 27A:
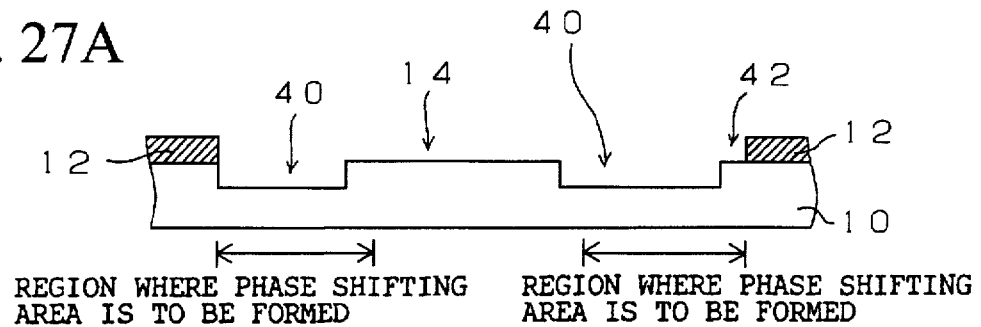
FIGS. 27A and 27B are fragmentary schematic cross-sectional views showing a phase shifting mask according to Inventive Example 19 and regions where an ion beam is applied.

A phase shifting mask according to Inventive Example 19 is a modification of the phase shifting mask according to Inventive Example 13. The phase shifting mask according to Inventive Example 19 is different from the phase shifting mask according to Inventive Example 13 in that the phase shifting area 40 is formed as grooves in the substrate 10. If the depth from the surface of the substrate 10 to the bottom of the phase shifting area 40 is $d'=\lambda/(2(n'-1))$ where $\lambda$ is the wavelength of exposure light and n' is the refractive index of the substrate, then light that has passed through the light transmitting area 14 and light that has passed through the second phase shifting area 42 are in phase with each other, and light that has passed through the light transmitting area 14 and light that has passed through the phase shifting area 40 are 180° out of phase with each other. The phase shifting mask according to Inventive Example 19 is schematically shown in FIG. 27A.

The phase shifting mask according to Inventive Example 19 can be manufactured according to a modification of the method of the second embodiment of the present invention. The modified manufacturing method will be described below.

[Step 1000]

A light shielding region 12 which may be made of chromium, for example, is deposited on a substrate 10 of quartz. This step is identical to [Step 100] of Inventive Example 1, and will not be described in detail below.

[Step 1010]

Figure 27B:
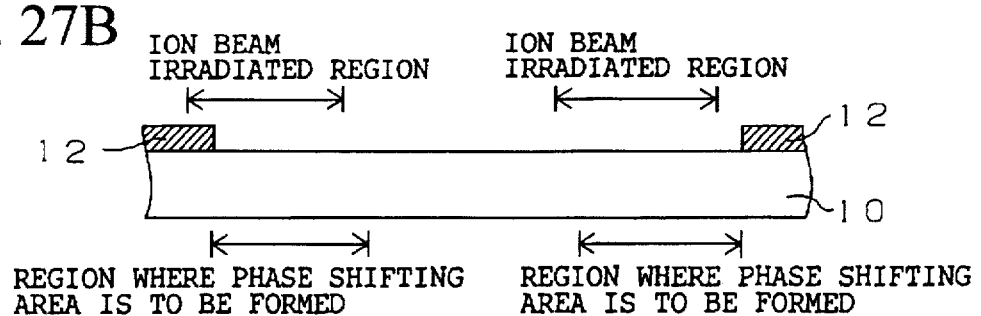

Then, using a focused ion beam system, an ion beam of gallium, for example, is applied to regions of the substrate 10 where a phase shifting area is to be formed as shown in FIG. 27B, thus forming a phase shifting area 40 in the form of grooves. Actually, however, the regions irradiated with the ion beam are displaced from the desired regions where a phase shifting area is to be formed. Specifically, the ion beam is also applied to the light shielding region other than the regions where a phase shifting area is to be formed, and no ion beam is applied to a portion of the substrate where a phase shifting area is to be formed. This is because there is caused a positional misalignment between the light shielding region 12 and the light transmitting area 14 depending on the positioning accuracy of the exposure system. Inasmuch as no ion beam is applied to a portion of the substrate where a phase shifting area is to be formed, a second phase shifting area 42 is formed between the phase shifting area 40 and the light shielding region 12. In this manner, the phase shifting mask according to Inventive Example 19 shown in FIG. 27A is manufactured.

(Inventive Example 20)

Figure 28A:
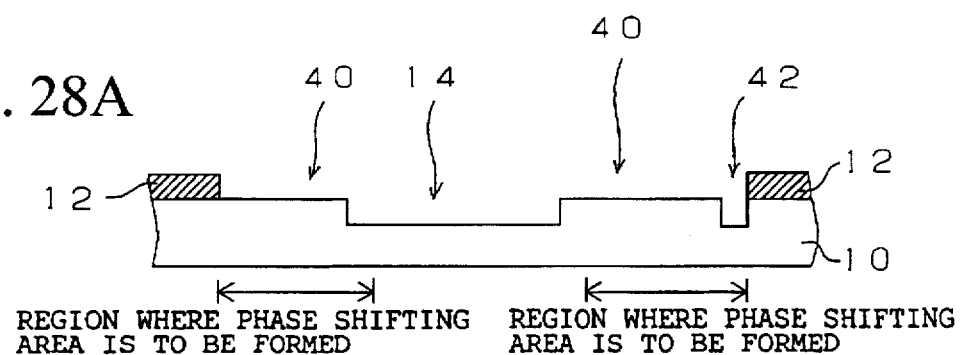
FIGS. 28A and 28B are fragmentary schematic cross-sectional views showing a phase shifting mask according to Inventive Example 20 and regions where an ion beam is applied.

A phase shifting mask according to Inventive Example 20 is a modification of the phase shifting mask according to Inventive Example 19, and schematically shown in FIG. 28A. The phase shifting mask according to Inventive Example 20 is different from the phase shifting mask according to Inventive Example 19 in that the light transmitting area 14 and the second phase shifting area 42 are in the form of recesses defined in the substrate 10. If the depth from the surface of the substrate 10 to the bottom of the light transmitting area 14 and the second phase shifting area 42 is $d'=\lambda/(2(n'-1))$ where $\lambda$ is the wavelength of exposure light and n' is the refractive index of the substrate, then light that has passed through the light transmitting area 14 and light that has passed through the second phase shifting area 42 are in phase with each other, and light that has passed through the light transmitting area 14 and light that has passed through the phase shifting area 40 are 180° out of phase with each other. The portions where no ion beam is applied serve as the phase shifting area 40. The phase shifting masks according to Inventive Examples 19 and 20 function in the same manner as each other.

Figure 28B:
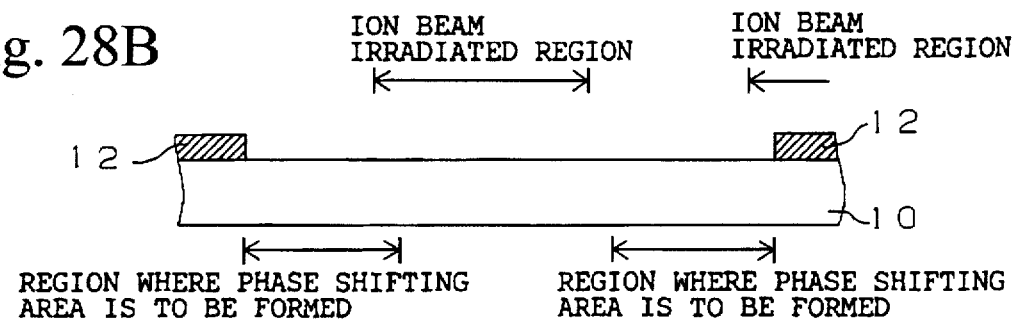

The phase shifting mask according to Inventive Example 20 can be manufactured basically in the same way as the phase shifting mask according to Inventive Example 19 except that regions where the ion beam from the focused ion beam system is applied in order to form the light transmitting area and the phase shifting area are different from those in the phase shifting mask according to Inventive Example 19 in [Step 1010]. The regions where the ion beam is applied in the phase shifting mask according to Inventive Example 20 are shown in FIG. 28B.

(Inventive Example 21)

A phase shifting mask according to Inventive Example 21 is a modification of the phase shifting mask according to Inventive Example 19. The phase shifting mask according to Inventive Example 21 is different from the phase shifting mask according to Inventive Example 19 as to its manufacturing method. A method of manufacturing the phase shifting mask according to Inventive Example 21 will be described below with reference to FIGS. 29A through 29C.
[Step 1100]

A light shielding region 12 of chromium is deposited on a substrate 10 of quartz. This step is identical to [Step 100] of Inventive Example 1, and will not be described in detail below.
[Step 1110]

Figure 29A:
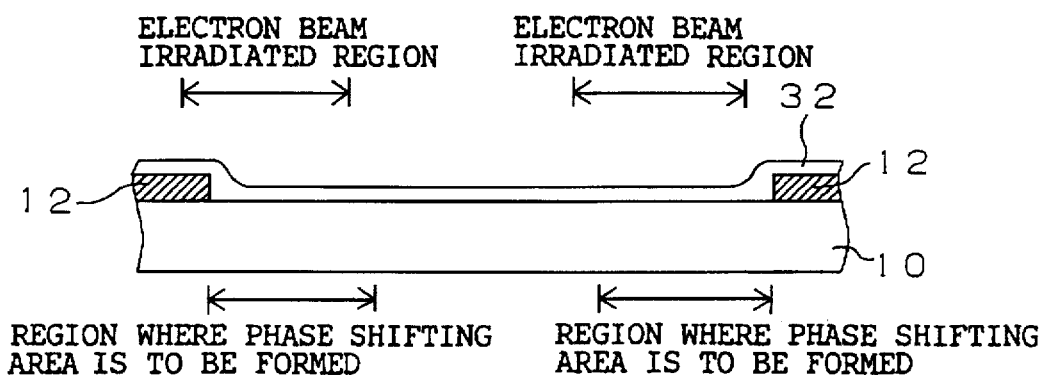
FIGS. 29A through 29C are fragmentary schematic cross-sectional views showing a method of manufacturing a phase shifting mask according to Inventive Example 21.

Then, an antistatic film (not shown) is deposited on the entire surface of the light shielding region 12 as by spin coating, and a positive electron-beam resist 32 is coated on the antistatic film as shown in FIG. 29A. Thereafter, a pattern is drawn by an electron beam emitted from an exposure system in order to form a light transmitting area and a phase shifting area. Regions where the electron beam is applied are shown in FIG. 29A.
[Step 1120]

Figure 29B:
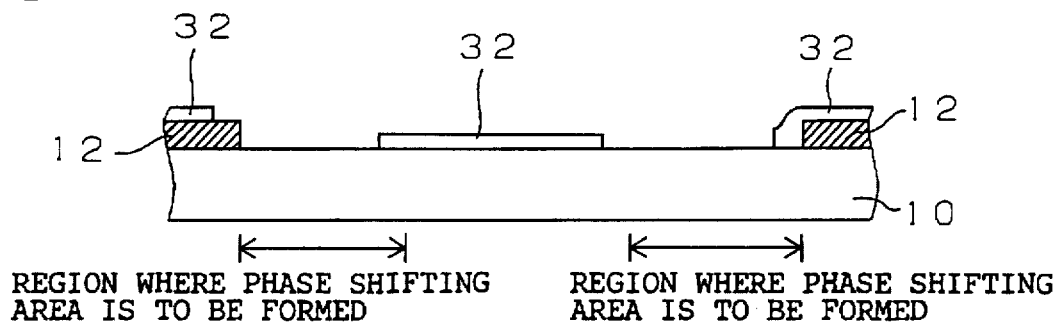
Figure 29C:
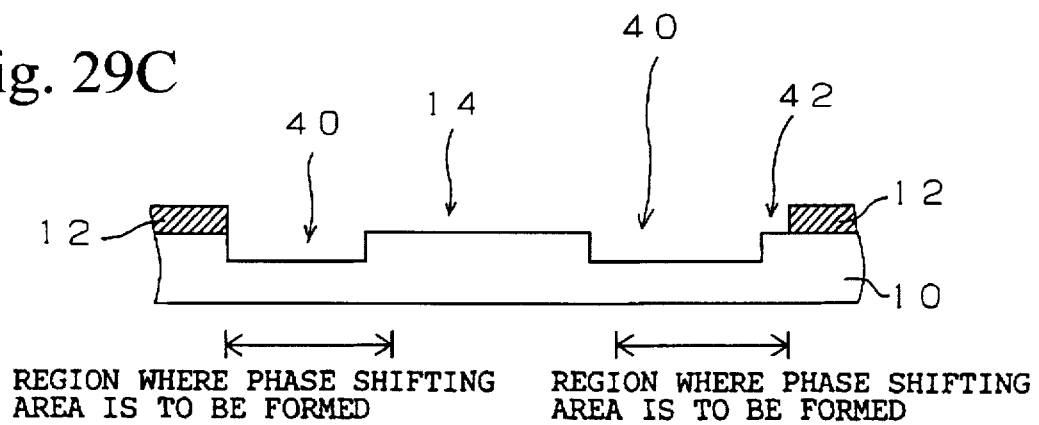

Thereafter, the positive electron-beam resist 32 is developed as shown in FIG. 29B, the substrate 10 is etched, and the positive electron-beam resist 32 is removed. The antistatic film is removed by a suitable solvent after the electron-beam resist is developed, or etched away at the same time the substrate is etched. A phase shifting area 40 in the form of grooves is thus formed. Actually, the regions irradiated with the electron beam are displaced from the desired regions where a phase shifting area is to be formed. Specifically, the electron beam is also applied to the light shielding region other than the regions where a phase shifting area is to be formed, and no electron beam is applied to a portion of the substrate where a phase shifting area is to be formed. This is because there is caused a positional misalignment between the light shielding region 12 and the light transmitting area 14 depending on the positioning accuracy of the exposure system. Inasmuch as no electron beam is applied to a portion of the substrate where a phase shifting area is to be formed, a second phase shifting area 42 is formed between the phase shifting area 40 and the light shielding region 12. In this manner, the phase shifting mask shown in FIG. 29C is manufactured.

(Inventive Example 22)

A phase shifting mask according to Inventive Example 22 is a modification of the phase shifting mask according to Inventive Example 20, and also schematically shown in FIG. 28A. The phase shifting mask according to Inventive Example 22 differs from the phase shifting mask according to Inventive Example 20 as to its manufacturing method.

The phase shifting mask according to Inventive Example 22 can be manufactured basically in the same way as the phase shifting mask according to Inventive Example 21 except that regions where the electron beam is applied in order to form the light transmitting area and the phase shifting area are different from those in the phase shifting mask according to Inventive Example 21 in [Step 1010]. The regions where the electron beam is applied in the phase shifting mask according to Inventive Example 22 are the same as the regions where the ion beam is applied as shown in FIG. 28B.

(Inventive Example 23)

Figure 30:
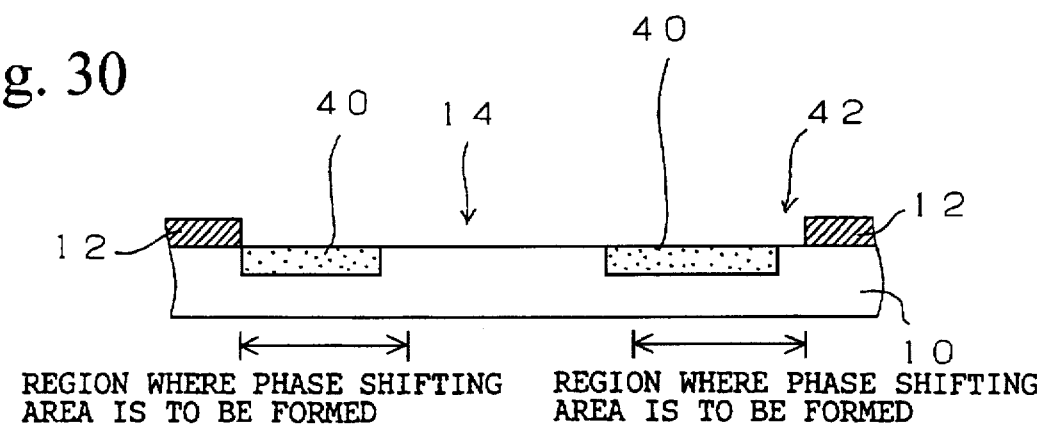
FIG. 30 is a fragmentary schematic cross-sectional view of a phase shifting mask according to Inventive Example 23.

A phase shifting mask according to Inventive Example 23, which is schematically shown in FIG. 30, is a modification of and differs from the phase shifting mask according to Inventive Example 13 in that the phase shifting area 40 is formed by varying the refractive index of the substrate 10. To vary the refractive index of the substrate 10, the substrate 10, which may be made of quartz, for example, may be doped with $N^+$(nitrogen ions). If the depth from the surface of the substrate 10 to the bottom of the phase shifting area 40 is $d''=\lambda/(2(n''-1))$ where $\lambda$ is the wavelength of exposure light and $n''$ is the refractive index of the substrate doped with $N^+$, then light that has passed through the light transmitting area 14 and light that has passed through the second phase shifting area 42 are in phase with each other, and light that has passed through the light transmitting area 14 and light that has passed through the phase shifting area 40 are 180° out of phase with each other.

The phase shifting mask according to Inventive Example 23 can be manufactured according to a modification of the method of the second embodiment of the present invention. The modified manufacturing method will be described below with reference to FIGS. 31A and 31B.
[Step 1200]

A light shielding region 12 of chromium is deposited on a substrate 10 of quartz. This step is identical to [Step 100] of Inventive Example 1, and will not be described in detail below.
[Step 1210]

Figure 31A:
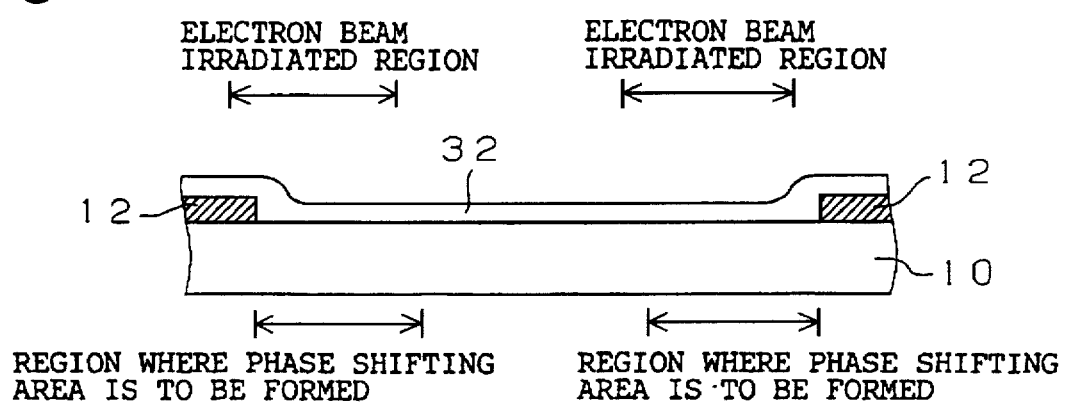
FIGS. 31A and 31B are fragmentary schematic cross-sectional views showing a method of manufacturing a phase shifting mask according to Inventive Example 23.

Then, an antistatic film (not shown) is deposited by spin coating, and a positive electron-beam resist 32 is coated on the entire surface of the antistatic film, providing a structure as shown in FIG. 31A.
[Step 1220]

Thereafter, a pattern is drawn by an electron beam emitted from an exposure system in order to form a light transmitting area and a phase shifting area. In the case where a positive electron-beam resist 32 is used, regions where the electron beam is applied are regions other than those where a phase shifting area is to be formed (see FIG. 33A). Actually, however, the regions where the electron beam is applied (electron beam irradiated regions) are displaced from the regions other than those where a phase shifting area is to be formed. Specifically, the electron beam is also applied to a portion of the regions where a phase shifting area is to be formed, and no electron beam is applied to a portion of the light shielding region 12. This is because there is caused a positional misalignment between the light shielding region 12 and the light transmitting area 14 depending on the positioning accuracy of the exposure system.
[Step 1230]

Figure 31B:
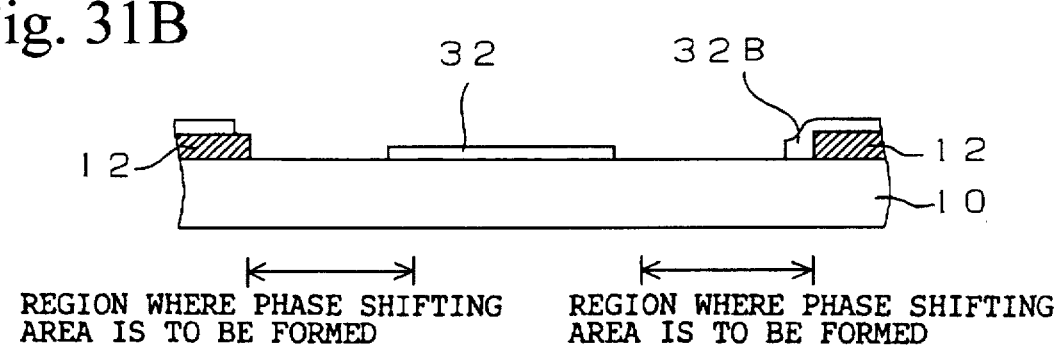

Thereafter, the positive electron-beam resist 32 is developed as shown in FIG. 31B. An accelerating voltage for accelerating $N^+$ions to reach the depth $d''$ is selected, and the exposed substrate 10 is doped with $N^+$at a dose of the order of $10^{16}$/cm$^2$. The refractive index of the substrate is now varied, forming a phase shifting area 20. Inasmuch as the electron beam is applied to a portion of the regions where a phase shifting area is to be formed, an electron-beam resist 32B remains in that portion. Therefore, the substrate 10 corresponding to that portion is not doped with N$^+$, thus forming a second phase shifting area 42. When the electron-beam resist 32 is then removed, a phase shifting mask of the structure shown in FIG. 30 is produced.

(Inventive Example 24)

Figure 32A:
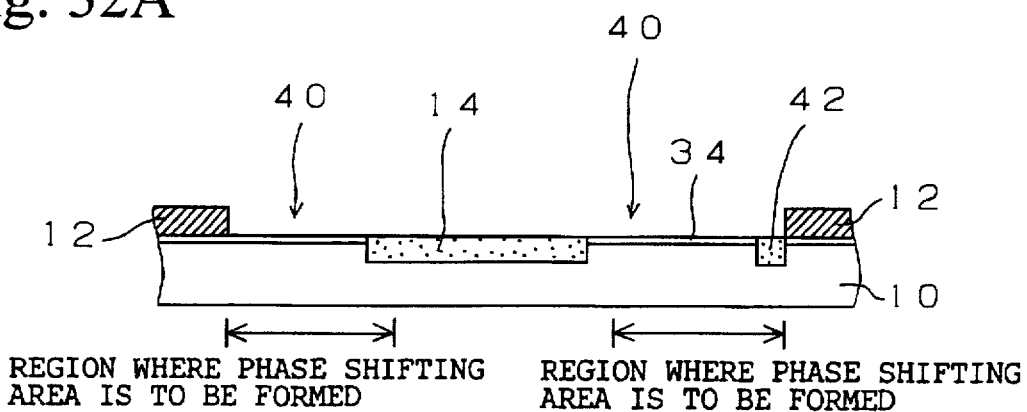
FIGS. 32A and 32B are fragmentary schematic cross-sectional views showing a phase shifting mask according to Inventive Example 24 regions to be doped.

A phase shifting mask according to Inventive Example 24 is a modification of the phase shifting mask according to Inventive Example 23, and schematically shown in FIG. 32A. The phase shifting mask according to Inventive Example 24 differs from the phase shifting mask according to Inventive Example 23 in that the light transmitting area 14 and the second phase shifting area 42 are formed by varying the refractive index of the substrate 10. If the depth from the surface of the substrate 10 to the bottom of the light transmitting area 14 and the second phase shifting area 42 is $d''=\lambda/(2(n''-1))$ where $\lambda$ is the wavelength of exposure light and $n''$ is the refractive index of the substrate doped with N$^+$, then light that has passed through the light transmitting area 14 and light that has passed through the second phase shifting area 42 are in phase with each other, and light that has passed through the light transmitting area 14 and light that has passed through the phase shifting area 40 are 180° out of phase with each other. The substrate portions where the refractive index remains unchanged serve as the phase shifting area 40. The phase shifting masks according to Inventive Examples 23 and 24 function in the same manner as each other.

Figure 32B:
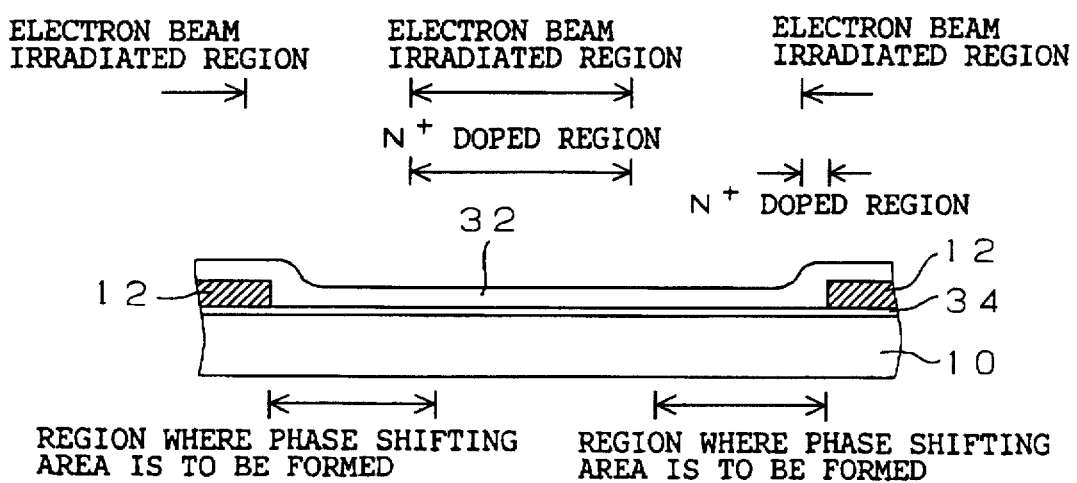

The phase shifting mask according to Inventive Example 24 can be manufactured basically in the same way as the phase shifting mask according to Inventive Example 23 except that regions which are doped with N$^+$ in order to form the light transmitting area and the phase shifting area are different from those in the phase shifting mask according to Inventive Example 23 in [Step 1230]. The regions which are doped with N$^+$ are shown in FIG. 32B.

In each of Inventive Examples 13 through 24, the light shielding region is formed in a predetermined position, and a positional misalignment is produced in the light transmitting area with respect to the light shielding region when the light transmitting area is formed. However, even if a positional misalignment is produced between the light transmitting area and the light shielding region with the light shielding region formed off a predetermined position and the light transmitting area formed in a predetermined position, or if a positional misalignment is produced between the light transmitting area and the light shielding region with both the light shielding region and the light transmitting area formed off predetermined positions, then phase shifting masks can be fabricated in exactly the same manner as Inventive Examples 13 through 24.

A method of manufacturing a phase shifting mask according to a third embodiment of the present invention will be described below with respect to Inventive Examples 25 through 30.

In Inventive Examples 25 through 27, phase shifting areas are made of SOG, for example. In Inventive Examples 28 and 29, phase shifting areas are formed by varying the depth of a substrate. In Inventive Example 30, a phase shifting area is formed by varying the refractive index of a substrate.

(Inventive Example 25)

A method of manufacturing a phase shifting mask according to Inventive Example 25 is advantageous particularly if a positional misalignment is produced between the light transmitting area and the light shielding region as with Comparative Example 2 (see FIG. 40) and such a phase shifting mask is to be corrected.

[Step 1300]

Figure 33A:
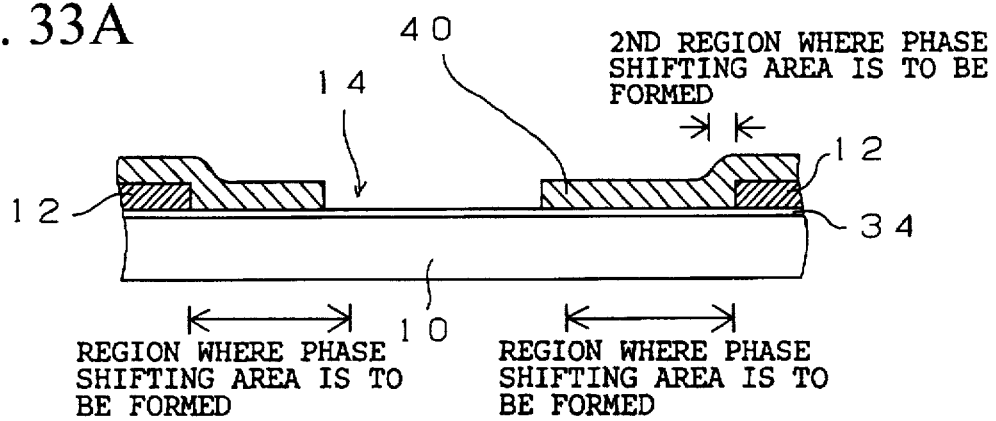
FIGS. 33A through 33C are fragmentary schematic cross-sectional views showing a method of manufacturing a phase shifting mask according to Inventive Example 25.
Figure 35A:
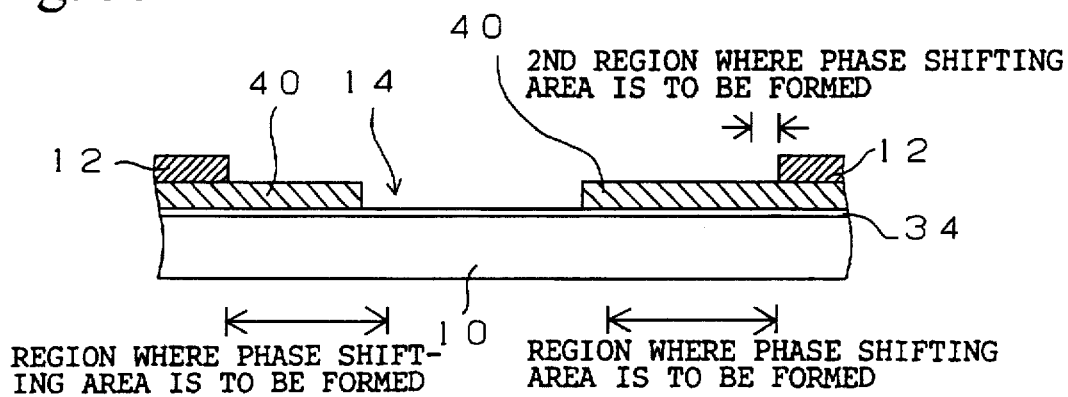
FIGS. 35A through 35C are fragmentary schematic cross-sectional views showing a method of manufacturing a phase shifting mask according to Inventive Example 26.

A phase shifting mask as shown in FIG. 35A is fabricated. The phase shifting mask has a positional misalignment produced between the light transmitting area and the light shielding region. It is necessary to remove a first phase shifting area 40 corresponding to a region where a second phase shifting area is to be formed, as shown in FIG. 33A.

Figure 35B:
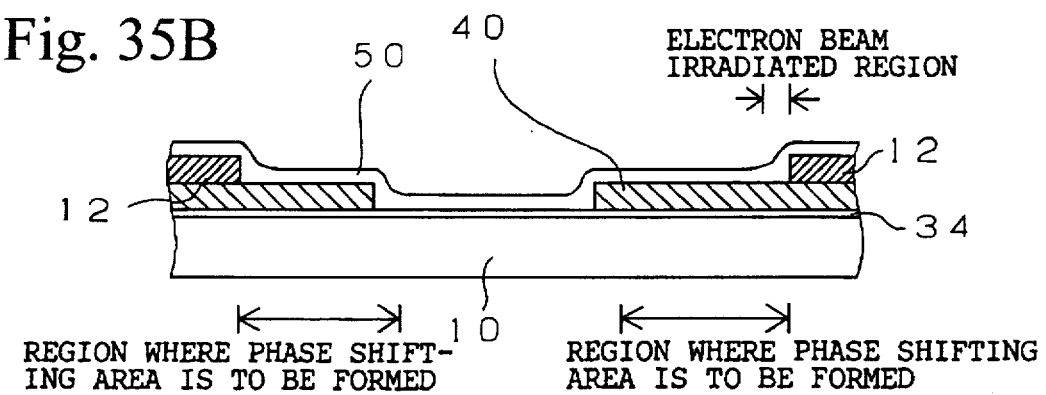

The entire surface formed so far is coated with a positive electron-beam resist 50, for example, thus providing a structure as shown in FIG. 35B.

[Step 1310]

Figure 33B:
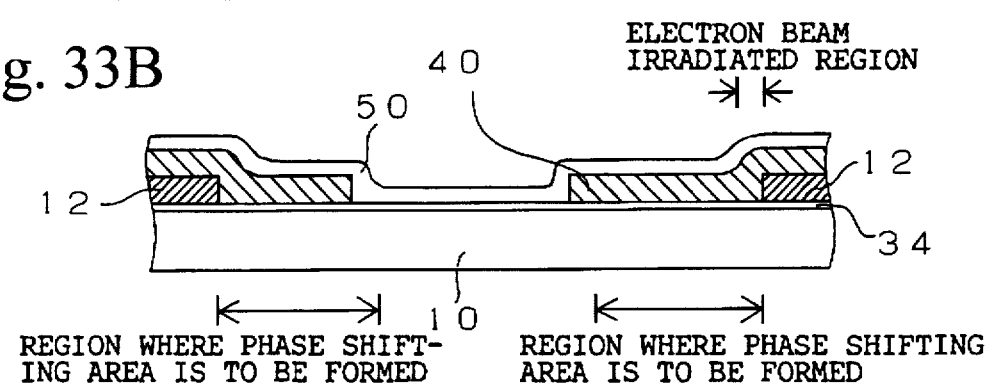
Figure 33C:
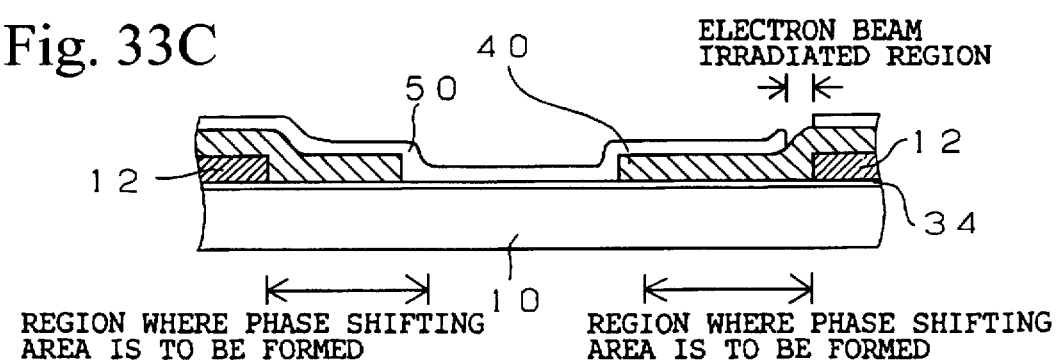

Then, to form a second phase shifting area, a pattern is drawn by an electron beam emitted from an exposure system. A region where the electron beam is applied is shown in FIG. 33B.

[Step 1320]

Figure 34:
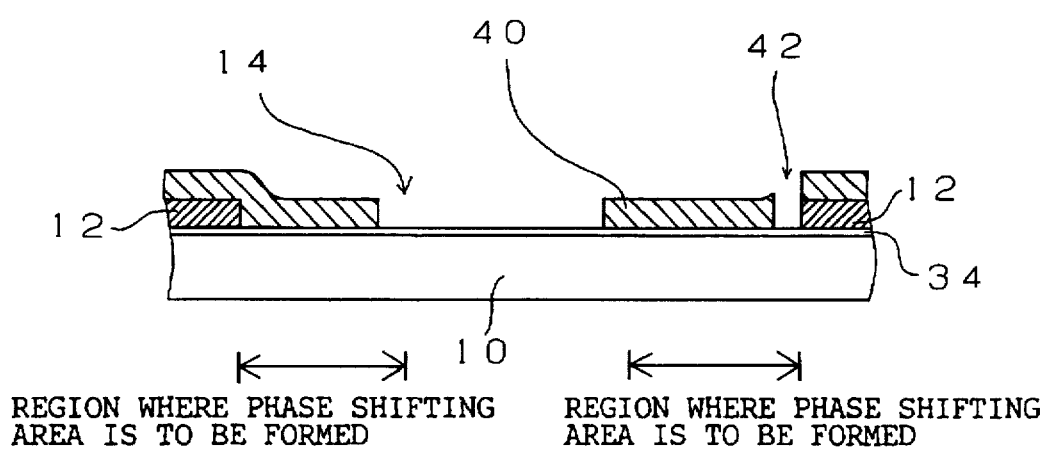
FIG. 34 is a fragmentary schematic cross-sectional view of the phase shifting mask according to Inventive Example 25.
Figure 35C:
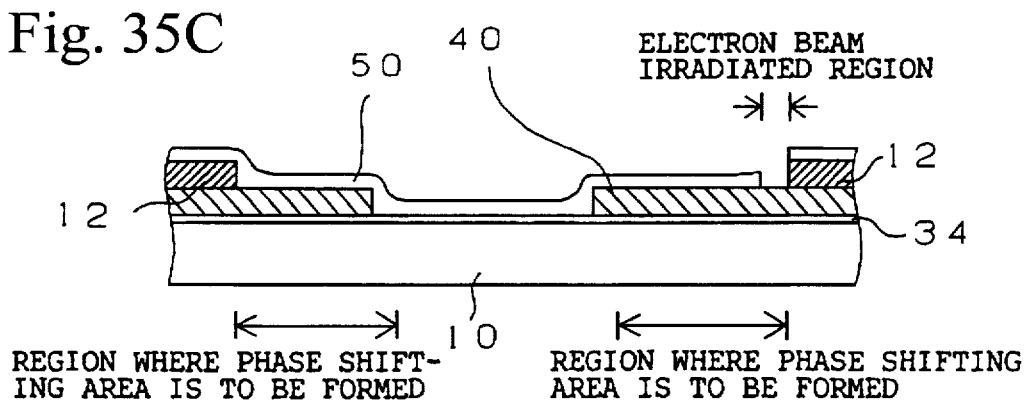

Thereafter, the electron-beam resist 50 is developed as shown in FIG. 35C. The portion of the first phase shifting area 40 which is not covered with the electron-beam resist 50 is etched, and the electron-beam resist 50 is removed, thereby forming a second phase shifting area 42. In this manner, a phase shifting mask of a structure shown in FIG. 34 is produced. The width of the first phase shifting area can thus be corrected by removing an undesired portion of the first phase shifting area. The corrected phase shifting mask is essentially equivalent to the phase shifting mask according to the first embodiment of the present invention.

(Inventive Example 26)

A method according to Inventive Example 26 is a modification of the method according to Inventive Example 25. The method according to Inventive Example 26 is different from the method according to Inventive Example 25 with respect to a process of fabricating a phase shifting mask before a second phase shifting area is formed. Such a phase shifting mask can be manufactured essentially similarly to the phase shifting mask according to Inventive Example 15, and is schematically shown in FIG. 35A. The phase shifting mask has a positional misalignment between the light shielding region and the light transmitting area. It is necessary to remove a first phase shifting area 40 corresponding to a region where a second phase shifting area is to be formed, as shown in FIG. 35A.

The process of removing a first phase shifting area 40 corresponding to a region where a second phase shifting area is to be formed is the same as that of Inventive Example 25, and will not be described in detail below. In this manner, the phase shifting mask of the structure shown in FIG. 34 is obtained. The width of the first phase shifting area can thus be corrected by removing an undesired portion of the first phase shifting area. The corrected phase shifting mask is essentially equivalent to the phase shifting mask according to the first embodiment of the present invention.

(Inventive Example 27)

A method according to Inventive Example 27 is a modification of the method according to Inventive Example 26. The method according to Inventive Example 27 is different from the method according to Inventive Example 26 with respect to a process of fabricating a phase shifting mask before a second phase shifting area is formed. Such a phase shifting mask can be manufactured essentially similarly to the phase shifting mask according to Inventive Example 17, and is also schematically shown in FIG. 35A. The phase shifting mask has a positional misalignment between the light shielding region and the light transmitting area. It is necessary to remove a first phase shifting area 40 corresponding to a region where a second phase shifting area is to be formed, as shown in FIG. 35A.

The process of removing a first phase shifting area 40 corresponding to a region where a second phase shifting area is to be formed is the same as that of Inventive Example 25, and will not be described in detail below. In this manner, a phase shifting mask of the structure shown in FIG. 35B is obtained. The width of the first phase shifting area can thus be corrected by removing an undesired portion of the first phase shifting area. The corrected phase shifting mask is essentially equivalent to the phase shifting mask according to the first embodiment of the present invention.

(Inventive Example 28)

A method according to Inventive Example 28 is different from the method according to Inventive Example 25 in that the first phase shifting area is formed as grooves in the substrate 10 (see FIG. 36A) as with Inventive Example 7.

The method according to Inventive Example 28 is advantageous particularly if a positional misalignment is produced between the light transmitting area and the light shielding region (see FIG. 36A) and such a phase shifting mask is to be corrected.

[Step 1400]

Figure 36A:
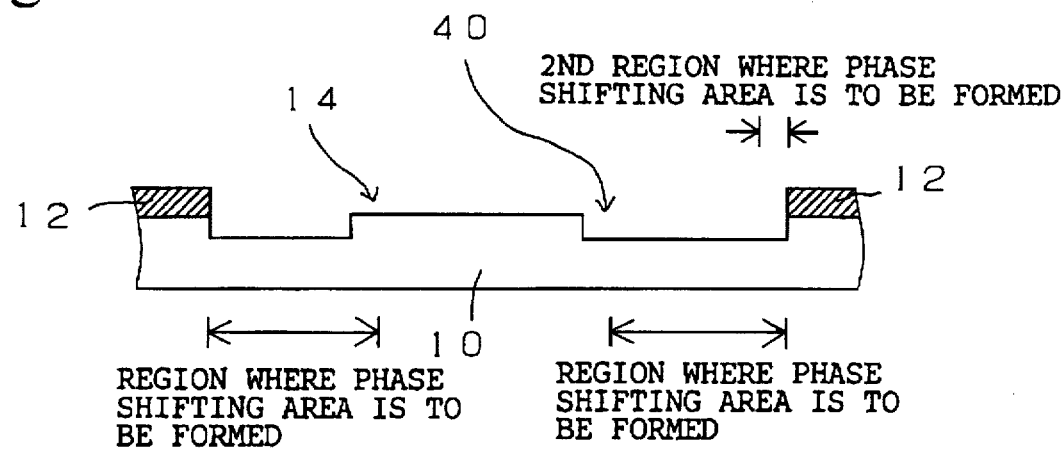
FIGS. 36A and 36B are fragmentary schematic cross-sectional views showing a method of manufacturing a phase shifting mask according to Inventive Example 28.
Figure 36B:
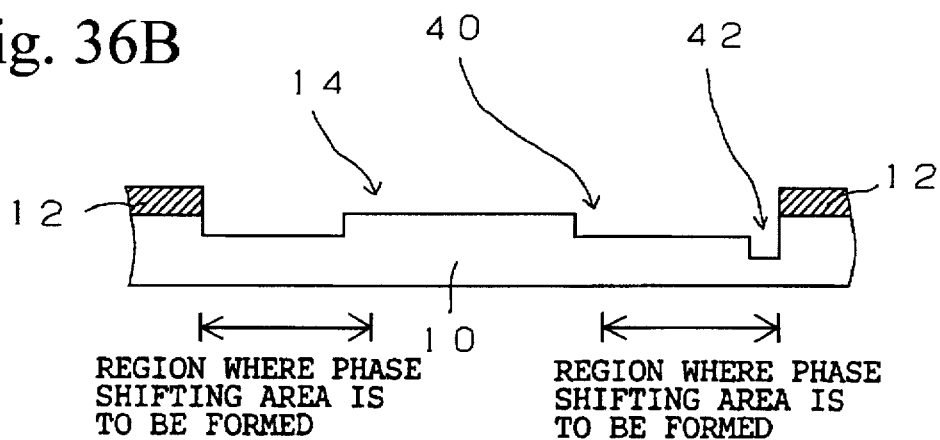

A phase shifting mask as shown in FIG. 36A is fabricated in a process similar to the process described with respect to Inventive Example 19. The phase shifting mask has a positional misalignment produced between the light transmitting area and the light shielding region. It is necessary to remove a first phase shifting area corresponding to a region where a second phase shifting area is to be formed, as shown in FIG. 36A.

An ion beam is applied to the region where a second phase shifting area is to be formed, thus forming a second phase shifting area 42. If the difference between the depth from the surface of the substrate 10 to the bottom of a first phase shifting area 40 and the depth from the surface of the substrate 10 to the bottom of the second phase shifting area 42 is $\lambda/(2(n'-1))$ where $\lambda$ is the wavelength of exposure light and n' is the refractive index of the substrate, then light that has passed through the light transmitting area 14 and light that has passed through the second phase shifting area 42 is in phase with each other, and light that has passed through the light transmitting area 14 and light that has passed through the first phase shifting area 40 is 180° out of phase with each other. The width of the first phase shifting area can thus be corrected by removing an undesired portion of the first phase shifting area. The corrected phase shifting mask is essentially equivalent to the phase shifting mask according to the first embodiment of the present invention.

(Inventive Example 29)

Figure 37A:
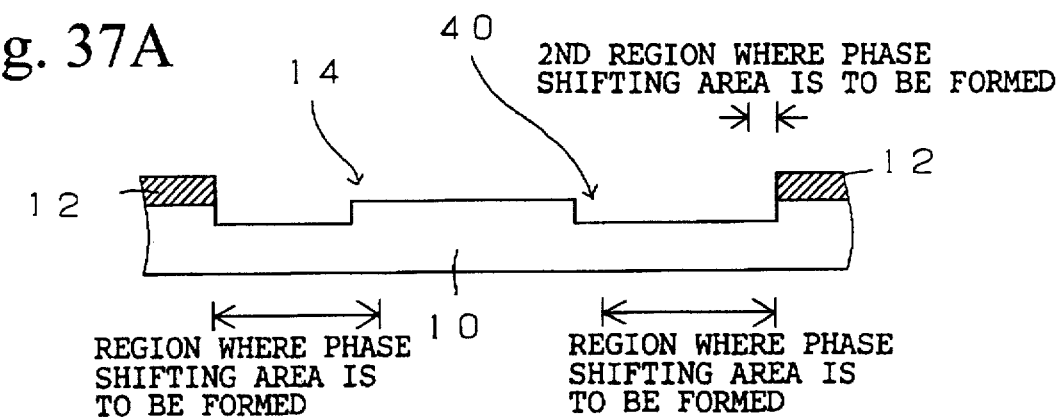
FIGS. 37A through 37D are fragmentary schematic cross-sectional views showing a method of manufacturing a phase shifting mask according to Inventive Example 29.

A method according to Inventive Example 29 is a modification of the method according to Inventive Example 28. The method according to Inventive Example 29 is different from the method according to Inventive Example 28 with respect to a process of fabricating a phase shifting mask. The phase shifting mask prior to the formation of a second phase shifting area can be manufactured in a process similar to the process of Inventive Example 19 or 21. The phase shifting mask is schematically shown in FIG. 37A. The phase shifting mask has a positional misalignment produced between the light transmitting area and the light shielding region. It is necessary to remove a first phase shifting area 40 corresponding to a region where a second phase shifting area is to be formed, as shown in FIG. 37A.

The process of removing a first phase shifting area 40 corresponding to a region where a second phase shifting area is to be formed is essentially the same as that of Inventive Example 21.

Figure 37B:
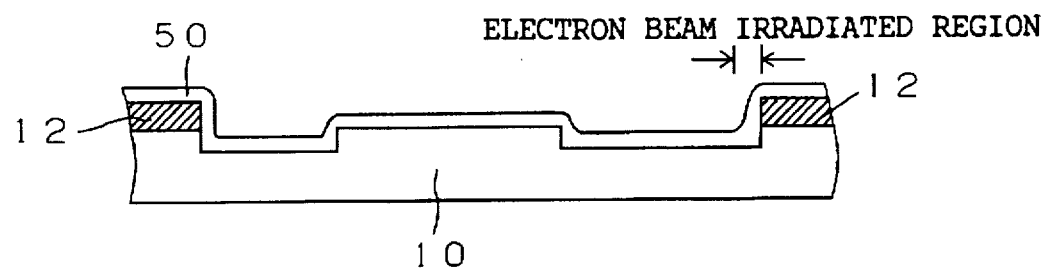
Figure 37C:
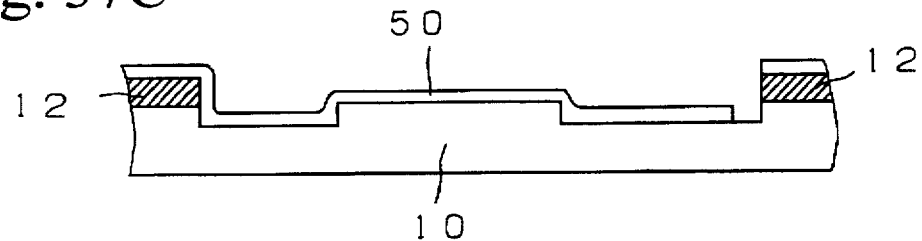
Figure 37D:
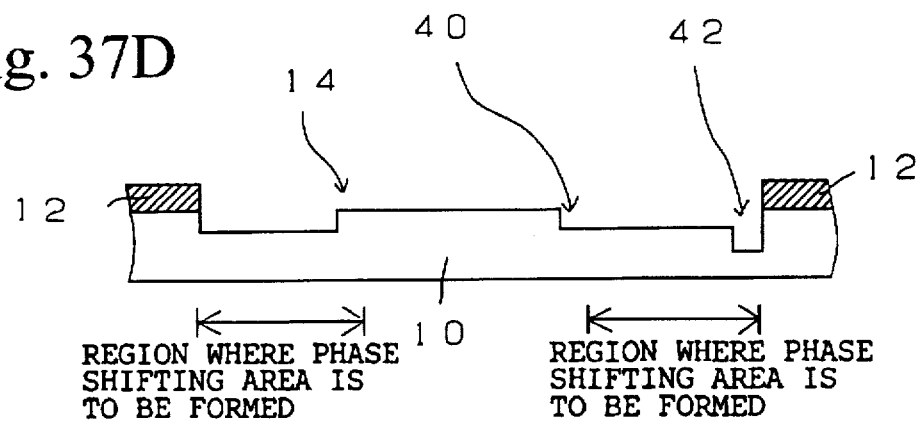

More specifically, an antistatic film (not shown) is deposited on the entire surface of the phase shifting mask as by spin coating, and a positive electron-beam resist 50 is coated on the antistatic film as shown in FIG. 37B. Thereafter, a pattern is drawn by an electron beam emitted from an exposure system in order to form a second phase shifting area. A region where the electron beam is applied is shown in FIG. 37B. Thereafter, the positive electron-beam resist 50 is developed as shown in FIG. 37C, the substrate 10 is etched, and the positive electron-beam resist 50 is removed. The antistatic film is removed by a suitable solvent after the electron-beam resist is developed, or etched away at the same time the substrate is etched. In this manner, a second phase shifting area 42 in the form of grooves is produced. A phase shifting mask of a structure as shown in FIG. 37D can therefore be obtained in the process described above. The width of the first phase shifting area can thus be corrected by removing an undesired portion of the first phase shifting area. The corrected phase shifting mask is essentially equivalent to the phase shifting mask according to the first embodiment of the present invention.

(Inventive Example 30)

Figure 38A:
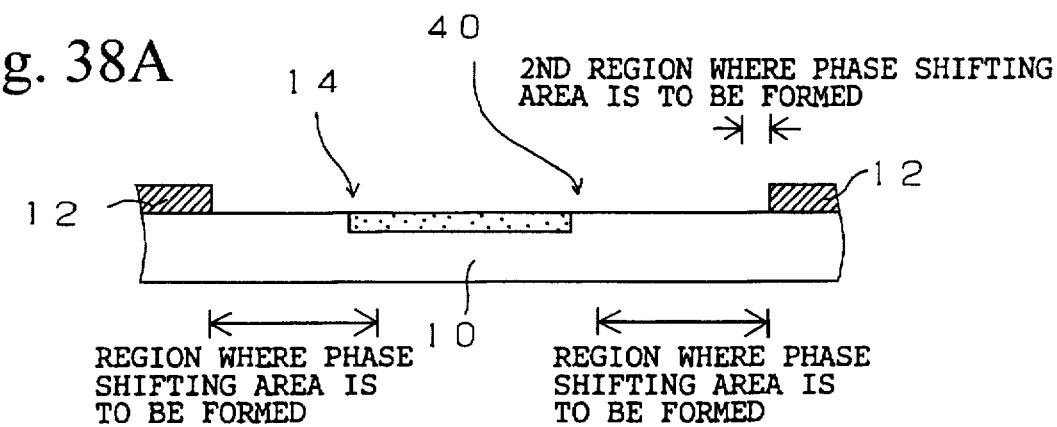
FIGS. 38A through 38D are fragmentary schematic cross-sectional views showing a method of manufacturing a phase shifting mask according to Inventive Example 30.

A method according to Inventive Example 30 forms a second phase shifting area 42 by doping the substrate with $N^+$, for example. A phase shifting mask prior to the formation of the second phase shifting area can be fabricated in the same manner as Inventive Example 24, for example. Such a phase shifting mask is schematically shown in FIG. 38A. The phase shifting mask has a positional misalignment between the light shielding region and the light transmitting area. It is necessary to remove a first phase shifting area 40 corresponding to a region where a second phase shifting area is to be formed, as shown in FIG. 38A.

The process of removing a first phase shifting area 40 corresponding to a region where a second phase shifting area is to be formed is the same as that of Inventive Example 24.

Figure 38B:
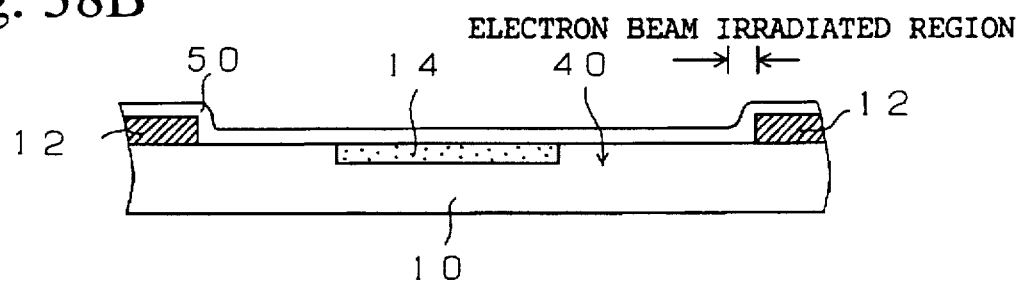
Figure 38C:
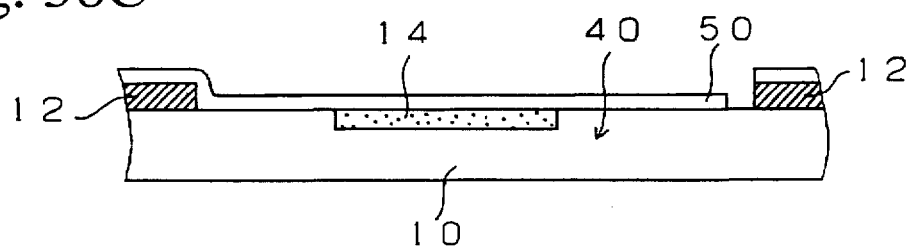
Figure 38D:
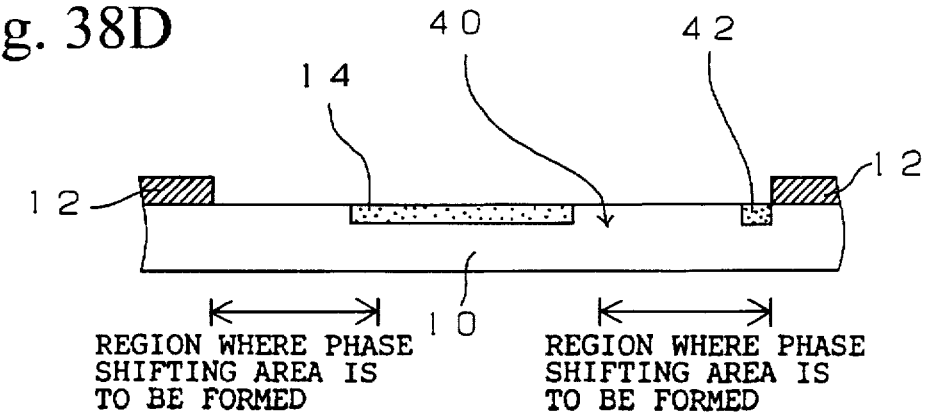

More specifically, an antistatic film (not shown) is deposited as by spin coating, and a positive electron-beam resist 50 is coated on the entire surface of the antistatic film, thus providing a structure as shown in FIG. 38B. Thereafter, a pattern is drawn by an electron beam emitted from an exposure system in order to form a second phase shifting area 42. A region where the electron beam is applied is shown in FIG. 38B. Thereafter, the positive electron-beam resist 50 is developed as shown in FIG. 38C. An accelerating voltage for accelerating ions to reach a predetermined depth is selected, and the exposed substrate 10 is doped with $N^+$ at a dose of the order of $10^{16}/cm^2$. Then, the positive electron-beam resist 50 is removed. Now, the refractive index of the substrate is varied, thus forming a second phase shifting area 42 (see FIG. 38D). The width of the first phase shifting area can thus be corrected by removing an undesired portion of the first phase shifting area. The corrected phase shifting mask is essentially equivalent to the phase shifting mask according to the first embodiment of the present invention.

In each of Inventive Examples 25 through 30, the light shielding region is formed in a predetermined position, and a positional misalignment is produced in the light transmitting area with respect to the light shielding region when the light transmitting area is formed. However, even if a positional misalignment is produced between the light transmitting area and the light shielding region with the light shielding region formed off a predetermined position and the light transmitting area formed in a predetermined position, or if a positional misalignment is produced between the light transmitting area and the light shielding region with both the light shielding region and the light transmitting area formed off predetermined positions, then phase shifting masks can be fabricated in exactly the same manner as Inventive Examples 25 through 30. The process of fabricating a phase shifting mask before a second phase shifting area is formed and the process of forming a second phase shifting area can be combined with each other.

The principles of the present invention are not limited to Inventive Examples described above. Dimensions in each of Inventive Examples may be selected depending on the wavelength of exposure light and exposure conditions. The substrate may be made of ordinary glass, glass with various additives, or the like, rather than quartz. The material of the etching stop layer and the transparent conductive layer is not limited to tin oxide insofar as it is capable of stopping etching and it is transparent and conductive. The light shielding region may be made of any of various light shielding materials including chromium oxide, chromium oxide deposited as a layer on chromium, metal of high melting point such as W, Mo, Be, or the like, instead of chromium.

The phase shifting material is not limited to SOG provided it is capable of changing the phase of exposure light. It may be a transparent material such as polymethyl methacrylate, magnesium fluoride, titanium dioxide, polyimide, indium oxide, SiN, or the like. Patterns may be drawn on a photosensitive resist by suitable light, rather than an electron beam.

With the present invention, as described above, any unwanted images are formed on a resist on a wafer, but a sharp image of a light transmitting area on a phase shifting mask can be formed on the resist on the wafer. The phase shifting masks according to the present invention are capable of widening the tolerance range of lithographic processes. Insofar as the resolution remains the same, the depth of focus by the phase shifting masks can be increased, and the margin of exposure through the phase shifting masks can also be increased. The width of the phase shifting area can be rendered as constant as possible, making it possible to set an optimum exposure intensity with ease. Semiconductor devices fabricated with phase shifting masks according to the present invention can thus be manufactured with an increased yield.

If there is a positional misalignment produced between the light shielding region and the light transmitting area, then the formation of a second phase shifting area prevents an unwanted image from being formed on a wafer by light that has passed through a phase shifting area, and allows only a desired image to be formed on the wafer.

If a positional misalignment is produced between the light shielding region and the light transmitting area, then a second phase shifting area is automatically formed between a phase shifting area and a light shielding region. As a consequence, an unwanted image is prevented from being formed on a wafer by light that has passed through the phase shifting area, and only a desired image is allowed to be formed on the wafer. Therefore, a phase shifting mask can easily be fabricated without having to controlling highly accurately any positional misalignment is produced between the light shielding region and the light transmitting area. As a phase shifting mask can easily be fabricated, it may be manufactured on a commercially available system at a reduced cost with high productivity. The margin of production of phase shifting masks is increased, and the intensity of light which is produced by a positional misalignment but not required in transferring patterns is greatly reduced.

Even if a positional misalignment is produced between the light shielding region and the light transmitting area, since a second phase shifting area is subsequently formed, it prevents an unwanted image from being formed on a wafer by light that has passed through a phase shifting area, and allows only a desired image to be formed on the wafer.

Although certain preferred embodiments of the present invention has been shown and described in detail, it should be understood that various changes and modifications may be made therein without departing from the scope of the appended claims.

What is claimed is:

1. A phase shifting mask comprising:
   a light shielding region; and
   a light transmitting region including a light transmitting area and a phase shifting area, said phase shifting area being disposed between said light shielding region and said light transmitting area;
   the arrangement being such that light that has passed through said phase shifting area and light that has passed through said light transmitting area are out of phase with each other;
   said phase shifting area including at least a portion which has a phase shifting area shape produced when substantially no positional misalignment is present between said light shielding region and said light transmitting area upon formation thereof to reduce the effect of misalignment of said phase shifting area shape relative to said light shielding region.

2. A method of manufacturing a phase shifting mask comprising a light shielding region and a light transmitting region including a light transmitting area, a first phase shifting area, and a second phase shifting area, said first and second phase shifting areas being disposed between said light shielding region and said light transmitting area, the arrangement being such that light that has passed through said first phase shifting area and light that has passed through said light transmitting area are out of phase with each other, said second phase shifting area being disposed between said light shielding region and said first phase shifting area, the arrangement being such that light that has passed through said first phase shifting area and light that has passed through said second phase shifting area are out of phase with each other, said method comprising the step of:
   forming the interfaces between said light transmitting area, said first phase shifting area, and said second phase shifting area simultaneously in one process.

3. A method according to claim 2, further including the steps of:
   forming a shifter layer for shifting the phase of light passing therethrough on a substrate;
   coating a resist on said shifter layer, thereafter applying a radiation energy to said resist, developing said resist, etching said shifter layer to form a pattern shifter layer using the developed resist as a mask, and removing said resist, thereby to form said light transmitting area, said first phase shifting area, and said second phase shifting area simultaneously;

forming a light shielding layer to provide said light shielding region on the patterned shifter layer; and patterning said light shielding layer and removing the light shielding layer on said light shielding region.

4. A method according to claim 2, further including the steps of:

forming a light shielding layer to provide said light shielding region on a substrate;

patterning said light shielding layer and removing the light shielding layer on said light shielding region; and etching the substrate in said light transmitting region, thereby to form said light transmitting area, said first phase shifting area, and said second phase shifting area simultaneously.

5. A method according to claim 2, further including the steps of:

forming a light shielding layer to provide said light shielding region on a substrate;

patterning said light shielding layer and removing the light shielding layer on said light shielding region;

implanting ions into the substrate in said light shielding region to shift the phase of light having passed through said substrate, thereby to form said light transmitting area, said first phase shifting area, and said second phase shifting area simultaneously.

6. A method according to claim 2, further including the steps of:

forming a shifter layer for shifting the phase of light passing therethrough on a substrate;

forming a light shielding layer to provide said light shielding region on said shifter layer;

patterning said light shielding layer and defining an opening in said light shielding region; and coating a resist on said shifter layer, thereafter applying a radiation energy to said resist, developing said resist, etching said shifter layer using the developed resist as a mask, and removing said resist, thereby to form said light transmitting area, said first phase shifting area, and said second phase shifting area simultaneously.

7. A method of manufacturing a phase shifting mask comprising a light shielding region and a light transmitting region including a light transmitting area and a phase shifting area, said phase shifting area being disposed between said light shielding region and said light transmitting area, the arrangement being such that light that has passed through said phase shifting area and light that has passed through said light transmitting area are out of phase with each other, said phase shifting area including at least a portion which has a phase shifting area shape produced when substantially no positional misalignment is present between said light shielding region and said light transmitting area upon formation thereof, said method comprising the steps of:

forming a light shielding layer to provide said light shielding region on a transparent substrate;

removing a portion of said light shielding layer to provide said light transmitting region; and forming said phase shifting area with said area shape between said light transmitting area and said light shielding region.

8. A method according to claim 7, further including the steps of:

forming a shifter layer for shifting the phase of light passing therethrough on a substrate;

coating a resist on said shifter layer, thereafter applying a radiation energy to said resist, developing said resist, etching said shifter layer to form a pattern shifter layer using the developed resist as a mask, and removing said resist, thereby to form said light transmitting area and said first phase shifting area;

forming a light shielding layer to provide said light shielding region on the patterned shifter layer;

patterning said light shielding layer and defining an opening in said light shielding region; and forming said second phase shifting area in said phase shifting area between said first phase shifting area and said light shielding region.

9. A method according to claim 7, further including the steps of:

forming a light shielding layer to provide said light shielding region on a substrate;

patterning said light shielding layer and defining an opening in said light shielding region;

etching said substrate to form said light transmitting area and said first phase shifting area; and forming said second phase shifting area in said phase shifting area between said first phase shifting area and said light shielding region.

10. A method according to claim 7, further including the steps of:

forming a light shielding layer to provide said light shielding region on a substrate;

patterning said light shielding layer and defining an opening in said light shielding region;

implanting ions into the substrate to shift the phase of light having passed through said substrate, thereby to form said light transmitting area and said first phase shifting area; and implanting ions into said first phase shifting area between said first phase shifting area and said light shielding region to shift the phase of light having passed through said substrate, thereby to form said second phase shifting area.

11. A method according to claim 7, further including the steps of:

forming a shifter layer for shifting the phase of light passing therethrough on a substrate;

forming a light shielding layer to provide said light shielding region on said shifter layer;

patterning said light shielding layer and defining an opening in said light shielding region; and coating a resist on said shifter layer, thereafter applying a radiation energy to said resist, developing said resist, etching said shifter layer using the developed resist as a mask, and removing said resist, thereby to form said light transmitting area and said first phase shifting area; and forming said second phase shifting area in said phase shifting area between said first phase shifting area and said light shielding region.

12. A method according to claim 7, further including the steps of:

forming a shifter layer for shifting the phase of light passing therethrough on a substrate;

coating a resist on said shifter layer, thereafter applying a radiation energy to said resist, developing said resist, etching said shifter layer to form a patterned shifter layer using the developed resist as a mask, and removing said resist, thereby to form said light transmitting area, said first phase shifting area, and second phase shifting area simultaneously;

forming said light shielding layer to provide said light shielding region on the transparent substrate on which the patterned shifter layer is formed; and patterning said light shielding layer to form said light shielding region.

13. A method according to claim 7, further including the step of:

etching the substrate in said light transmitting region, thereby to form said light transmitting area, said first phase shifting area, and said second phase shifting area simultaneously.

14. A method according to claim 7, further including the step of:

implanting ions into said substrate in said light shielding region to shift the phase of light having passed through said substrate, thereby to form said light transmitting area, said first phase shifting area, and said second phase shifting area simultaneously.

15. A method according to claim 7, further including the steps of:

forming a shifter layer for shifting the phase of light passing therethrough on a substrate;

forming said light shielding layer to provide said light shielding region on the transparent substrate on which the patterned shifter layer is formed;

patterning said light shielding layer and defining an opening in said light shielding region; and coating a resist on said shifting layer, thereafter applying a radiation energy to said resist, developing said resist, etching said shifter layer using the developed resist as a mask, and removing said resist, thereby to form said light transmitting area, said first shifting area, and said second phase shifting area simultaneously.

* * * * *